(12) United States Patent
Funatsuki et al.

(10) Patent No.: US 12,159,040 B2
(45) Date of Patent: Dec. 3, 2024

(54) SEMICONDUCTOR MEMORY DEVICE

(71) Applicant: KIOXIA CORPORATION, Tokyo (JP)

(72) Inventors: Rieko Funatsuki, Yokohama Kanagawa (JP); Takashi Maeda, Kamakura Kanagawa (JP); Sumiko Domae, Yokohama Kanagawa (JP); Kazutaka Ikegami, Inagi Tokyo (JP)

(73) Assignee: Kioxia Corporation, Tokyo (JP)

( * ) Notice: Subject to any disclaimer, the term of this patent is extended or adjusted under 35 U.S.C. 154(b) by 272 days.

(21) Appl. No.: 17/899,974

(22) Filed: Aug. 31, 2022

(65) Prior Publication Data

US 2023/0297245 A1 Sep. 21, 2023

(30) Foreign Application Priority Data

Mar. 18, 2022 (JP) ................... 2022-044341

(51) Int. Cl.
*G06F 3/06* (2006.01)

(52) U.S. Cl.
CPC .......... *G06F 3/0619* (2013.01); *G06F 3/0653* (2013.01); *G06F 3/0659* (2013.01); *G06F 3/0679* (2013.01)

(58) Field of Classification Search
CPC .... G06F 3/0619; G06F 3/0653; G06F 3/0659; G06F 3/0679; G11C 16/08; G11C 2211/5621; G11C 11/5628; G11C 16/32; G11C 16/0483; H10B 43/40; H10B 43/27
See application file for complete search history.

(56) References Cited

U.S. PATENT DOCUMENTS

| 2003/0147278 | A1  | 8/2003 | Tanaka et al. |
| 2016/0189770 | A1* | 6/2016 | Abe ................... G11C 16/3418 365/185.03 |
| 2017/0062054 | A1* | 3/2017 | Maeda .................. G11C 16/32 |
| 2017/0271021 | A1  | 9/2017 | Futatsuyama et al. |
| 2018/0151236 | A1* | 5/2018 | Park ...................... G11C 16/28 |

(Continued)

FOREIGN PATENT DOCUMENTS

| JP | 2003-196988 A | 7/2003 |
| JP | 2017-168163 A | 9/2017 |

(Continued)

*Primary Examiner* — Jerome Leboeuf
(74) *Attorney, Agent, or Firm* — Kim & Stewart LLP

(57) ABSTRACT

A semiconductor memory device includes a semiconductor pillar including first and second memory cells electrically connected in series and formed on opposite sides of the semiconductor pillar, first word lines connected to the first memory cells, respectively, and second word lines connected to the second memory cells, respectively. A verify operation includes a channel clean operation for supplying a reference voltage to a semiconductor channel shared by the first and second memory cells followed by at least first and second sense operation for determining whether a threshold voltage of a target memory cell has reached first and second threshold voltage states, respectively, then a second channel clean operation for supplying the reference voltage to the semiconductor channel, and then at least a third sense operation for determining whether the threshold voltage of the target memory cell has reached a third threshold voltage state.

20 Claims, 36 Drawing Sheets

(56) References Cited

U.S. PATENT DOCUMENTS

| | | |
|---|---|---|
| 2019/0080772 A1 | 3/2019 | Yanagidaira |
| 2023/0048326 A1* | 2/2023 | Li .......................... G11C 29/08 |
| 2023/0069260 A1* | 3/2023 | Lien ....................... G11C 16/10 |

FOREIGN PATENT DOCUMENTS

| | | |
|---|---|---|
| JP | 2018-164070 A | 10/2018 |
| JP | 2019-053797 A | 4/2019 |

* cited by examiner

FIG. 20

| THE NUMBER OF TIMES OF PROGRAM LOOP (Xth TIME) | | | | | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|---|---|
| STATE OF MT | VERIFY OPERATION | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 |
| S1 | 1VR | O | O | O | | | | | | | | | | | | | | | | | | | | | | | | | | | | | | | | | | |
| S2 | 2VR | | O | O | O | O | O | O | O | O | O | | | | | | | | | | | | | | | | | | | | | | | | | | | |
| S3 | 3VR | | | | O | O | O | O | O | O | O | O | | | | | | | | | | | | | | | | | | | | | | | | | | |
| S4 | 4VR | | | | O | O | O | O | O | O | O | O | O | O | | | | | | | | | | | | | | | | | | | | | | | | |
| S5 | 5VR | | | | | | O | O | O | O | O | O | O | O | O | O | | | | | | | | | | | | | | | | | | | | | | |
| S6 | 6VR | | | | | | | | | O | O | O | O | O | O | O | O | O | | | | | | | | | | | | | | | | | | | | |
| S7 | 7VR | | | | | | | | | | | O | O | O | O | O | O | O | O | | | | | | | | | | | | | | | | | | | |
| S8 | 8VR | | | | | | | | | | | | | O | O | O | O | O | O | O | O | | | | | | | | | | | | | | | | | |
| S9 | 9VR | | | | | | | | | | | | | | | O | O | O | O | O | O | O | O | | | | | | | | | | | | | | | |
| S10 | AVR | | | | | | | | | | | | | | | | | O | O | O | O | O | O | O | O | | | | | | | | | | | | | |
| S11 | BVR | | | | | | | | | | | | | | | | | | | O | O | O | O | O | O | O | O | | | | | | | | | | |
| S12 | CVR | | | | | | | | | | | | | | | | | | | | | O | O | O | O | O | O | O | O | | | | | | | | | |
| S13 | DVR | | | | | | | | | | | | | | | | | | | | | | | O | O | O | O | O | O | O | O | | | | | | | |
| S14 | EVR | | | | | | | | | | | | | | | | | | | | | | | | | O | O | O | O | O | O | O | O | O | O | O | O | |
| S15 | FVR | | | | | | | | | | | | | | | | | | | | | | | | | | | O | O | O | O | O | O | O | O | O | O | O |
| THE NUMBER OF TIMES OF VERIFY OPERATION (Y TIMES) IN THE SAME PROGRAM LOOP | | 1 | 2 | 2 | 3 | 3 | 4 | 4 | 5 | 6 | 6 | 6 | 5 | 6 | 5 | 6 | 5 | 6 | 5 | 5 | 5 | 5 | 5 | 5 | 5 | 5 | 5 | 5 | 5 | 4 | 4 | 3 | 3 | 2 | 2 | 1 | 1 | |

FIG. 21

| STATE OF MEMORY CELL TRANSISTOR MT (VERIFY LEVEL) | | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| READ OPERATION | | 1R | 2R | 3R | 4R | 5R | 6R | 7R | 8R | 9R | AR | BR | CR | DR | ER | FR |
| ORDER OF SENSE OPERATION DURING READ OPERATION (READ ORDER) | READ OPERATION ON TOP PAGE | 4 | | 3 | | | | 2 | | | | | | 1 | | |
| | READ OPERATION ON UPPER PAGE | | 4 | | | | | | 3 | | 2 | | 1 | | | |
| | READ OPERATION ON MIDDLE PAGE | | | | 4 | | 3 | | | 2 | | | | | 1 | |
| | READ OPERATION ON LOWER PAGE | | | | | 3 | | | | | | 2 | | | | 1 |

FIG. 31

BEFORE CHANGE OF EXECUTION
ORDER OF VERIFY OPERATIONS

| ORDER OF SENSE OPERATION DURING VERIFY OPERATION | 1 | 2 | 3 | 4 | 5 |
|---|---|---|---|---|---|
| VERIFY LEVEL | S7 (7VR) | S6 (6VR) | S5 (5VR) | S4 (4VR) | S3 (3VR) |
| READ ORDER | 2 | 3 | 4 | 4 | 3 |
| NUMBER OF WAIT PERIODS | 6 TIMES ||||| 
| NUMBER OF RESET PERIODS | 2 TIMES |||||

AFTER CHANGE OF EXECUTION
ORDER OF VERIFY OPERATIONS

| ORDER OF SENSE OPERATION DURING VERIFY OPERATION | 1 | 2 | 3 | 4 | 5 |
|---|---|---|---|---|---|
| VERIFY LEVEL | S7 (7VR) | S6 (6VR) | S5 (5VR) | S3 (3VR) | S4 (4VR) |
| READ ORDER | 2 | 3 | 4 | 3 | 4 |
| NUMBER OF WAIT PERIODS | 3 TIMES |||||
| NUMBER OF RESET PERIODS | 1 TIME |||||

FIG. 34

BEFORE CHANGE OF EXECUTION
ORDER OF VERIFY OPERATIONS

| ORDER OF SENSE OPERATION DURING VERIFY OPERATION | 1 | 2 | 3 | 4 | 5 |
|---|---|---|---|---|---|
| VERIFY LEVEL | S3 (3VR) | S4 (4VR) | S5 (5VR) | S6 (6VR) | S7 (7VR) |
| READ ORDER | 1 | 2 | 3 | 3 | 2 |

⇩

AFTER CHANGE OF EXECUTION
ORDER OF VERIFY OPERATIONS

| ORDER OF SENSE OPERATION DURING VERIFY OPERATION | 1 | 2 | 3 | 4 | 5 |
|---|---|---|---|---|---|
| VERIFY LEVEL | S3 (3VR) | S4 (4VR) | S5 (5VR) | S7 (7VR) | S6 (6VR) |
| READ ORDER | 1 | 2 | 3 | 2 | 3 |
| NUMBER OF WAIT PERIODS | 1 TIME | | | | |
| NUMBER OF RESET PERIODS | 1 TIME | | | | |

FIG. 36

BEFORE CHANGE OF EXECUTION ORDER OF VERIFY OPERATIONS

| | HIGHER-LEVEL | | | | | LOWER-LEVEL | | | | |
|---|---|---|---|---|---|---|---|---|---|---|
| ORDER OF SENSE OPERATION DURING VERIFY OPERATION | 1 | 2 | 3 | 4 | 5 | 1 | 2 | 3 | 4 | 5 |
| VERIFY LEVEL | S15 (FVR) | S14 (EVR) | S13 (DVR) | S12 (CVR) | S11 (BVR) | S7 (7VR) | S6 (6VR) | S5 (5VR) | S4 (4VR) | S3 (3VR) |
| READ ORDER | 1 | 1 | 1 | 1 | 2 | 2 | 3 | 4 | 4 | 3 |
| NUMBER OF WAIT PERIODS | 6 TIMES | | | | | | | | | |
| NUMBER OF RESET PERIODS | 6 TIMES | | | | | | | | | |

AFTER CHANGE OF EXECUTION ORDER OF VERIFY OPERATIONS

| | MIXING OF HIGHER/LOWER LEVELS | | | | | | | | | |
|---|---|---|---|---|---|---|---|---|---|---|
| ORDER OF SENSE OPERATION DURING VERIFY OPERATION | 1 | 2 | 3 | 4 | 5 | 6 | 7 | 8 | 9 | 10 |
| VERIFY LEVEL | S15 (FVR) | S11 (BVR) | S6 (6VR) | S5 (5VR) | S14 (EVR) | S7 (7VR) | S3 (3VR) | S4 (4VR) | S13 (DVR) | S12 (CVR) |
| READ ORDER | 1 | 2 | 3 | 4 | 1 | 2 | 3 | 4 | 1 | 1 |
| NUMBER OF WAIT PERIODS | 0 TIME | | | | | | | | | |
| NUMBER OF RESET PERIODS | 3 TIMES | | | | | | | | | |

SEMICONDUCTOR MEMORY DEVICE

CROSS-REFERENCE TO RELATED APPLICATION(S)

This application is based upon and claims the benefit of priority from Japanese Patent Application No. 2022-044341, filed Mar. 18, 2022, the entire contents of which are incorporated herein by reference.

FIELD

Embodiments described herein relate generally to a semiconductor memory device.

BACKGROUND

A NAND-type flash memory is known as a non-volatile semiconductor memory device.

DESCRIPTION OF THE DRAWINGS

FIG. 20 is a view illustrating an example of different verify operations that are carried out in each of the program loops in the semiconductor memory device according to the first embodiment.

FIG. 21 is a view illustrating an example of the order of sense operations corresponding to a read operation of the semiconductor memory device according to the first embodiment.

FIG. 31 is a view illustrating the overview of a verify operation in a semiconductor memory device according to a second embodiment.

FIG. 34 is a view illustrating the overview of the verify operation in the semiconductor memory device according to the third embodiment.

FIG. 36 is a view illustrating the overview of a verify operation in the semiconductor memory device according to the fourth embodiment.

DETAILED DESCRIPTION

Figure 1:
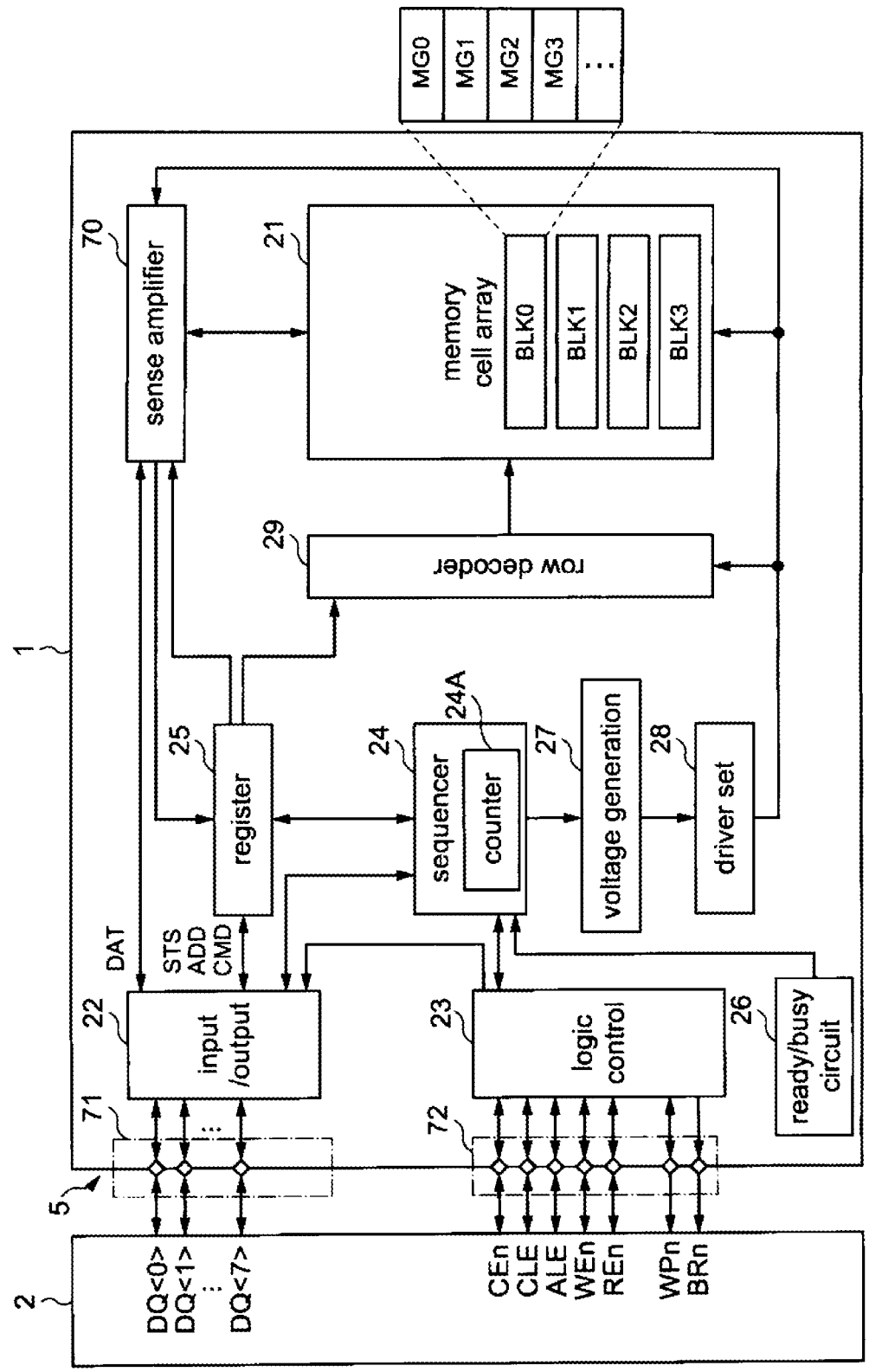
FIG. 1 is a block diagram illustrating the configuration of a memory system including a semiconductor memory device according to a first embodiment.

Embodiments provide a semiconductor memory device capable of reducing erroneous reading of memory cells.

In general, according to one embodiment, a semiconductor memory device includes: a bit line extending in a first direction, a semiconductor pillar that extends in a second direction intersecting the first direction, is electrically connected to the bit line, and includes an insulator column extending in the second direction, a plurality of first memory cells electrically connected in series and aligned in the second direction on a first side of the insulator column, second memory cells electrically connected in series and aligned in the second direction on a second side of the insulator column that is opposite to the first side, wherein the first and second memory cells share a semiconductor channel that extends in the second direction; first word lines stacked in the second direction, and electrically connected to the first memory cells, respectively; second word lines stacked in the second direction, and electrically connected to the second memory cells, respectively; and a control circuit configured to execute a write operation and a read operation. The write operation on one of the first memory cells is carried out in a plurality of loops, each of the loops including a program operation and a verify operation, and the verify operation carried out in at least one of the loops includes a first channel clean operation for supplying a reference voltage to the semiconductor channel, followed by at least a first sense operation for determining whether a threshold voltage of the one first memory cell has reached a first threshold voltage state and a second sense operation for determining whether the threshold voltage of the one first memory cell has reached a second threshold voltage state, then a second channel clean operation for supplying the reference voltage to the semiconductor channel, and then at least a third sense operation for determining whether the threshold voltage of the one first memory cell has reached a third threshold voltage state.

According to one embodiment, a semiconductor memory device includes: a bit line extending in a first direction; a semiconductor pillar that extends in a second direction intersecting the first direction, is electrically connected to the bit line, and includes an insulator column extending in the second direction, a plurality of first memory cells electrically connected in series and aligned in the second direction on a first side of the insulator column, second memory cells electrically connected in series and aligned in the second direction on a second side of the insulator column that is opposite to the first side, wherein the first and second memory cells share a semiconductor channel that extends in the second direction; first word lines stacked in the second direction, and electrically connected to the first memory cells, respectively; second word lines stacked in the second direction, and electrically connected to the second memory cells, respectively; and a control circuit configured to execute a write operation and a read operation. The write operation on a set of memory cells including one of the first memory cells, is carried out in a plurality of loops, each of the loops including a program operation and a verify operation that includes a channel clean operation for supplying a reference voltage to the semiconductor channel followed by a first sequence of sense operations, and the read operation on the set of memory cells includes the channel clean operation followed by a second sequence of sense operations and the channel clean operation followed by a third sequence of sense operations. The sense operations of both the first sequence and the second sequence includes a first sense operation for determining whether a threshold voltage of each memory cell in the set of memory cells has reached a first threshold voltage state. If the first sense operation is first in order in the first sequence and is not first in order in the second sequence, a wait period is executed prior to the first sense operation during the verify operation.

Hereinafter, embodiments will be described with reference to drawings. In the following description, components having same or similar functions and configurations are denoted by a common reference numeral. When components having a common reference numeral are distinguished from each other, subscripts or suffixes (e.g., uppercase alphabets, numbers, hyphens and uppercase alphabets and numbers) are added to the common reference numeral to distinguish the components.

In the following description, a signal X<p:0> (p is a natural number) is a (p+1)bit signal, and means a set of signals X<0>, X<1>, . . . , and X<p>, each of which is a 1-bit signal. A component Y<p:0> means a set of components Y<0>, Y<1>, . . . , and Y<p> corresponding to the input or output of the signal X<p:0> on a one-to-one basis.

First Embodiment

Hereinafter, a semiconductor memory device 1 according to a first embodiment will be described.

1-1. Configuration Example 1-1-1. Memory System

FIG. 1 is a block diagram illustrating an example of the configuration of a memory system 3 including the semiconductor memory device 1. As illustrated in FIG. 1, the memory system 3 includes the semiconductor memory device 1 and a memory controller 2. The memory system 3 is, for example, a memory card such as a solid state drive (SSD), or an SD® card. The memory system 3 may include a host device (not illustrated).

The semiconductor memory device 1 is connected to, for example, the memory controller 2, and is controlled using the memory controller 2. The memory controller 2 receives, for example, a command required for an operation of the semiconductor memory device 1 from the host device, and transmits the command to the semiconductor memory device 1. The memory controller 2 transmits the command to the semiconductor memory device 1, and controls a read operation for reading data from the semiconductor memory device 1, a write operation for writing data into the semiconductor memory device 1, or an erase operation for erasing data in the semiconductor memory device 1. In the first embodiment, the semiconductor memory device 1 is, for example, a NAND-type flash memory.

1-1-2. Configuration of Semiconductor Memory Device

As illustrated in FIG. 1, the semiconductor memory device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier module 70, an input/output pad group 71, and a logic control pad group 72. In the semiconductor memory device 1, various operations such as a write operation for storing write data DAT into the memory cell array 21, and a read operation for reading read data DAT from the memory cell array 21 are executed.

The memory cell array 21 is connected to, for example, the sense amplifier module 70, the row decoder 29, and the driver set 28. The memory cell array 21 includes blocks BLK0, BLK1, . . . , BLKn (n is an integer of 1 or more). Although the details will be described below, each block BLK includes a plurality of memory groups MG (MG0, MG1, MG2, . . . ). Each memory group MG includes a plurality of non-volatile memory cells associated with bit lines and word lines. The block BLK is, for example, a data erasing unit. Data pieces stored in memory cell transistors MTe0 to MTe7 and MTo0 to MTo7 (FIG. 2) disposed in the same block BLK are erased collectively at the same time.

In the semiconductor memory device 1, for example, a quadruple level cell (QLC) method is applicable. In the QLC method, 4-bit data is stored in each memory cell. However, using other methods of programming memory cells, in each memory cell, 3-bit (8 values) data may be stored, data of 2 bits (4 values) or less may be stored, or data of 5 bits or more may be stored.

The input/output circuit 22 is connected to, for example, the register 25, the logic control circuit 23, and the sense amplifier module 70. The input/output circuit 22 controls transmission/reception of a data signal DQ<7:0> between the memory controller 2 and the semiconductor memory device 1.

The data signal DQ<7:0> is a 8-bit signal. The data signal DQ<7:0> contains data transmitted/received between the semiconductor memory device 1 and the memory controller 2, and may include a command CMD, data DAT, address information ADD, status information STS, and the like. The command CMD is, for example, a command for executing a command transmitted from the host device to the memory controller 2. The data DAT includes data DAT to be written into the semiconductor memory device 1 or data DAT read from the semiconductor memory device 1. The address information ADD includes, for example, a column address and a row address for selecting a plurality of non-volatile memory cells associated with a bit line and a word line. The status information STS includes, for example, information on the status of the semiconductor memory device 1 in relation to the write operation and the read operation.

Specifically, the input/output circuit 22 includes an input circuit and an output circuit, and the input circuit and the output circuit perform the processes described below. The input circuit receives write data DAT, address information ADD, and a command CMD from the memory controller 2. The input circuit transmits the received write data DAT to the sense amplifier module 70, and transmits the received address information ADD and the command CMD to the register 25. Meanwhile, the output circuit receives status information STS from the register 25, and receives read data DAT from the sense amplifier module 70. The output circuit transmits the received status information STS and the read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 on the basis of the received signals.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address information ADD. The write enable signal WEn and the read enable signal REn are, for example, signals for instructing the input/output circuit 22 to receive and transmit the data signal DQ, respectively. The write protect signal WPn is a signal for instructing the semiconductor memory device 1 to prohibit writing and erasing of data.

The sequencer 24 is connected to, for example, the ready/busy control circuit 26, the sense amplifier module 70, and the driver set 28. The sequencer 24 controls the overall operation of the semiconductor memory device 1 on the basis of the command CMD stored in a command register. For example, the sequencer 24 executes various operations such as a write operation and a read operation by controlling the sense amplifier module 70, the row decoder 29, the voltage generation circuit 27, the driver set 28 and the like. Although the details will be described below, the sequencer 24 has a counter circuit 24A, counts the verify operations carried out in each program loop as they are carried out so that the order of each verify operation being carried out can be recognized as it is carried out. Although the details will be described below, the sequencer 24 recognizes the state for which the verify operation is being carried out by using internal signals generated in the sequencer 24, and retrieves the desired read order for the verify operation of the recognized state from tables stored in the sequencer 24 (as described below).

The register 25 includes, for example, a status register (not illustrated), an address register (not illustrated), a command register (not illustrated) and the like. The status register receives the status information STS from the sequencer 24, and stores the status information STS, and transmits the status information STS to the input/output circuit 22 on the basis of the instruction of the sequencer 24. The address register receives the address information ADD from the input/output circuit 22, and stores the address information ADD. The address register transmits a column address in the address information ADD to the sense amplifier module 70, and transmits a row address in the address information ADD to the row decoder 29. The command register receives the command CMD from the input/output circuit 22, and stores the command CMD, and transmits the command CMD to the sequencer 24.

The ready/busy control circuit 26 generates a ready/busy signal R/Bn according to the control by the sequencer 24, and transmits the generated ready/busy signal R/Bn to the memory controller 2. The ready/busy signal R/Bn is a signal for notifying whether the semiconductor memory device 1 is in a ready state where a command can be accepted from the memory controller 2, or in a busy state where a command cannot be accepted.

The voltage generation circuit 27 is connected to, for example, the driver set 28 and the like. The voltage generation circuit 27 generates voltages to be used for a write operation, a read operation, and the like on the basis of the control by the sequencer 24, and supplies the generated voltages to the driver set 28.

Figure 7:
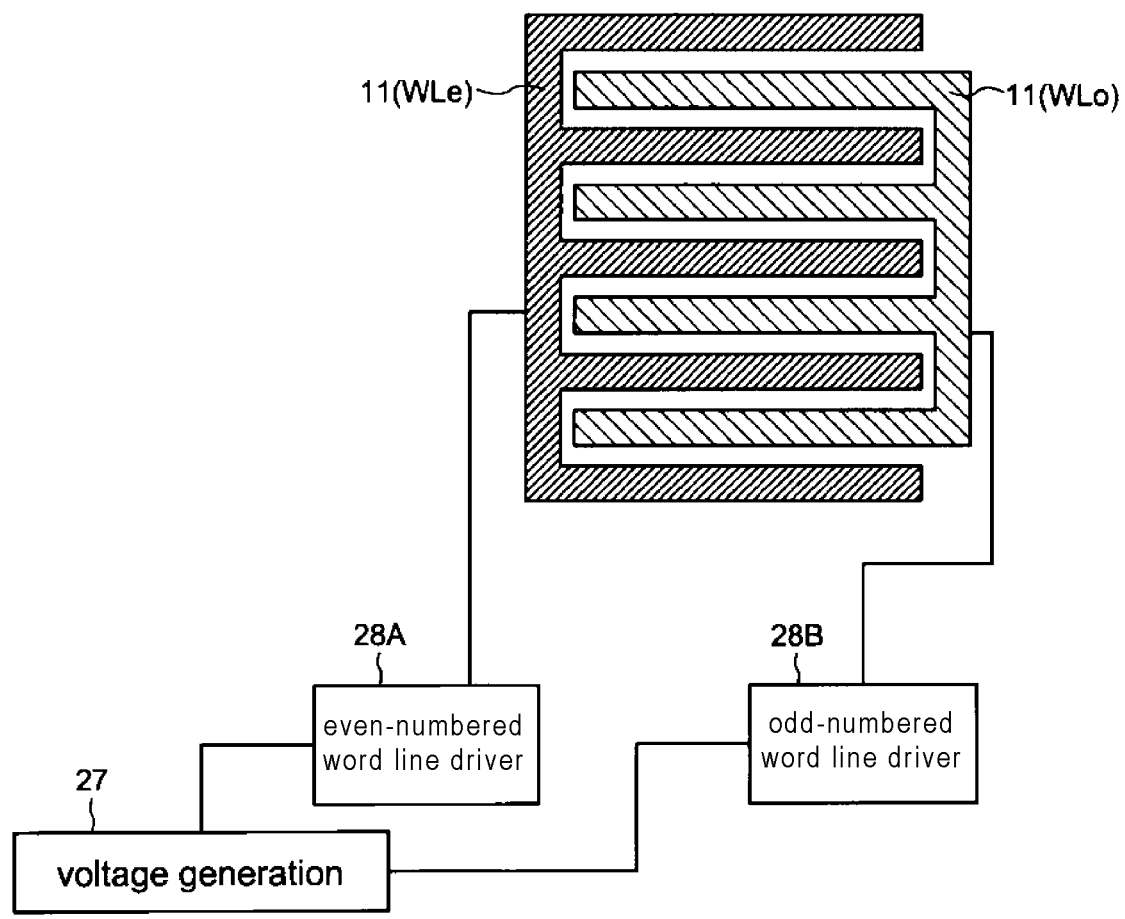
FIG. 7 is a view illustrating electrical connection of a voltage generation circuit, a driver set, and a select gate line or a word line according to the first embodiment.

The driver set 28 includes, for example, an even-numbered word line driver 28A (FIG. 7), and an odd-numbered word line driver 28B (FIG. 7). The driver set 28 is connected to the memory cell array 21, the sense amplifier module 70, and the row decoder 29. The driver set 28 generates, for example, various voltages or various control signals to be supplied to a select gate line SGD (FIG. 2), a word line WL (FIG. 2), a source line SL (FIG. 2), a bit line BL (FIG. 2) and the like in various operations such as a read operation and a write operation on the basis of voltages supplied from the voltage generation circuit 27, or control signals supplied from the sequencer 24. The driver set 28 supplies the generated voltages or control signals to the sense amplifier module 70, the row decoder 29, the source line SL, and the like.

The row decoder 29 receives the row address from the address register, and decodes the received row address. The row decoder 29 selects a block BLK as an execution target of various operations such as a read operation and a write operation on the basis of the result of the decoding. The row decoder 29 is capable of supplying the voltage supplied from the driver set 28, to the selected block BLK.

The sense amplifier module 70 receives, for example, the column address from the address register, and decodes the received column address. The sense amplifier module 70 executes transmission/reception operations of data DAT between the memory controller 2 and the memory cell array 21 on the basis of the result of the decoding. The sense amplifier module 70 includes, for example, a sense amplifier unit SAU (FIG. 13) provided for each bit line BL (BL0 to BL(L−1), where (L−1) is a natural number of 2 or more). The sense amplifier unit SAU is electrically connected to the bit line BL, and makes it possible to supply a voltage to the bit line BL. For example, the sense amplifier module 70 may supply a voltage to the bit line by using the sense amplifier unit SAU. The sense amplifier module 70 senses data read from the memory cell array 21, and generates read data DAT, and transmits the generated read data DAT to the memory controller 2, via the input/output circuit 22. The sense amplifier module 70 receives write data DAT from the memory controller 2 via the input/output circuit 22, and transmits the received write data DAT to the memory cell array 21.

The input/output pad group 71 transmits the data signal DQ<7:0> received from the memory controller 2, to the input/output circuit 22. The input/output pad group 71 transmits the data signal DQ<7:0> received from the input/output circuit 22, to the memory controller 2.

The logic control pad group 72 transmits the chip enable signal CEn, the command latch enable signal CLE, the address latch enable signal ALE, the write enable signal WEn, and the read enable signal REn, which are received from the memory controller 2, to the logic control circuit 23. The logic control pad group 72 transmits the ready/busy signal R/Bn received from the ready/busy control circuit 26, to the memory controller 2.

1-1-3. Memory Cell Array

Figure 2:
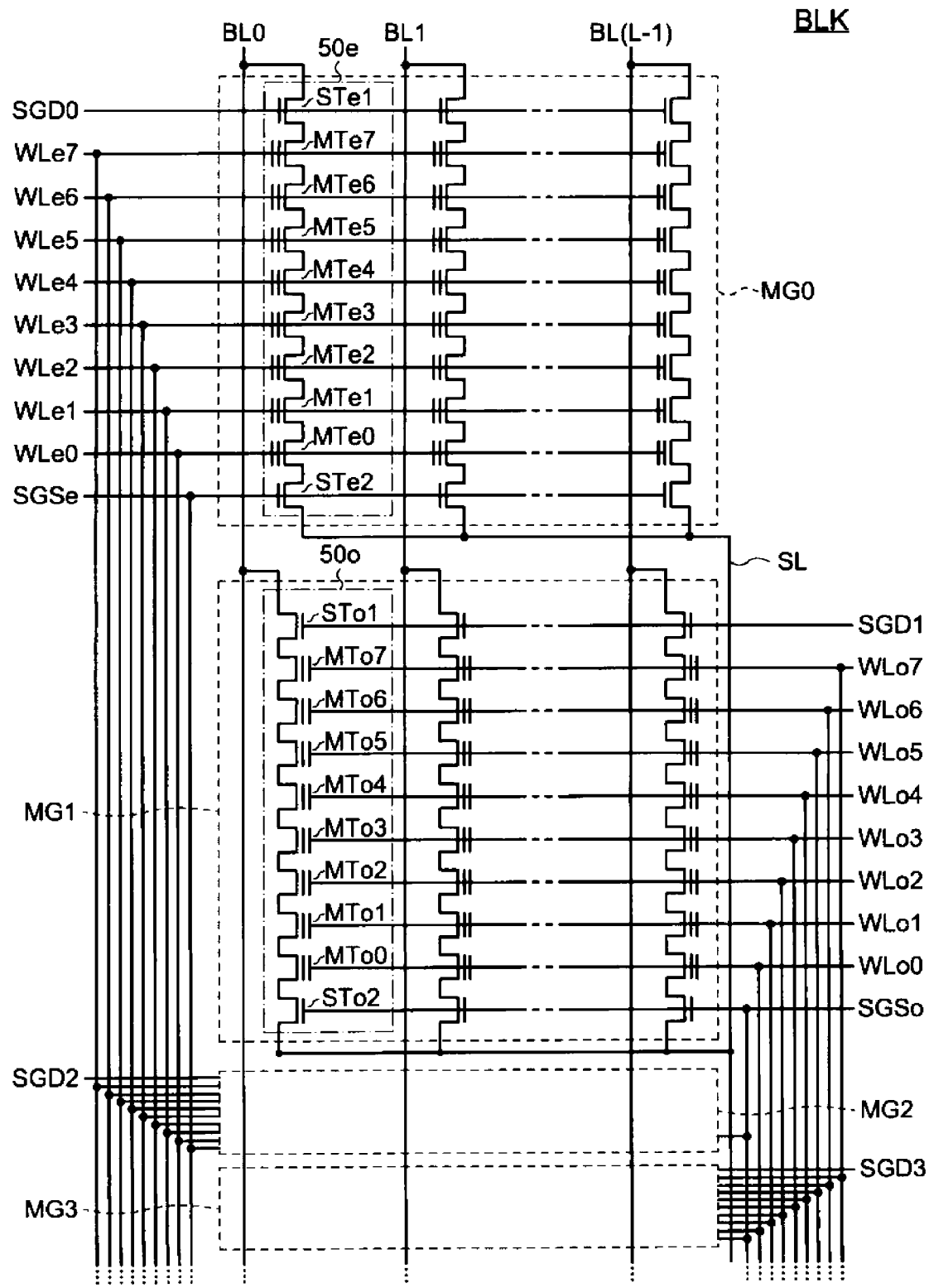
FIG. 2 is a view illustrating a circuit configuration of a memory cell array in the semiconductor memory device according to the first embodiment.

FIG. 2 is an example of a circuit configuration of the memory cell array 21 illustrated in FIG. 1. FIG. 2 is a view illustrating a circuit configuration of one block BLK among blocks BLK disposed in the memory cell array 21. For example, each of the blocks BLK disposed in the memory cell array 21 has a circuit configuration illustrated in FIG. 2. In the description of FIG. 2, descriptions of the configuration which is the same or similar to that of FIG. 1 may be omitted.

As illustrated in FIG. 2, the block BLK includes a plurality of memory groups MG (MG0, MG1, MG2, and MG3). In the present embodiment, each memory group MG includes a plurality of NAND strings 50. For example, the memory groups MG0 and MG2 each include a plurality of NAND strings 50e, and the memory groups MG1 and MG3 each include a plurality of NAND strings 50o.

Each NAND string 50 includes, for example, eight memory cell transistors MT (MT0 to MT7) and select transistors ST1 and ST2. The memory cell transistor MT includes a control gate and a charge storage layer, and stores data in a non-volatile manner. The memory cell transistors MT are connected in series between the source of the select transistor ST1 and the drain of the select transistor ST2.

Gates of the select transistors ST1 in each of the memory groups MG are connected to a respective one of select gate lines SGD (SGD0, SGD1, . . . ). The select gate line SGD is independently controlled by the row decoder 29. Gates of the select transistors ST2 in each of the even-numbered memory groups MGe (MG0, MG2, . . . ) are connected to, for example, an even-numbered select gate line SGSe, and gates of the select transistors ST2 in each of the odd-numbered memory groups MGo (MG1, MG3, . . . ) are connected to, for example, an odd-numbered select gate line SGSo. For example, the even-numbered select gate line SGSe and the odd-numbered select gate line SGSo may be connected to each other, and similarly controlled, or each may be independently provided and may be independently controllable.

Control gates of the memory cell transistors MT (MTe0 to MTe7) disposed in the memory groups MGe in the same block BLK are connected to common even-numbered word lines WLe (WLe0 to WLe7), respectively. Control gates of the memory cell transistors MT (MTo0 to MTo7) disposed in the memory groups MGo in the same block BLK are connected to common odd-numbered word lines WLo (WLo0 to WLo7), respectively. The even-numbered word line WLe and the odd-numbered word line WLo are independently controlled by the row decoder 29.

Each memory group MG includes pages corresponding to the word lines WL, respectively. For example, in the memory group MG0 or the memory group MG2, a plurality of memory cell transistors MT whose control gates are connected in common to any of the even-numbered word lines WLe0 to WLe7 corresponds to a page. In the memory group MG1 or the memory group MG3, a plurality of memory cell transistors MT whose control gates are connected in common to any of the odd-numbered word lines WLo0 to WLo7 corresponds to a page. The write operation and the read operation are executed on a page-by-page basis.

In the memory cell array 21, drains of the select transistors ST1 of the NAND strings 50 in the same row are connected to a common bit line BL (BL0 to BL(L−1), where (L−1) is a natural number of 2 or more). That is, a common bit line BL is connected to the NAND strings 50 across the memory groups MG. Sources of the select transistors ST2 are connected to a common source line SL. The source line SL is electrically connected to, for example, the driver set 28, and a voltage is supplied to the source line SL from the voltage generation circuit 27 or the driver set 28, under the control of the voltage generation circuit 27 and the driver set 28 through the sequencer 24. The semiconductor memory device 1 may include a plurality of source lines SL. In such a case, each of the source lines SL may be electrically connected to the driver set 28, and different voltages may be supplied to the source lines SL, respectively, from the voltage generation circuit 27 or the driver set 28, under the control of the voltage generation circuit 27 and the driver set 28 through the sequencer 24.

The memory group MG includes the NAND strings 50 which are connected to different bit lines BL, and are connected to the same select gate line SGD. The block BLK includes a plurality of memory groups MG sharing word lines WL. The memory cell array 21 includes a plurality of blocks BLK sharing bit lines BL. In the memory cell array 21, the above-described select gate line SGS, the word lines WL, and the select gate line SGD are stacked above a source line layer, so that the memory cell transistors MT are three-dimensionally stacked.

1-1-4. Planar Layout of Memory Cell Array

Figure 3:
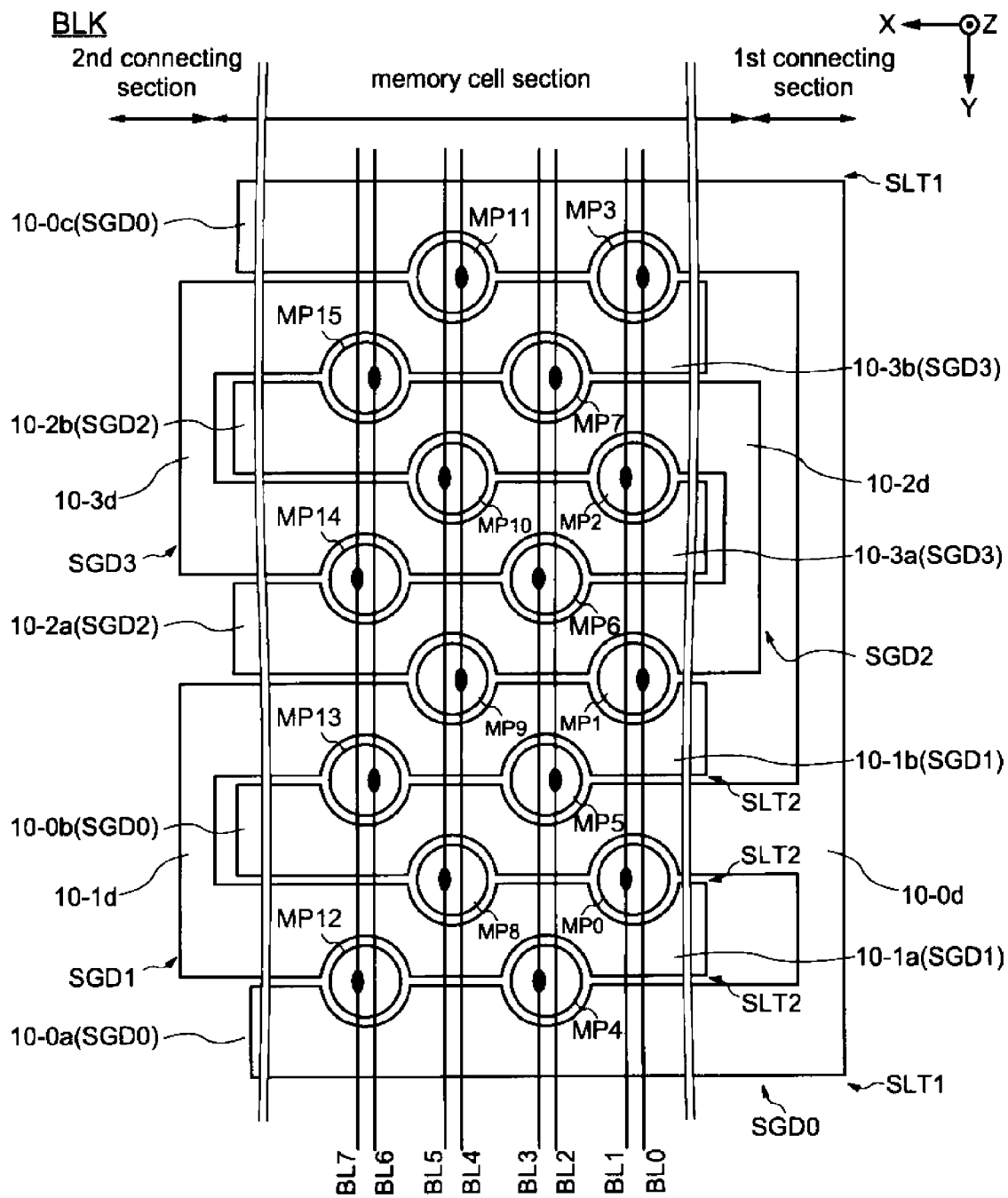
FIG. 3 is a view illustrating a planar layout of a select gate line, a bit line, and a memory pillar according to the first embodiment.

FIG. 3 is a view illustrating a planar layout of a select gate line SGD in a plane (XY plane) parallel to a source line layer of a certain block BLK. As illustrated in FIG. 3, in the semiconductor memory device 1, for example, four select gate lines SGD are provided in one block BLK. In the description of FIG. 3, descriptions of the configuration which is the same or similar to those of FIG. 1 and FIG. 2 may be omitted.

As illustrated in FIG. 3, in the semiconductor memory device 1, for example, three wiring layers 10-0a, 10-0b, and 10-0c extending in the X direction are connected using a wiring layer 10-0d (that is part of a 1st connecting section) extending in the Y direction. The wiring layers 10-0a, and 10-0c are located on opposite ends in the Y direction. The wiring layer 10-0a and the wiring layer 10-0b are adjacent to each other in the Y direction with another wiring layer (e.g., a wiring layer 10-1a) interposed therebetween. The wiring layer 10-0d is located on one end in the X direction. The three wiring layers 10-0a, 10-0b, and 10-0c function as a select gate line SGD0. In the first embodiment, for example, the Y direction is a direction orthogonal to or substantially orthogonal to the X direction.

Wiring layers 10-1a and 10-1b extending in the X direction are connected using a wiring layer 10-1d (that is part of a 2nd connecting section) extending in the Y direction. The wiring layer 10-1a is located between the wiring layers 10-0a, and 10-0b. The wiring layer 10-1b is located between the wiring layer 10-0b and another wiring layer (e.g., a wiring layer 10-2a). The wiring layer 10-1d is located on the other end in the X direction with respect to the wiring layer 10-0d. The two wiring layers 10-1a and 10-1b function as a select gate line SGD1.

Wiring layers 10-2a and 10-2b extending in the X direction are connected by a wiring layer 10-2d (which is part of the 1st connecting section) extending in the Y direction. Similarly, wiring layers 10-3a and 10-3b extending in the X direction are connected by a wiring layer 10-3d (which is part of the 2nd connecting section) extending in the Y direction. The wiring layer 10-2a is located between the wiring layer 10-1b and the wiring layer 10-3a. The wiring layer 10-3a is located between the wiring layer 10-2a and the wiring layer 10-2b. The wiring layer 10-2b is located between the wiring layer 10-3a and the wiring layer 10-3b. The wiring layer 10-3b is located between the wiring layer 10-2b and the wiring layer 10-0c. The wiring layer 10-2d is located on one end in the X direction on the same side as the wiring layer 10-0d. The wiring layer 10-3d is located on the other end in the X direction on the opposite side of the wiring layer 10-0d. The two wiring layers 10-2a and 10-2b function as a select gate line SGD2. The two wiring layers 10-3a and 10-3b function as a select gate line SGD3.

In the first embodiment, a configuration in which the wiring layers are connected by using each of the wiring layers 10-0d, and 10-2d, or the wiring layers 10-1d, and 10-3d is given as an example, but the configuration of each wiring layer is not limited to the configuration illustrated in the first embodiment. For example, each wiring layer may be independent and a control may be performed such that the same voltage may be supplied to the wiring layers 10-0a, 10-0b, and 10-0c, the same voltage may be supplied to the wiring layers 10-1a and 10-1b, the same voltage may be supplied to the wiring layers 10-2a and 10-2b, and the same voltage may be supplied to the wiring layers 10-3a and 10-3b.

The wiring layers 10 adjacent to each other in the Y direction in the block BLK are insulated from each other. A region that insulates the adjacent wiring layers 10 is called a slit SLT2. In the slit SLT2, for example, a region extending from a plane parallel to the source line layer to at least a layer in which the wiring layers 10 are provided is embedded by using an insulating film (not illustrated). In the memory cell array 21, for example, the blocks BLK illustrated in FIG. 3 are arranged in the Y direction. As in the wiring layers 10 in the block BLK that are adjacent to each other in the Y direction, a gap between the blocks BLK that are adjacent to each other in the Y direction is embedded by using an insulating film (not illustrated), and so the blocks BLK adjacent to each other in the Y direction are also insulated from each other. A region that insulates the adjacent blocks BLK is called a slit SLT1. As in the slit SLT2, in the slit SLT1, an insulating film is embedded in a region extending from a plane parallel to the source line layer, to at least a layer in which the wiring layers 10 are provided.

Memory pillars MP (MP0 to MP15) are provided between the wiring layers 10 adjacent to each other in the Y direction. The plurality of memory pillars MP is provided in a memory cell section that is between the first connecting section and the second connecting section. Each of the memory pillars MP extends in the Z direction. In the first embodiment, for example, the Z direction is a direction orthogonal to or substantially orthogonal to the XY directions, and is a direction perpendicular to or substantially perpendicular to the source line layer. In the first embodiment, the memory pillar MP may be called a "semiconductor pillar", the X direction may be called a "first direction", the Y direction may be called a "second direction", and the Z direction may be called a "third direction".

Specifically, the memory pillars MP4 and MP12 are provided between the wiring layers 10-0a and 10-1a. The memory pillars MP0 and, MP8 are provided between the wiring layers 10-1a and 10-0b. The memory pillars MP5, and MP13 are provided between the wiring layers 10-0b and 10-1b. The memory pillars MP1 and, MP9 are provided between the wiring layers 10-1b and 10-2a. The memory pillars MP6 and, MP14 are provided between the wiring layers 10-2a and 10-3a. The memory pillars MP2, and MP10 are provided between the wiring layers 10-3a and 10-2b. The memory pillars MP7, and MP15 are provided between the wiring layers 10-2b and 10-3b. The memory pillars MP3, and MP11 are provided between the wiring layers 10-3b and 10-0c.

The memory pillar MP is a structure in which select transistors ST1 and ST2, and memory cell transistors MT are formed. The detailed structure of the memory pillar MP will be described below.

The memory pillars MP0 to MP3 are aligned along the Y direction. The memory pillars MP8 to MP11 are aligned along the Y direction, at positions adjacent to the memory pillars MP0 to MP3 in the X direction. That is, the memory pillars MP0 to MP3 and the memory pillars MP8 to MP11 are arranged in parallel.

The plurality of memory pillars MP4 to MP7 and the plurality of memory pillars MP12 to MP15 are separately aligned along the Y direction. The memory pillars MP4 to MP7 are located between the memory pillars MP0 to MP3 and the memory pillars MP8 to MP11 in the X direction. The memory pillars MP12 to MP15 are located such that the memory pillars MP8 to MP11 are interposed between the memory pillars MP12 to MP15 and the memory pillars MP4 to MP7 in the X direction. In addition, a respective pairs of the memory pillars MP4 to MP7 and the memory pillars MP12 to MP15 are arranged in parallel in the X direction.

Two bit lines BL0 and BL1 are provided above the memory pillars MP0 to MP3. The bit line BL0 is connected to both the memory pillars MP1 and MP3. The bit line BL1 is connected to both the memory pillars MP0 and MP2. Two bit lines BL2 and BL3 are provided above the memory pillars MP4 to MP7. The bit line BL2 is connected to both the memory pillars MP5 and MP7. The bit line BL3 is connected to both the memory pillars MP4 and MP6.

Two bit lines BL4 and BL5 are provided above the memory pillars MP8 to MP11. The bit line BL4 is connected to both the memory pillars MP9 and MP11. The bit line BL5 is connected to both the memory pillars MP8 and MP10. Two bit lines BL6 and BL7 are provided above the memory pillars MP12 to MP15. The bit line BL6 is connected to both the memory pillars MP13 and MP15. The bit line BL7 is connected to both the memory pillars MP12 and MP14.

As described above, the memory pillar MP is provided at a position between two wiring layers 10 in the Y direction, and is embedded in a part of any one of the slits SLT2. One slit SLT2 is provided between the memory pillars MP adjacent to each other in the Y direction.

No memory pillar MP is provided between the adjacent blocks BLK. In the other words, the wiring layer 10-0a of one block BLK and the wiring layer 10-0b of another block BLK adjacent to the one block BLK face each other via the slit SLT1.

Figure 4:
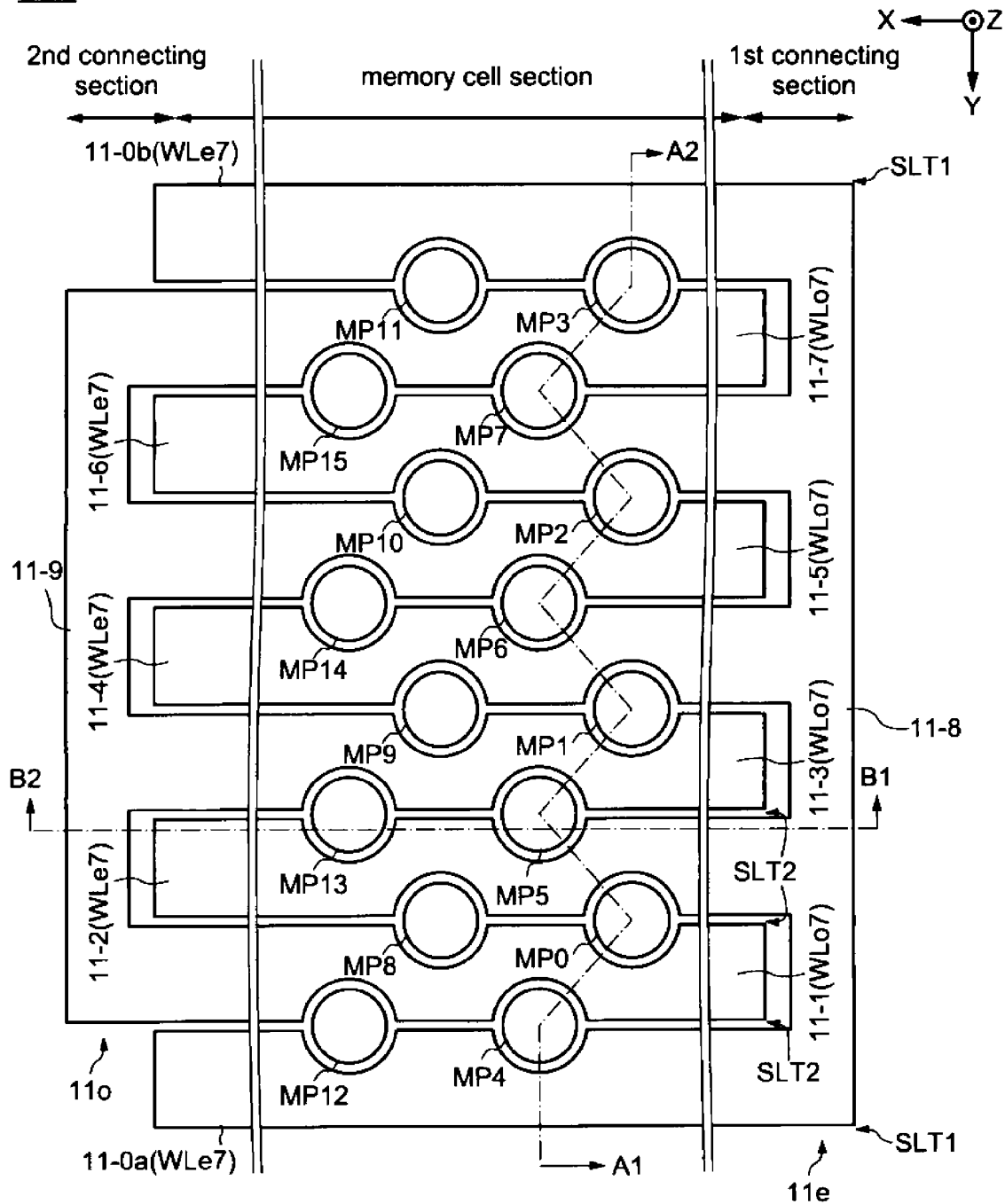
FIG. 4 is a view illustrating a planar layout of a word line and a memory pillar according to the first embodiment.

FIG. 4 is a view illustrating a planar layout of a word line WL in the XY plane. The layout illustrated in FIG. 4 corresponds to the layout of a region for one block of FIG. 3, and is a layout of wiring layers 11 provided in a layer below the wiring layers 10 illustrated in FIG. 3. In the example of the planar layouts illustrated in FIG. 3 and FIG. 4, only eight bit lines (the bit lines BL0 to BL7) are illustrated, but, for example, the number of the provided bit lines may correspond to the data length of 4 kByte, 8 kByte, or 16 kByte, and the number of bit lines is not limited to any one particular number. In the description of FIG. 4, descriptions of the configuration which is the same or similar to those of FIG. 1 to FIG. 3 may be omitted.

As illustrated in FIG. 4, nine wiring layers 11 (wiring layers 11-0a, 11-1 to 11-7, and 11-0b) extending in the X direction are arranged along the Y direction. Each of the wiring layers 11-0 to 11-7 is arranged in a layer below each of the wiring layers 10-0 to 10-7 in the Z direction. An insulating film is provided between the wiring layers 11-0 to 11-7 and the wiring layers 10-0 to 10-7, so that the wiring layers 11-0 to 11-7 and the wiring layers 10-0 to 10-7 are insulated from each other.

Each wiring layer 11 functions as a word line WL7. Other word lines WL0 to WL6 also have the same configuration and function as the word line WL7. In the example illustrated in FIG. 4, the wiring layers 11-0a, 11-2, 11-4, 11-6, and 11-0b function as an even-numbered word line WLe7. The wiring layers 11-0a, 11-2, 11-4, 11-6, and 11-0b are connected by a wiring layer 11-8 (that is in the first connecting section) extending in the Y direction. The wiring layer 11-8 is provided on one end in the X direction. The wiring layer 11-8, and the wiring layers 11-0a, 11-2, 11-4, 11-6, and 11-0b are connected to the row decoder 29. In the first embodiment, the wiring layer 11-8 and the wiring layers 11-0a, 11-2, 11-4, 11-6, and 11-0b may be collectively referred to as a wiring layer 11e in some cases.

The wiring layers 11-1, 11-3, 11-5, and 11-7 function as an odd-numbered word line WLo7. The wiring layers 11-1, 11-3, 11-5, and 11-7 are connected by a wiring layer 11-9 (in the second connecting section) extending in the Y direction. The wiring layer 11-9 is provided on the other end in the X direction on the opposite side of the wiring layer 11-8. The wiring layer 11-9, and the wiring layers 11-1, 11-3, 11-5, and 11-7 are connected to the row decoder 29. In the first embodiment, the wiring layer 11-9 and the wiring layers 11-1, 11-3, 11-5, and 11-7 may be collectively referred to as a wiring layer 110 in some cases.

A memory cell section is provided between the 1st connecting section and the 2nd connecting section. In the memory cell section, the wiring layers 11 adjacent to each other in the Y direction are separated by the slit SLT2 illustrated in FIG. 3. The wiring layers 11 of the blocks BLK adjacent to each other in the Y direction are separated by the slit SLT1 as in the slit SLT2. As in FIG. 3, the memory cell section includes the memory pillars MP0 to MP15.

The select gate line SGS and the word lines WL0 to WL6 have the same configuration as the word line WL7 illustrated in FIG. 4.

1-1-5. Structure of Cross-Section of Memory Cell Array>

Figure 5:
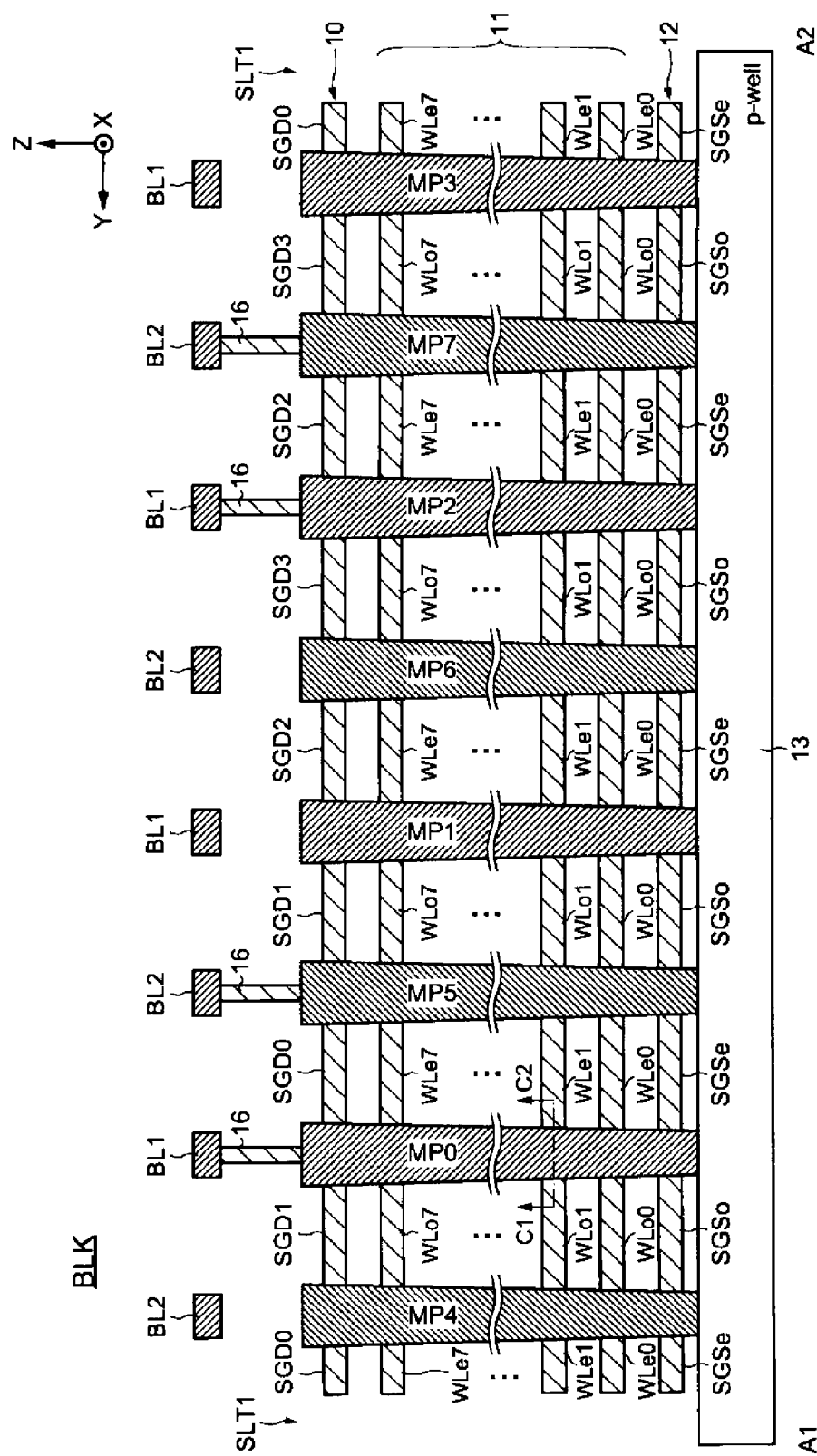
FIG. 5 is a view of a cross-section cut along A1-A2 in the semiconductor memory device illustrated in FIG. 4.

FIG. 5 is a view illustrating a cross-section cut along A1-A2 illustrated in FIG. 4. In the description of FIG. 5, descriptions of the configuration which is the same or similar to those of FIG. 1 to FIG. 4 may be omitted.

As illustrated in FIG. 5, a wiring layer 12 is provided above a p-type well region (p-well) of a semiconductor substrate 13 in the Z direction. The semiconductor substrate 13 functions as the source line SL. The wiring layer 12 functions as the select gate line SGS. The eight wiring layers 11 are stacked in the Z direction above the wiring layer 12. The wiring layers 11 function as the word lines WL. The eight wiring layers 11 correspond to the word lines WL0 to WL7, respectively. FIG. 4 is a view illustrating the planar layout of the wiring layer 11 functioning as the word line WL, and FIG. 3 is a view illustrating the planar layout of the wiring layer 10 functioning as the select gate line SGD. The planar layout of the wiring layer 12 functioning as the select gate line SGS is, for example, the layout illustrated in FIG. 3 in which the wiring layer 10 functioning as the select gate line SGD is replaced with the wiring layer 12 functioning as the select gate line SGS.

The wiring layer 12 functions as an even-numbered select gate line SGSe or an odd-numbered select gate line SGSo. The even-numbered select gate line SGSe and the odd-numbered select gate line SGSo are alternately arranged in the Y direction via the slits SLT2. The memory pillar MP is provided between the even-numbered select gate line SGSe and the odd-numbered select gate line SGSo adjacent to each other in the Y direction. The even-numbered select gate line SGSe and the odd-numbered select gate line SGSo do not need to be independently electrically driven. If they are not independently electrically driven, even-numbered select gate line SGSe and the odd-numbered select gate line SGSo may be electrically connected.

The wiring layer 11 functions as an even-numbered word line WLe or an odd-numbered word line WLo. The even-numbered word lines WLe, and the odd-numbered word lines WLo are alternately arranged in the Y direction via the slits SLT2. The memory pillar MP is provided between the even-numbered word line WLe, and the odd-numbered word line WLo adjacent to each other in the Y direction. Memory cells to be described below are provided between the memory pillar MP and the even-numbered word line WLe, and between the memory pillar MP and the odd-numbered word line WLo.

The slit SLT1 is provided between the blocks BLK adjacent to each other in the Y direction. In the slit SLT1, for example, an insulating layer is provided. The Y direction-width of the slit SLT1 has substantially the same size as the Y direction-width of the slit SLT2.

In the semiconductor memory device 1, the source line SL is provided on the main surface of the semiconductor substrate 13. The source line SL may be provided above the semiconductor substrate 13 and extending in the X direction and the Y direction across a region corresponding to the memory cell array 21. In this case, the source line SL may be an unpatterned conductive layer or a plurality of linearly patterned conductive layers.

As illustrated in FIG. 3 and FIG. 4, the memory pillar MP is electrically connected to the bit line BL. For example, the memory pillar MP0 and the bit line BL1 are connected via a contact plug 16, and the memory pillar MP1 and the bit line BL0 are connected via the contact plug 16. The memory pillar MP2 and the bit line BL1 are connected via the contact plug 16, and the memory pillar MP3 and the bit line BL0 are connected via the contact plug 16. Similarly, each of the memory pillars MP4 to MP7 is connected to the bit line BL2 or BL3, each of the memory pillars MP8 to MP11 is connected to the bit line BL4 or BL5, and each of the memory pillars MP12 to MP15 is connected to the bit line BL6 or BL7.

Figure 6:
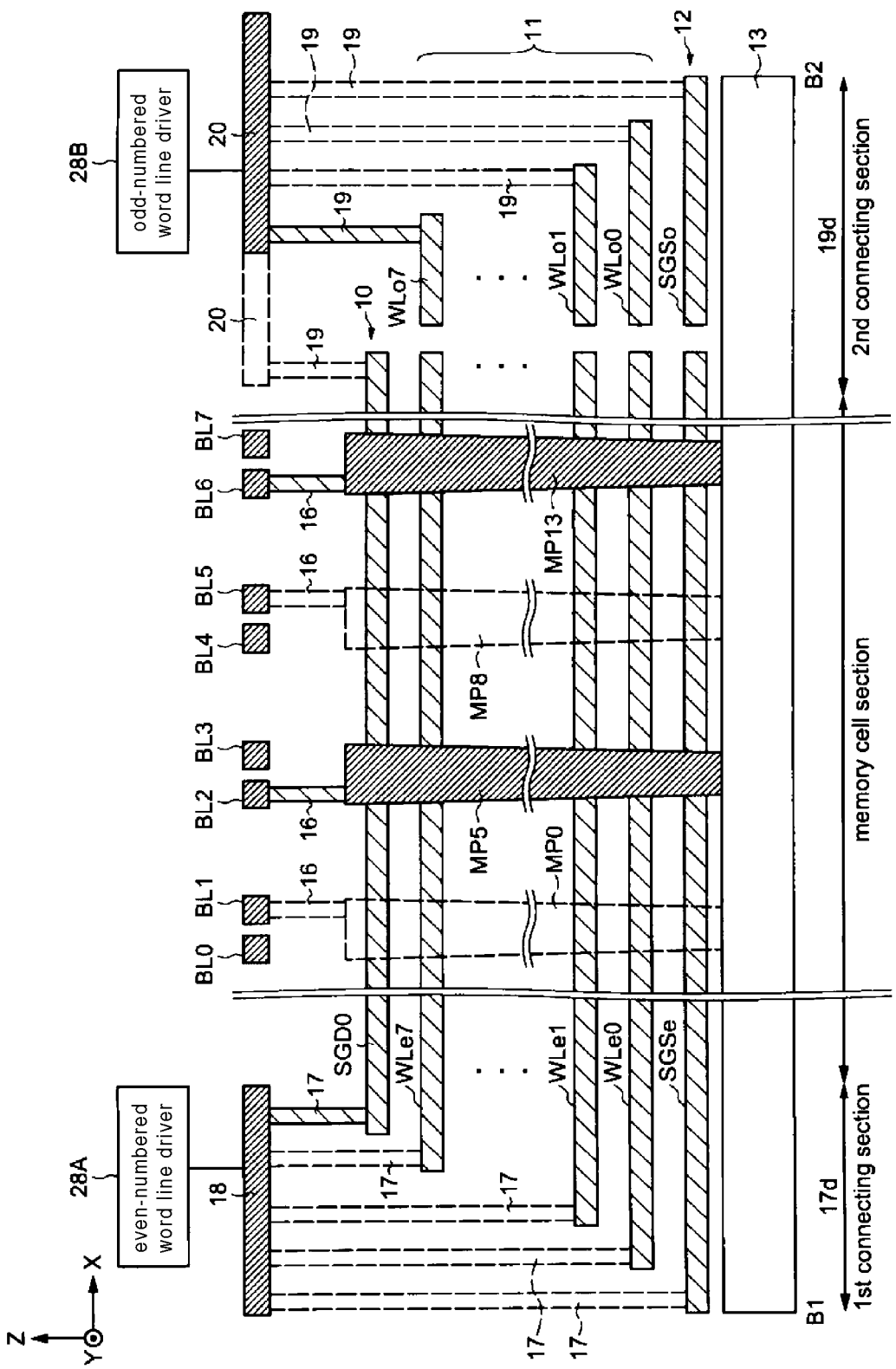
FIG. 6 is a view of a cross-section cut along B1-B2 in the semiconductor memory device illustrated in FIG. 4.

FIG. 6 is a view illustrating a cross-section cut along B1-B2 in the semiconductor memory device 1 illustrated in FIG. 4. In the description of FIG. 6, descriptions of the configuration which is the same or similar to those of FIG. 1 to FIG. 5 may be omitted. The stacked structure of the wiring layer 12, the wiring layer 11, and the wiring layer 10, and the configuration of the memory cell section are the same as those described with reference to FIG. 5, and thus descriptions thereof are omitted here. In FIG. 6, the configuration existing in the depth direction of the B1-B2 cross-section is drawn by a dotted line.

As illustrated in FIG. 6, in a 1st connecting section 17d, the wiring layer 10, the wiring layer 11, and the wiring layer 12 are formed in a stepped shape. That is, when viewed from above the XY plane, the upper surface of the end portion of each of the wiring layer 10, the eight wiring layers 11 and the wiring layer 12 is exposed in the 1st connecting section 17d. A contact plug 17 is provided on the upper surface of the end portion of each of the wiring layer 10, the eight wiring layers 11 and the wiring layer 12 exposed in the 1st connecting section 17d. The contact plug 17 is connected to a metal wiring layer 18. For example, by using the metal wiring layer 18, the wiring layer 10 functioning as the even-numbered select gate lines SGD0 and SGD2, the wiring layers 11 functioning as the even-numbered word lines WLe, and the wiring layer 12 functioning as the even-numbered select gate line SGSe are electrically connected to the even-numbered word line driver 28A via the row decoder 29 (FIG. 1).

As in the 1st connecting section 17d, in a 2nd connecting section 19d, the wiring layer 10, the wiring layer 11, and the wiring layer 12 are formed in a step shape. When viewed from above the XY plane, the upper surface of the end portion of each of the wiring layer 10, the eight wiring layers 11 and the wiring layer 12 is exposed in the 2nd connecting section 19d. Contact plugs 19 are provided on the upper surface of the end portion of the wiring layer 10 exposed in the 2nd connecting section 19d, and on the upper surface of the end portion of each of the eight wiring layers 11 and the wiring layer 12. The contact plug 19 is connected to a metal wiring layer 20. For example, by using the metal wiring layer 20, the odd-numbered select gate lines SGD1 and SGD3, the wiring layers 11 functioning as the odd-numbered word lines WLo, and the wiring layer 12 functioning as the odd-numbered select gate line SGSo are electrically connected to the odd-numbered word line driver 28B via the row decoder 29 (FIG. 1).

The wiring layer 10 may be electrically connected to the row decoder 29 or to the even-numbered word line driver 28A and the odd-numbered word line driver 28B via the 2nd connecting section 19d instead of the 1st connecting section 17d, or may be electrically connected to the row decoder 29 or to the even-numbered word line driver 28A and the odd-numbered word line driver 28B via both the 1st connecting section 17d and the 2nd connecting section 19d.

FIG. 7 is a view illustrating electrical connection of the voltage generation circuit 27, the driver set 28, and the word line WL according to the first embodiment. In the description of FIG. 7, descriptions of the configuration which is the same or similar to those of FIG. 1 to FIG. 6 may be omitted.

As illustrated in FIG. 7, the wiring layer 11 functioning as the even-numbered word line WLe may be connected to the even-numbered word line driver 28A, and the wiring layer 11 functioning as the odd-numbered word line WLo may be electrically connected to the odd-numbered word line driver 28B. As described in "1-1-2. Configuration of semiconductor memory device", the even-numbered word line driver 28A, and the odd-numbered word line driver 28B are provided in the driver set 28. The driver set 28 is electrically connected to the voltage generation circuit 27. The even-numbered word line driver 28A, and the odd-numbered word line driver 28B may generate various voltages by using voltages supplied from the voltage generation circuit 27, and the even-numbered word line driver 28A may supply the generated voltage to the even-numbered word line WLe and the odd-numbered word line driver 28B may supply the generated voltage to the odd-numbered word line WLo.

Figure 8:
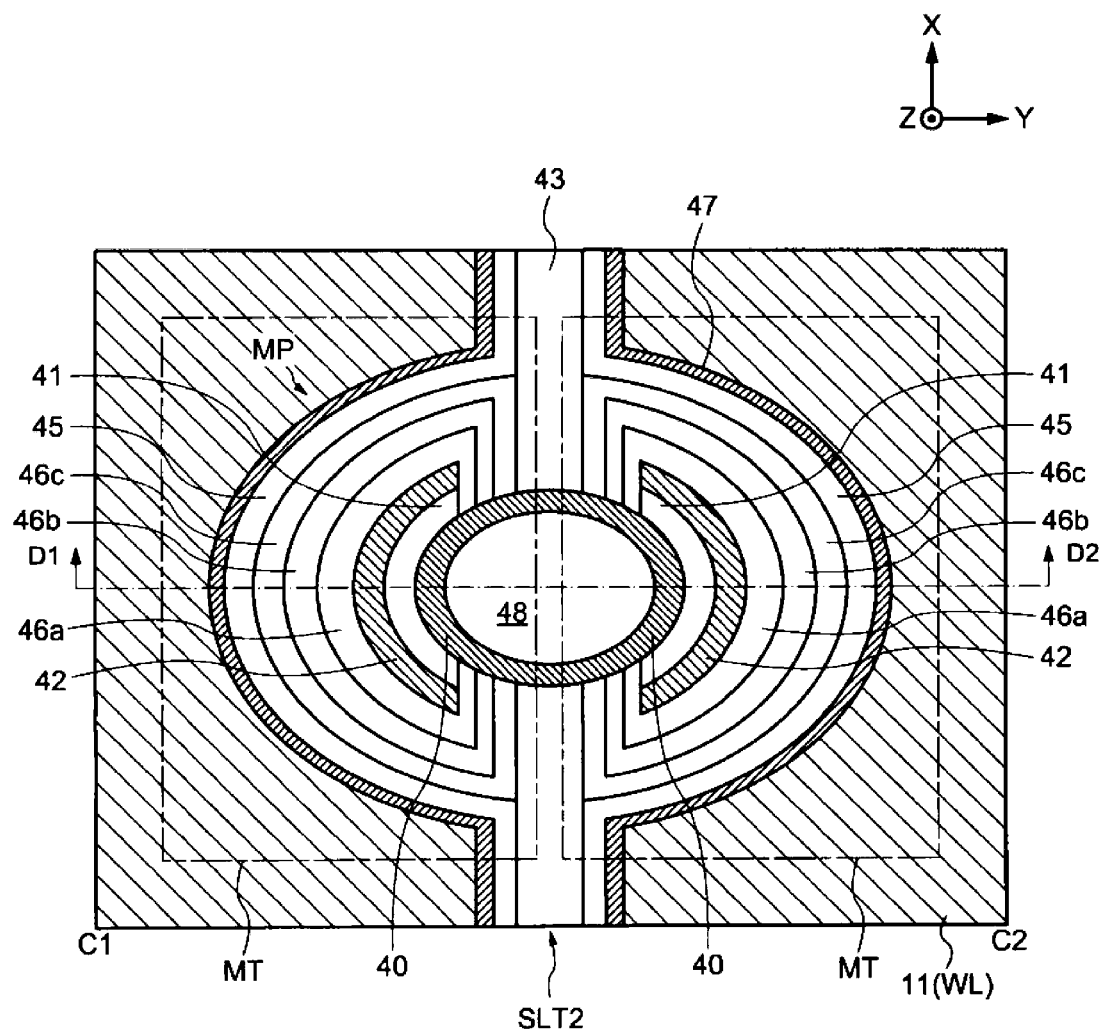
FIG. 8 is a view of a cross-section cut along the C1-C2 line in a first example of a memory cell transistor illustrated in FIG. 5.
Figure 9:
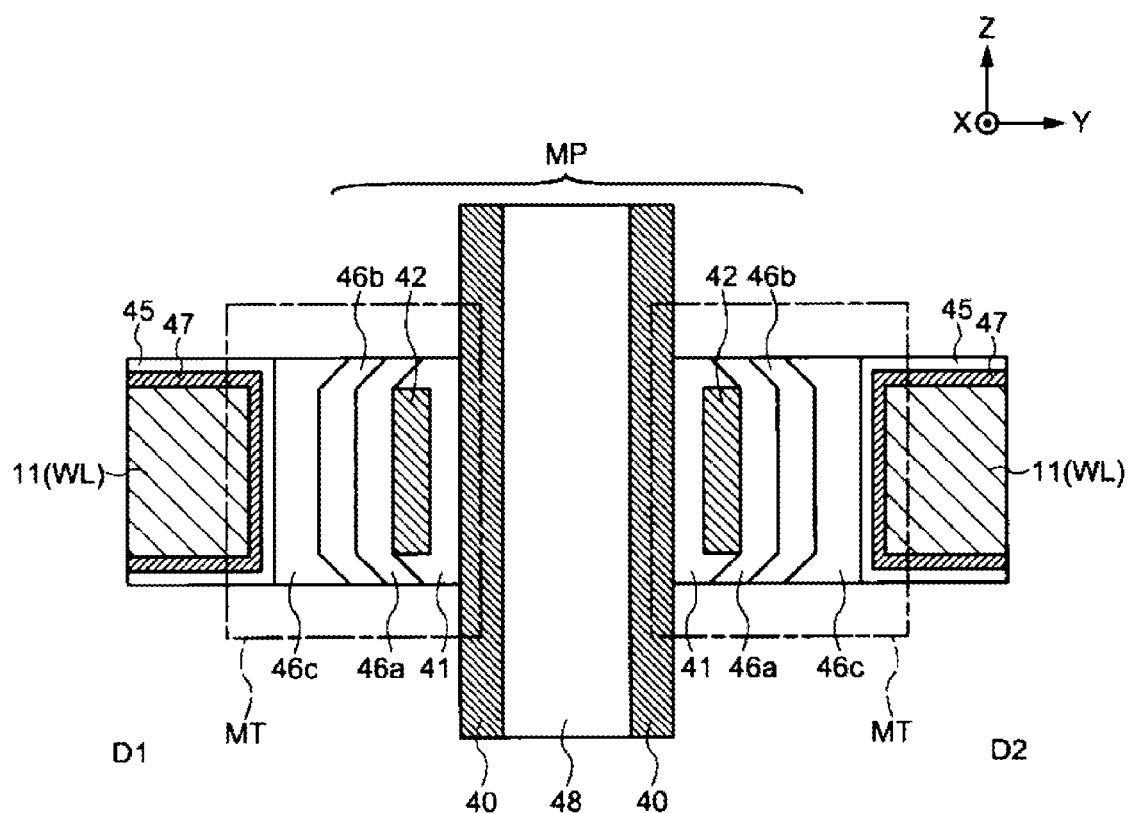
FIG. 9 is a view of a cross-section cut along the D1-D2 line in the memory cell transistor illustrated in FIG. 8.

1-1-6. Cross-Section of Memory Pillar MP and Memory Cell Transistor MT 1-1-6-1. First Example In the structure of the memory cell transistor MT, the structure of the first example illustrated in FIG. 8 and FIG. 9 is used. FIG. 8 is a view illustrating a cross-section cut along the C1-C2 line of FIG. 5, and FIG. 9 is a view illustrating a cross-section cut along the D1-D2 line of the memory cell transistors MT illustrated in FIG. 8. FIG. 8 and FIG. 9 are views of cross-sections, which illustrate a region including two memory cell transistors MT. In the first example, the charge storage layer disposed in the memory cell transistor MT is a conductive film. In the first example, the memory cell transistor MT is a floating gate-type memory cell transistor MT. In the description of FIG. 8 and FIG. 9, descriptions of the configuration which is the same or similar to those of FIG. 1 to FIG. 7 may be omitted.

As illustrated in FIG. 8 and FIG. 9, the memory pillar MP includes an insulating layer 48 and an insulating layer 43, a semiconductor layer 40, an insulating layer 41, a conductive layer 42, and insulating layers 46a to 46c, all of which extend in the Z direction. The insulating layer 48 is formed by using, for example, a silicon oxide film. The semiconductor layer 40 surrounds the periphery of the insulating layer 48. The semiconductor layer 40 functions as a region in which a channel of the memory cell transistor MT is formed. The semiconductor layer 40 is formed by using, for example, a polycrystalline silicon layer. The semiconductor layer 40 is continuously provided between two memory cell transistors MT in the same XY plane of the memory pillar MP, and is not divided between the two memory cell transistors MT. Therefore, channels formed in the two memory cell transistors MT, respectively, share the same part of the memory pillar MP.

The semiconductor layer 40 is continuous between the two memory cell transistors MT. Therefore, channels formed in the two memory cell transistors MT, respectively, share a part of the memory pillar MP. Specifically, in FIG. 8 and FIG. 9, in the left memory cell transistor MT and the right memory cell transistor MT formed in the same XY plane of the memory pillar MP, the channel formed in the left memory cell transistor MT and the channel formed in the right memory cell transistor MT share a part of the memory pillar MP. Here, the fact that the two channels share a part of the memory pillar MP means that the two channels are formed in the same memory pillar MP and the two channels partially overlap.

The insulating layer 41 is provided around the semiconductor layer 40, and functions as a gate insulating film of each memory cell transistor MT. The insulating layer 41 is divided into two regions in the XY plane illustrated in FIG. 8. The insulating layers 41 as two separate regions function as gate insulating films of the two memory cell transistors MT in the same XY plane of the memory pillar MP, respectively. The insulating layer 41 is formed by using, for example, a stacked structure of a silicon oxide film and a silicon nitride film.

The conductive layer 42 is provided around the insulating layer 41 and is divided into two regions along the Y direction by the insulating layer 43. The conductive layers 42 function as charge storage layers of the two memory cell transistors MT, respectively. The conductive layer 42 is formed by using, for example, a polycrystalline silicon layer.

The insulating layer 43 is formed by using, for example, a silicon oxide film. The insulating layer 46a, the insulating layer 46b, and the insulating layer 46c are sequentially provided around the conductive layer 42 from the side close to the conductive layer 42. The insulating layer 46a and the insulating layer 46c are formed by using, for example, a silicon oxide film, and the insulating layer 46b is formed by using, for example, a silicon nitride film. The insulating layer 46a, the insulating layer 46b, and the insulating layer 46c function as a block insulating film of the memory cell transistor MT. The insulating layer 46a, the insulating layer 46b, and the insulating layer 46c are divided into two regions along the Y direction. The insulating layer 43 is provided between the two separate regions of the insulating layers 46c. The insulating layer 43 is embedded in the slit SLT2. The insulating layer 43 is formed by using, for example, a silicon oxide film.

For example, an AlO layer 45 is provided around the first example of the memory pillar MP. For example, a barrier metal layer 47 is provided around the AlO layer 45. The barrier metal layer 47 is formed by using, for example, a TiN film. The wiring layer 11 functioning as the word line WL is provided around the barrier metal layer 47. The wiring layer 11 of the memory pillar MP according to the first embodiment is formed by using, for example, a film made of tungsten.

In the configuration of the memory cell transistor MT illustrated in FIG. 8 and FIG. 9, two memory cell transistors MT are provided along the Y direction in one memory pillar MP. The select transistors ST1 and ST2 have the same configuration as the memory cell transistor MT. An insulating layer (not illustrated) is provided between memory cell transistors MT adjacent to each other in the Z direction, and the conductive layer 42 is individually insulated for each memory cell transistor MT by the insulating layer 41, the insulating layer 43, and the insulating layer 46.

1-1-6-2. Second Example

Figure 10:
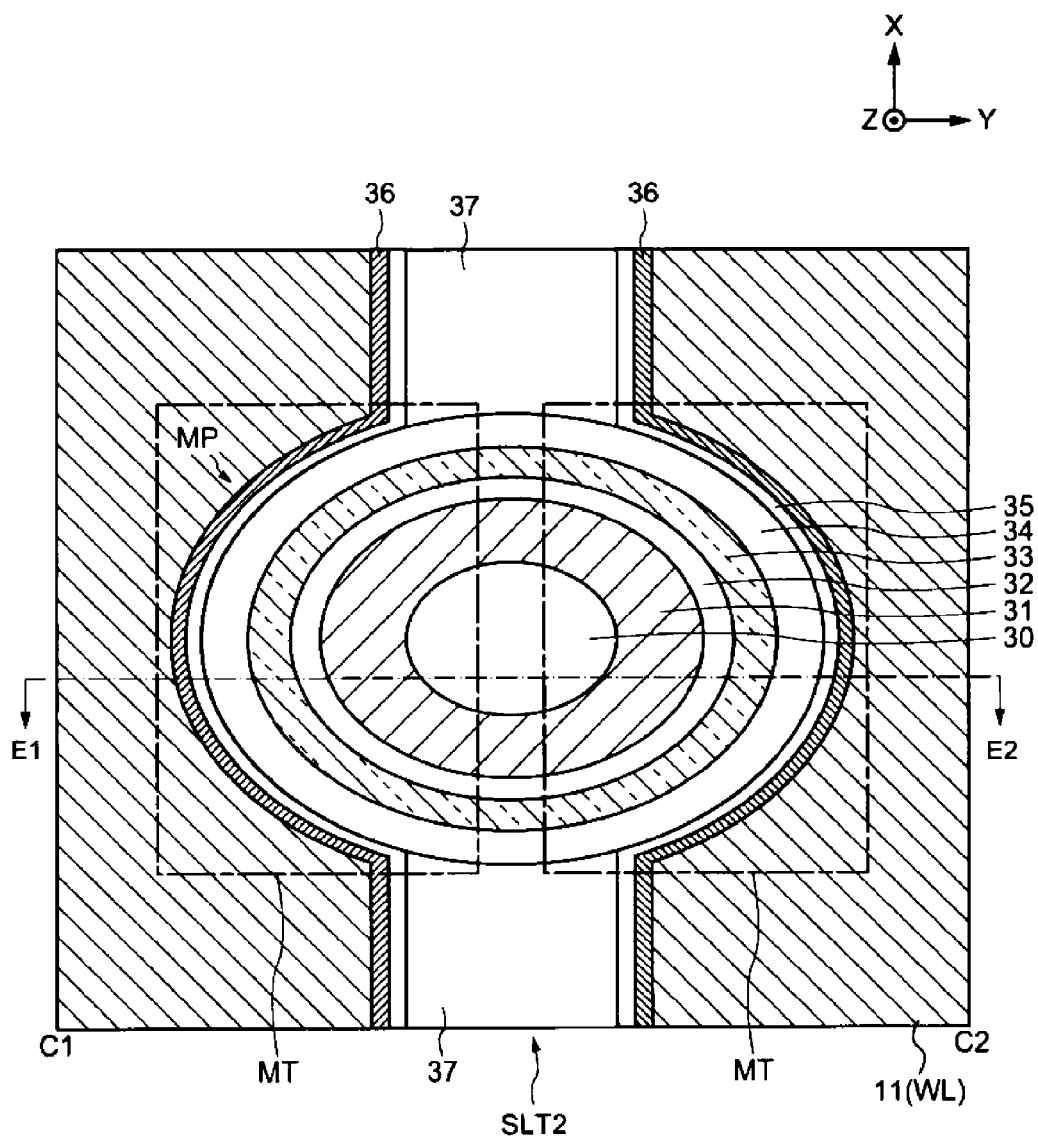
FIG. 10 is a view of a cross-section cut along the C1-C2 line in a second example of the memory cell transistor illustrated in FIG. 5.
Figure 11:
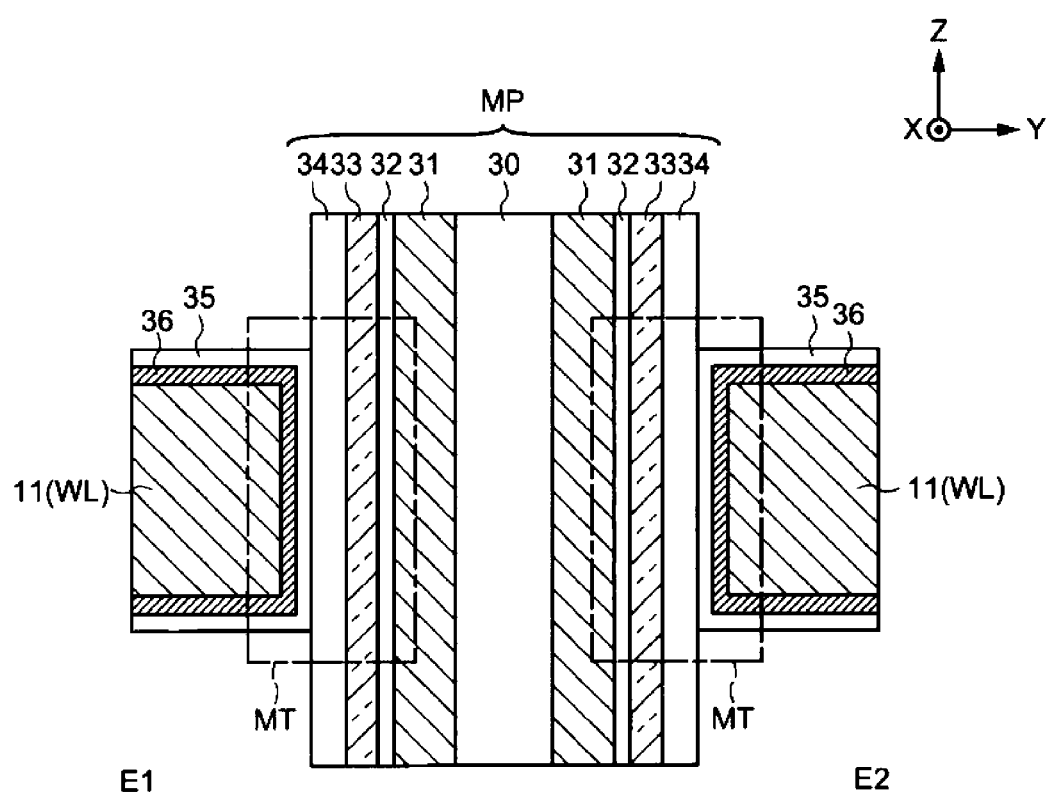
FIG. 11 is a view of a cross-section cut along the E1-E2 line in the memory cell transistor illustrated in FIG. 10.

For the memory cell transistor MT, the structure of the second example illustrated in FIG. 10 and FIG. 11 may be used. FIG. 10 is a view illustrating a cross-section cut along the C1-C2 line of FIG. 5, and FIG. 11 is a view illustrating a cross-section cut along E1-E2 of the memory cell transistors MT illustrated in FIG. 10. FIG. 10 and FIG. 11 are views of cross-sections, which illustrate a region including two memory cell transistors MT. In the second example, the charge storage layer disposed in the memory cell transistor MT is an insulating film. In the second example, in the description of FIG. 10 and FIG. 11 in which the memory cell transistor MT is a MONOS-type memory cell transistor MT, descriptions of the configuration which is the same or similar to those of FIG. 1 to FIG. 7 may be omitted.

As illustrated in FIG. 10 and FIG. 11, the memory pillar MP includes an insulating layer 30, a semiconductor layer 31, an insulating layer 32, an insulating layer 33, and an insulating layer 34, all of which extend in the Z direction. The insulating layer 30 is formed by using, for example, a silicon oxide film. The semiconductor layer 31 surrounds the periphery of the insulating layer 30, and functions as a region in which a channel of two memory cell transistors MT depicted in FIG. 10 is formed. The semiconductor layer 31 is formed by using, for example, a polycrystalline silicon layer. The semiconductor layer 31 is continuously provided without being divided between the two memory cell transistors MT in the same XY plane of the memory pillar MP. Therefore, channels formed in the two memory cell transistors MT, respectively, share a part of the memory pillar MP.

The insulating layer 32 surrounds the periphery of the semiconductor layer 31, and functions as a gate insulating film of the memory cell transistor MT. The insulating layer 32 is formed by using, for example, a stacked structure of a silicon oxide film and a silicon nitride film. The insulating layer 33 surrounds the periphery of the semiconductor layer 31, and functions as a charge storage layer of the memory cell transistor MT. The insulating layer 33 is formed by using, for example, a silicon nitride film. The insulating layer 34 surrounds the periphery of the insulating layer 33, and functions as a block insulating film of the memory cell transistor MT. The insulating layer 34 is formed by using, for example, a silicon oxide film. An insulating layer 37 is embedded in the slit SLT2 excluding the portion of the memory pillar MP. The insulating layer 37 is formed by using, for example, a silicon oxide film.

For example, an AlO layer 35 is provided around the memory pillar MP according to the second example. For example, a barrier metal layer 36 is provided around the AlO layer 35. The barrier metal layer 36 is formed by using, for example, a TiN film. The wiring layer 11 functioning as the word line WL is provided around the barrier metal layer 36. The wiring layer 11 is formed by using, for example, a film made of tungsten.

As in the first example, one memory pillar MP according to the second example includes two memory cell transistors MT along the Y direction. In the same manner, one memory pillar MP includes two transistors along the Y direction, as the select transistors ST1 and ST2.

1-1-7. Equivalent Circuit of String

Figure 12:
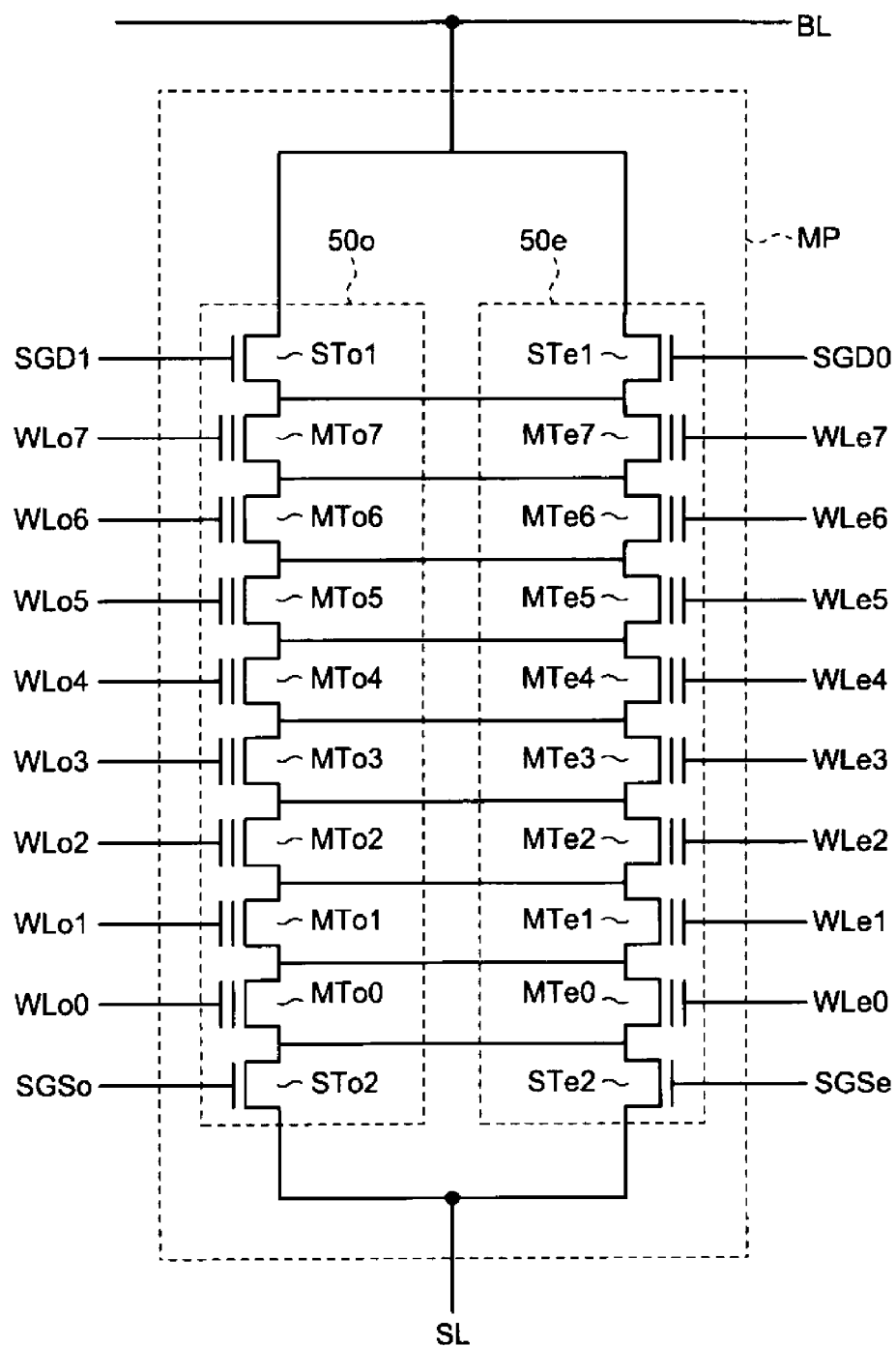
FIG. 12 is a view illustrating an equivalent circuit of adjacent strings in the semiconductor memory device according to the first embodiment.

FIG. 12 is an equivalent circuit diagram of adjacent strings in the semiconductor memory device 1. In the description of FIG. 12, descriptions of the configuration which is the same or similar to those of FIG. 1 to FIG. 11 may be omitted.

As illustrated in FIG. 12, two NAND strings 50e, and 50o are formed in one memory pillar MP. Specifically, the NAND string 50o is provided on the first side of the memory pillar MP. The NAND string 50e is provided on the second side of the memory pillar MP.

The NAND string 50o has a select transistor STo1, i memory cell transistors MTo (where i is an integer of 2 or more), and a select transistor STo2, which are electrically connected in series. In the first embodiment, i is 8. Eight memory cell transistors MTo0 to MTo7 are electrically connected between the select transistor STo1 and the select transistor STo2. The NAND string 50e has a select transistor STe1, i memory cell transistors MTe, and a select transistor STe2, which are electrically connected in series. Eight memory cell transistors MTe0 to MTe7 are electrically connected between the select transistor STe1 and the select transistor STe1.

The NAND string 50e and the NAND string 50o face (oppose) each other. Therefore, the select transistor STe1, the memory cell transistors MTe0 to MTe7, and the select transistor STe2 disposed in the NAND string 50e, and the select transistor STo1, the memory cell transistors MTo0 to MTo7, and the select transistor STo2 disposed in the NAND string 50o face (oppose) each other on a one-to-one basis.

In the Z direction with respect to the source line SL, an odd-numbered select gate line SGSo and an even-numbered select gate line SGSe for one layer, odd-numbered word lines WLo for i layers, even-numbered word lines WLe for i layers, and select gate lines SGD0 and SGD1 for one layer are provided. In the first embodiment, i is 8, and odd-numbered word lines WLo0 to WLo7 and even-numbered word lines WLe0 to WLe7 are provided.

In the description provided herein, when there is no need to distinguish the NAND strings 50o and 50e from each other, these may be simply referred to as "NAND strings 50" in some cases. Other elements of the NAND string 50 and the wiring connected to the elements are also expressed in the same manner. For example, when there is no need to distinguish the memory cell transistors MTo and MTe from each other, these may be simply referred to as "memory cell transistors MT" in some cases.

In the following description, descriptions will be made for an example where two memory pillars MP, that is, a first memory pillar MP (for example, MP0 in FIG. 4) and a second memory pillar MP (for example, MP5 in FIG. 4) adjacent to the first memory pillar MP, are provided. The first memory pillar MP may be referred to as a "first semiconductor pillar", the NAND string 50o provided in the first memory pillar MP may be referred to as a "first string", the memory cell transistors MTo0 to MTo7 disposed in the first string may be referred to as "first memory cells", the side on which the first string is provided may be referred to as a "first side", the NAND string 50e provided in the first memory pillar MP may be referred to as a "second string", the memory cell transistors MTe0 to MTe7 disposed in the second string may be referred to as "second memory cells", and the side on which the second string is provided may be referred to as a "second side". Likewise, the second memory pillar MP may be referred to as a "second semiconductor pillar", the NAND string 50o provided in the second memory pillar MP may be referred to as a "third string", the memory cell transistors MTo0 to MTo7 disposed in the third string may be referred to as "third memory cells", the side on which the third string is provided may be referred to as a "third side", the NAND string 50e provided in the second memory pillar MP may be referred to as a "fourth string", the memory cell transistors MTe0 to MTe7 disposed in the fourth string may be referred to as "fourth memory cells", and the side on which the fourth string is provided may be referred to as a "fourth side". The second side is the opposite side of the first side in the first memory pillar MP, and the fourth side is the opposite side of the third side in the second memory pillar MP. The second side and the fourth side are between the first side and the third side.

The select transistor STo1 of the NAND string 50o is connected to, for example, the select gate line SGD1. The select transistor STe1 of the NAND string 50e is connected to, for example, the select gate line SGD0. Each of the select transistors STo1 and STe1 is connected to one select gate line SGD of select gate lines SGD0 to SGD3.

The memory cell transistors MTo0 to MTo7 of the NAND string 50o are electrically connected in series, are arranged along the Z direction, and are connected to the odd-numbered word lines WLo0 to WLo7 for i layers, respectively. The memory cell transistors MTe0 to MTe7 of the NAND string 50e are electrically connected in series, are arranged along the Z direction, and are connected to the even-numbered word lines WLe0 to WLe7 for i layers, respectively. The select transistor STo2 of the NAND string 50o is connected to, for example, the odd-numbered select gate line SGSo. The select transistor STe2 of the NAND string 50e is connected to, for example, the even-numbered select gate line SGSe. In the first memory pillar MP, the i memory cell transistors MTo0 to MTo7 and the i memory cell transistors MTe0 to MTe7, the select transistors STo1 and STe1, and the select transistors STo2 and STe2 share the semiconductor layer. As in the first memory pillar MP, in the second memory pillar MP, the i memory cell transistors MTo0 to MTo7 and the i memory cell transistors MTe0 to MTe7, the select transistors STo1 and STe1, and the select transistors STo2 and STe2 share the semiconductor layer.

The odd-numbered word lines WLo0 to WLo7 connected to the memory cell transistors MTo0 to MTo7 disposed in the NAND string 50o may be referred to as "first word lines", and the even-numbered word lines WLe0 to WLe7 connected to the memory cell transistors MTe0 to MTe7 disposed in the NAND string 50e may be referred to as "second word lines".

In the NAND strings 50e and 50o, in the select transistors STo1 and STe1 facing each other, sources are electrically connected to each other and drains are electrically connected to each other, in the memory cell transistors MTo0 to MTo7 and the memory cell transistors MTe0 to MTe7 facing each other, sources are electrically connected to each other and drains are electrically connected to each other, and in the select transistors STo2 and STe2 facing each other, sources are electrically connected to each other and drains are electrically connected to each other. The above-described electrical connection is made because channels formed in the transistors facing each other share a part of the memory pillar MP.

The two NAND strings 50e and 50o in the same memory pillar MP are connected to the same bit line BL and the same source line SL. For example, the memory pillar MP0 is connected to the bit line BL1 and the source line SL, and the memory pillar MP5 is connected to the bit line BL0 and the source line SL.

The position of the first odd-numbered word line WLo0 among the odd-numbered word lines WLo0 to WLo7 in eight layers is closest to the position of the source line SL, and is farthest from the position of the bit line BL, and the position of the eighth odd-numbered word line WLo7 is farthest from the position of the source line SL and is closest to the position of the bit line BL. Likewise, the position of the first even-numbered word line WLe0 among the even-numbered word lines WLe0 to WLe7 in eight layers is closest to the position of the source line SL and is farthest from the position of the bit line BL, and the position of the eighth even-numbered word line WLe7 is farthest from the position of the source line SL and is closest to the position of the bit line BL.

1-1-8. Circuit Configuration of Sense Amplifier Unit SAU

Figure 13:
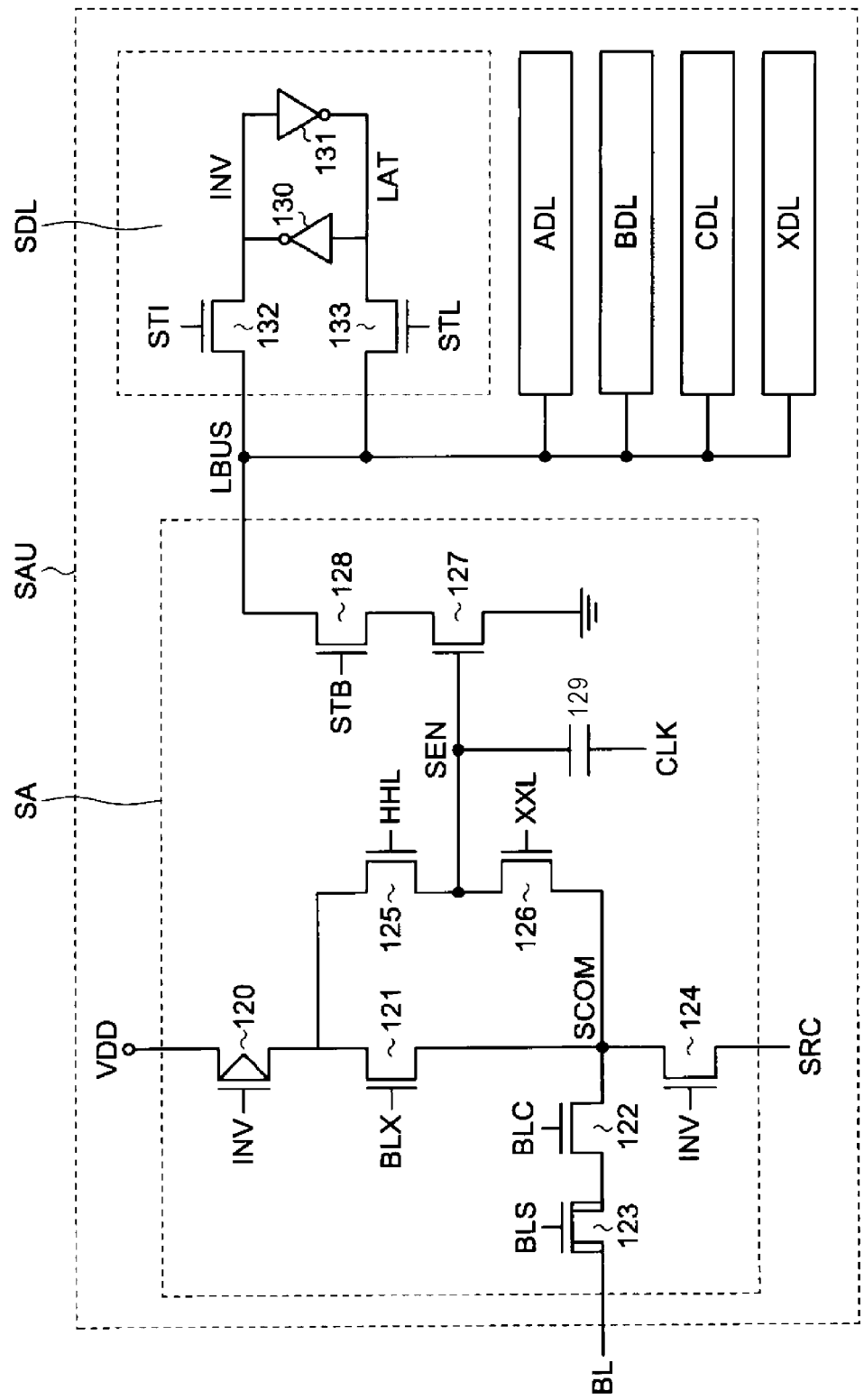
FIG. 13 is a circuit diagram illustrating an example of a circuit configuration of a sense amplifier unit according to the first embodiment.

FIG. 13 is a circuit diagram illustrating an example of a circuit configuration of the sense amplifier unit SAU according to the first embodiment. Descriptions of the configuration which is the same or similar to those of FIG. 1 to FIG. 13 may be omitted.

The sense amplifier module 70 includes a plurality of sense amplifier units SAU associated with the bit lines BL0 to BL(L−1), respectively. FIG. 13 illustrates a circuit configuration of one sense amplifier unit SAU.

The sense amplifier unit SAU may temporarily store, for example, data corresponding to a threshold voltage read out to the bit line BL. The sense amplifier unit SAU may perform logical operations by using temporarily stored data. Although the details will be described below, the semiconductor memory device 1 may execute a read operation and a write operation by using the sense amplifier unit SAU.

As illustrated in FIG. 13, the sense amplifier unit SAU includes a sense amplifier SA, and latch circuits SDL, ADL, BDL, CDL, and XDL. The sense amplifier SA, and the latch circuits SDL, ADL, BDL, CDL, and XDL are connected by a bus LBUS such that they may transmit/receive data to/from each other. The sense amplifier SA is connected between a power line and a node SRC. To the node SRC, a voltage smaller than the voltage supplied to the power line is supplied. The power line is a voltage supply line which supplies a high level voltage to the sense amplifier SA. The node SRC is a node that supplies a low level voltage to the sense amplifier SA. The sense amplifier SA operates when voltages are supplied to the power line and the node SRC. The power line and the node SRC may be configured to supply voltages to elements other than the sense amplifier SA in the sense amplifier unit SAU. The high level voltage is, for example, a voltage VDD, and the low level voltage is, for example, a voltage VSS. The power line may be referred to as a "high voltage supply line", a "voltage supply terminal" or a "high voltage supply terminal", and the node SRC may be referred to as a "voltage supply terminal" or a "low voltage supply terminal".

For example, in the read operation, the sense amplifier SA senses data (threshold voltage) read out to the bit line BL, and determines whether the data corresponding to the read threshold voltage is "0" or "1". The sense amplifier SA includes, for example, a p-channel MOS transistor 120, n-channel MOS transistors 121 to 128, and a capacitor 129.

One end of the transistor 120 is connected to the power line, the gate of the transistor 120 is connected to a node INV in the latch circuit SDL. One end of the transistor 121 is connected to the other end of the transistor 120, the other end of the transistor 121 is connected to a node SCOM, and to the gate of the transistor 121, a control signal BLX is input. One end of the transistor 122 is connected to the node SCOM, and to the gate of the transistor 122, a control signal BLC is input. The transistor 123 is a high breakdown voltage MOS transistor. One end of the transistor 123 is connected to the other end of the transistor 122, the other end of the transistor 123 is connected to the bit line BL, and to the gate of the transistor 123, a control signal BLS is input.

One end of the transistor 124 is connected to the node SCOM, the other end of the transistor 124 is connected to the node SRC, and the gate of the transistor 124 is connected to the node INV. One end of the transistor 125 is connected to the other end of the transistor 120, the other end of the transistor 125 is connected to a node SEN, and to the gate of the transistor 125, a control signal HHL is input. One end of the transistor 126 is connected to the node SEN, the other end of the transistor 126 is connected to the node SCOM, and to the gate of the transistor 126, a control signal XXL is input.

One end of the transistor 127 is grounded, and the gate of the transistor 127 is connected to the node SEN. One end of the transistor 128 is connected to the other end of the transistor 127, and the other end of the transistor 128 is connected to the bus LBUS. To the gate of the transistor 128, a control signal STB is input. One end of the capacitor 129 is connected to the node SEN, and to the other end of the capacitor 129, a signal CLK is input. For example, a voltage VSS is supplied as the signal CLK.

The latch circuits SDL, ADL, BDL, CDL, and XDL temporarily store read data. The latch circuit XDL is connected to, for example, the register 25, and is used for input/output of data between the sense amplifier unit SAU and the input/output circuit 22.

The latch circuit SDL includes, for example, inverters 130 and 131, and n-channel MOS transistors 132 and 133. The input node of the inverter 130 is connected to a node LAT, and the output node of the inverter 130 is connected to the node INV. The input node of the inverter 131 is connected to the node INV, and the output node of the inverter 131 is connected to the node LAT. One end of the transistor 132 is connected to the node INV, the other end of the transistor 132 is connected to the bus LBUS, and to the gate of the transistor 132, a control signal STI is input. One end of the transistor 133 is connected to the node LAT, the other end of the transistor 133 is connected to the bus LBUS, and to the gate of the transistor 133, a control signal STL is input. For example, data stored in the node LAT corresponds to data stored in the latch circuit SDL, and data stored in the node INV corresponds to inverted data of data stored in the node LAT. The circuit configurations of the latch circuits ADL, BDL, CDL, and XDL are, for example, the same as the circuit configuration of the latch circuit SDL, and thus, descriptions thereof will be omitted.

The control signals BLX, BLC, BLS, HHL, XXL, STI, STL and STB are generated by, for example, the sequencer 24. For example, the voltage VDD that is an internal power-supply voltage of the semiconductor memory device 1 is supplied to the power line connected to one end of the transistor 120, and, for example, the voltage VSS that is a ground voltage of the semiconductor memory device 1 is supplied to the node SRC.

In the sense amplifier unit SAU, the timing of when each sense amplifier unit SAU determines data corresponding to a threshold voltage read out to the bit line BL is based on the timing of when the control signal STB is asserted. In the first embodiment, an operation referred to as a sense operation is carried out when each sense amplifier unit SAU determines data corresponding to a threshold voltage read out to the bit line BL. In the semiconductor memory device 1, "the sequencer 24 asserts the control signal STB" corresponds to a change of the control signal STB by the sequencer 24 from the "L" level to the "H" level.

The configuration of the sense amplifier unit SAU is not limited to the configuration and function described with reference to FIG. 13. For example, in the sense amplifier unit SAU, the transistor 128 having a gate to which the control signal STB is input may be configured with a p-channel MOS transistor. In this case, "the sequencer 24 asserts the control signal STB" corresponds to a change of the control signal STB by the sequencer 24 from the "H" level to the "L" level.

The number of latch circuits provided in the sense amplifier unit SAU may be designed to be any number. In this case, the number of latch circuits is designed, for example, on the basis of the number of bits of data stored in one memory cell transistor MT. A plurality of bit lines BL may be connected to one sense amplifier unit SAU via a selector.

1-1-9. Threshold Voltage Distribution of Memory Cell Transistors MT

Figure 14:
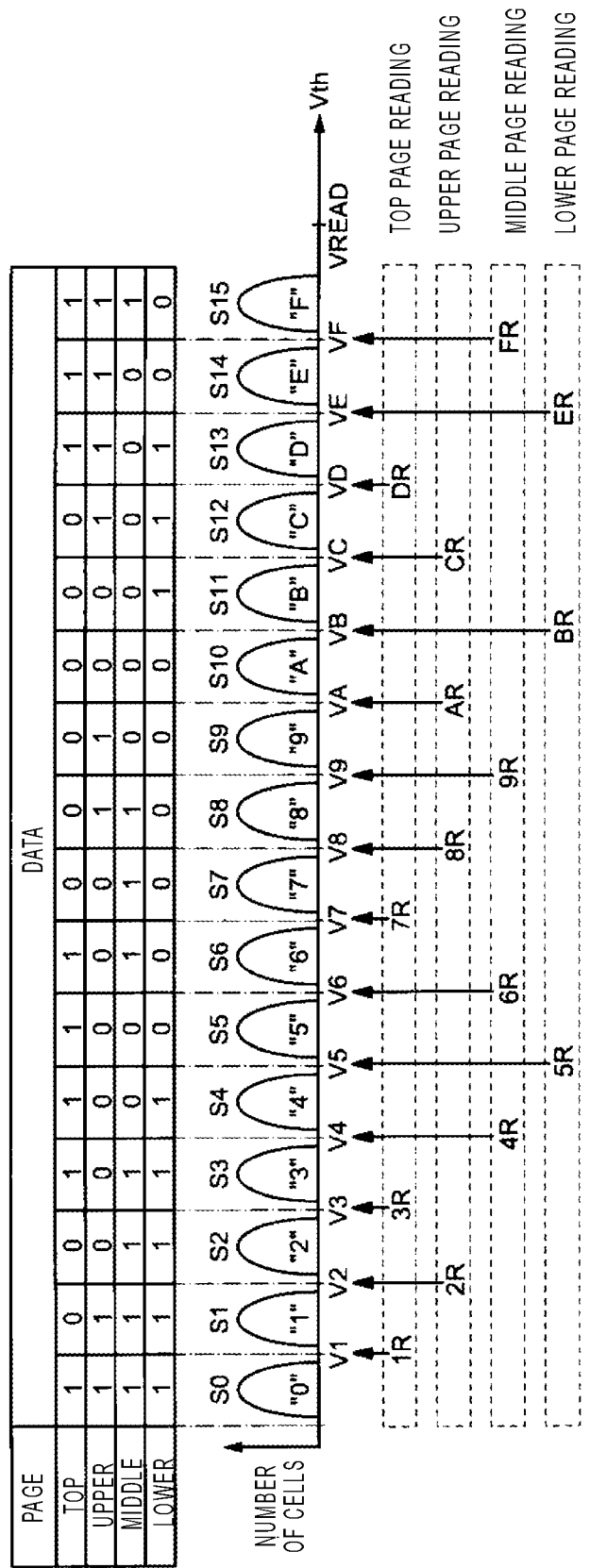
FIG. 14 is a view illustrating a threshold voltage distribution of memory cell transistors according to the first embodiment.

FIG. 14 is a view illustrating an example of a threshold voltage distribution of memory cell transistors MT, data assignment, read voltages, and verify voltages. The vertical axis of the threshold voltage distribution illustrated in FIG. 14 corresponds to the number of memory cell transistors MT (number of cells), and the horizontal axis corresponds to the threshold voltage Vth of the memory cell transistors MT.

FIG. 14 illustrates the threshold voltage distribution of the memory cell transistors MT in the memory system 3 that have been programmed according to a quad-level cell (QLC) method. When programmed according to the QLC method, the memory cell transistors MT have threshold voltages divided into 16 threshold voltage distributions. The number of the threshold voltage distributions of the memory cell transistors MT is not limited to 16. In the memory system 3, when the memory cell transistors MT are programmed according to a triple-level cell (TLC) method, the threshold voltages are divided into eight threshold voltage distributions. Also, when the memory cell transistors MT are programmed according to a multi-level cell (MLC) method, the threshold voltages are divided into four threshold voltage distributions, and when the memory cell transistors MT are programmed according to a single-level cell (SLC) method, the threshold voltages are divided into two threshold voltage distributions.

As illustrated in FIG. 14, the 16 threshold voltage distributions of the QLC method are denoted by, for example, a "0" state, a "1" state, a "2" state, a "3" state, a "4" state, a "5" state, a "6" state, a "7" state, a "8" state, a "9" state, an "A" state, a "B" state, a "C" state, a "D" state, an "E" state, and an "F" state in order from the lowest threshold voltage side.

Among the above-described threshold voltage distributions, the "0" state corresponds to an erased state of the memory cell transistor MT (state S0). The "1" state corresponds to a state S1 of the memory cell transistor MT. The "2" state corresponds to a state S2 of the memory cell transistor MT. The "3" state corresponds to a state S3 of the memory cell transistor MT. The "4" state corresponds to a state S4 of the memory cell transistor MT. Similarly to the "0" state to the "4" state, the "5" state to the "F" state correspond to states S5 to S15 illustrated in FIG. 14, respectively.

In the semiconductor memory device 1, each state indicating the state of the memory cell transistor MT has a verify level. For example, for the state S0, the verify level is 0 (verify level 0), and for the state S1, the verify level is 1 (verify level 1). Similarly to the state S0 and the state S1, for the state S2 to the state S15, the verify levels are 2 to 15, respectively. In the semiconductor memory device 1, it is assumed that the verify level for the state S0 is lowest, and the verify level for the state S15 is highest, but each state and each verify level illustrated in FIG. 14 are examples, and are limiting examples.

As described below, for example, different 4-bit data pieces are assigned to the "0" state to the "F" state, respectively. The memory cell transistor MT included in the "0" state stores "1111" data. The memory cell transistor MT included in the "1" state stores "0111" data. The memory cell transistor MT included in the "2" state stores "0011" data. The memory cell transistor MT included in the "3" state stores "1011" data. The memory cell transistor MT included in the "4" state stores "1001" data. The memory cell transistor MT included in the "5" state stores "1000" data. The memory cell transistor MT included in the "6" state stores "1010" data. The memory cell transistor MT included in the "7" state stores "0010" data. The memory cell transistor MT included in the "8" state stores "0110" data. The memory cell transistor MT included in the "9" state stores "0100" data. The memory cell transistor MT included in the "A" state stores "0000" data. The memory cell transistor MT included in the "B" state stores "0001" data. The memory cell transistor MT included in the "C" state stores "0101" data. The memory cell transistor MT included in the "D" state stores "1101" data. The memory cell transistor MT included in the "E" state stores "1100" data. The memory cell transistor MT included in the "F" state stores "1110" data.

The 4-bit data includes a lower bit, a middle bit, an upper bit, and a top bit in order from the lower bit. A set of lower bits stored in the memory cell transistors MT connected to the same word line WL is called a lower page, a set of middle bits a middle page, a set of upper bits an upper page, and a set of top bits a top page. A write operation and a read operation of data are performed on the page-by-page basis.

A voltage to be used in each verify operation is set between adjacent threshold voltage distributions. For example, voltages V1, V2, V3, V4, V5, V6, V7, V8, V9, VA, VB, VC, VD, VE, and VF are set. Although the details will be described below, verify operations using the voltages V1, V2, V3, V4, V5, V6, V7, V8, V9, VA, VB, VC, VD, VE, and VF are denoted by verify operations 1VR, 2VR, 3VR, 4VR, 5VR, 6VR, 7VR, 8VR, 9VR, AVR, BVR, CVR, DVR, EVR, and FVR, respectively.

In the verify operation, the voltages V1 to VF are supplied to a word line WL to determine the threshold voltages of the memory cell transistors MT connected to the word line WL, so that it can be determined that whether or not the target threshold voltage has been reached for each of the memory cell transistors MT.

For example, the voltage V2 is set between a maximum threshold voltage at the "1" state and a minimum threshold voltage at the "2" state. When the voltage V2 is supplied to memory cell transistors MT, memory cell transistors MT whose threshold voltages are included in the "1" state are turned ON, and memory cell transistors MT whose threshold voltages are included in threshold voltage distributions of the "2" state or higher are turned OFF. As a result, the memory system 3 may determine that the memory cell transistor MT to be programmed to the "S2" state has not yet reached the threshold voltage corresponding to the state S2 of the "2" state.

The other voltages V1, V3, V4, V5, V6, V7, V8, V9, VA, VB, VC, VD, VE, and VF are also set like the voltage V2. Then, the states of the memory cell transistors MT when each voltage is supplied are also the same as the states of the memory cell transistors MT when the voltage V2 is supplied. For example, the voltage V3 is set between a maximum threshold voltage at the "2" state and a minimum threshold voltage at the "3" state. When the voltage V3 is supplied to memory cell transistors MT, memory cell transistors MT whose threshold voltages are included in the "2" state are turned ON, and memory cell transistors MT whose threshold voltages are included in threshold voltage distributions of the "3" state or higher are turned OFF. As a result, the memory system 3 may determine that the memory cell transistor MT to be programmed to the "S3" state has not yet reached the threshold voltage corresponding to the state S3 of the "3" state. For example, the verify voltage VF is set between a maximum threshold voltage at the "E" state and a minimum threshold voltage at the "F" state. When the voltage VF is supplied to memory cell transistors MT, memory cell transistors MT whose threshold voltages are included in the "E" state are turned ON, and memory cell transistors MT whose threshold voltages are included in a threshold voltage distribution of the "F" state or higher are turned OFF. As a result, the memory system 3 may determine that the memory cell transistor MT to be programmed to the "S15" state has not yet reached the threshold voltage corresponding to the state S15 of the "F" state.

A read voltage to be used in each read operation is set between adjacent threshold voltage distributions. In the first embodiment, in order to simplify the description, for example, the voltages V1, V2, V3, V4, V5, V6, V7, V8, V9, VA, VB, VC, VD, VE, and VF used in the verify operation are used as read voltages. Read operations using the voltages V1, V2, V3, V4, V5, V6, V7, V8, V9, VA, VB, VC, VD, VE, and VF are denoted by read operations 1R, 2R, 3R, 4R, 5R, 6R, 7R, 8R, 9R, AR, BR, CR, DR, ER, and FR, respectively. In the read operation 1R, the memory system 3 determines whether the threshold voltage of the memory cell transistor is included in the "0" state, or in the "1" state or higher. In the other read operations 2R to FR as well, as in the read operation 1R, the memory system 3 determines the threshold voltage of a level corresponding to each read operation.

In the other read operations 2R to FR as well, as in the read operation 1R, the memory system 3 determines the threshold voltage of a level corresponding to each read operation. For example, in the read operation 2R, the memory system 3 determines whether the threshold voltage is included in the "1" state or in the "2" state or higher. In the read operation FR, the memory system 3 determines whether the threshold voltage is included in the "E" state or in the "F" state.

Also, a voltage VREAD is set as a voltage value higher than the maximum threshold voltage (VF) of the highest threshold voltage distribution (for example, the "F" state). For example, the voltage VREAD is a voltage to be supplied to non-selected word lines USEL-WL during the read operation. The voltage VREAD may be a voltage to be supplied to a selected word line SEL-WL, a select gate line SGD, or a select gate line SGS. A memory cell transistor MT having a gate electrode to which the voltage VREAD is applied is turned ON regardless of data stored therein.

When data assigned to the different states as described above is read, lower page data is determined by the read operations 5R, BR, and ER. Middle page data is determined by the read operations 4R, 6R, 9R, and FR. Upper page data is determined by the read operations 2R, 8R, AR, and CR. Top page data is determined by the read operations 1R, 3R, 7R, and DR. That is, data pieces of the lower page, the middle page, the upper page, and the top page are determined by carrying out the read operations three times, four times, four times, and four times, respectively. The above-described data assignment is called, for example, "4-4-4-3 code", "4-4-4-3 coding" or the like. Due to the data assigned as described above, adjacent states are grey codes that differ by only 1 bit.

1-2. Operation Example 1-2-1. Overview of Write Operation and Read Operation

Figure 15:
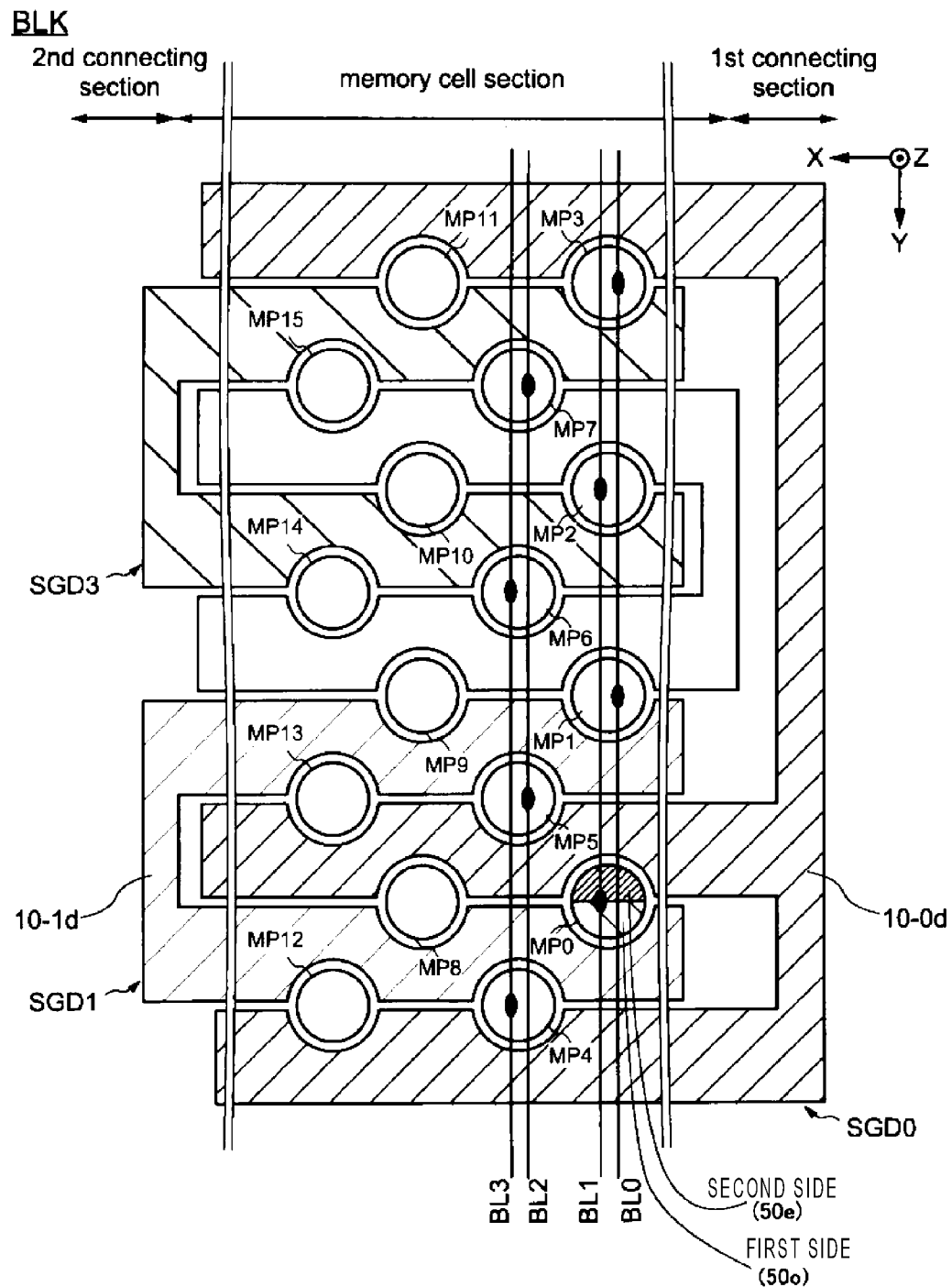
FIG. 15 is a view illustrating the mode in which the select gate line is selected or not selected in the semiconductor memory device according to the first embodiment.

Descriptions will be made with reference to FIG. 15, of a mode in which the select gate line SGD is selected or not selected during the write operation and the read operation of the semiconductor memory device 1, the select gate line SGD is selected or not selected. FIG. 15 is a view illustrating the mode in which the select gate line SGD is selected in the planar layout illustrated in FIG. 3. For example, when a predetermined voltage (for example, a voltage VREAD) is supplied to the wiring layer 10-1d, the select gate line SGD1 is selected, and eight select transistors STo1 provided on the memory pillars MP0, MP1, MP4, MP5, MP8, MP9, MP12, and MP13, respectively, are turned ON. Here, when a predetermined voltage (for example, a voltage VSS) is supplied to the wiring layer 10-0d, wiring layer 10-2d, and wiring layer 10-3d, eight select transistors STe1 provided on the memory pillars MP0, MP1, MP4, MP5, MP8, MP9, MP12, and MP13, respectively, are turned OFF.

Figure 16:
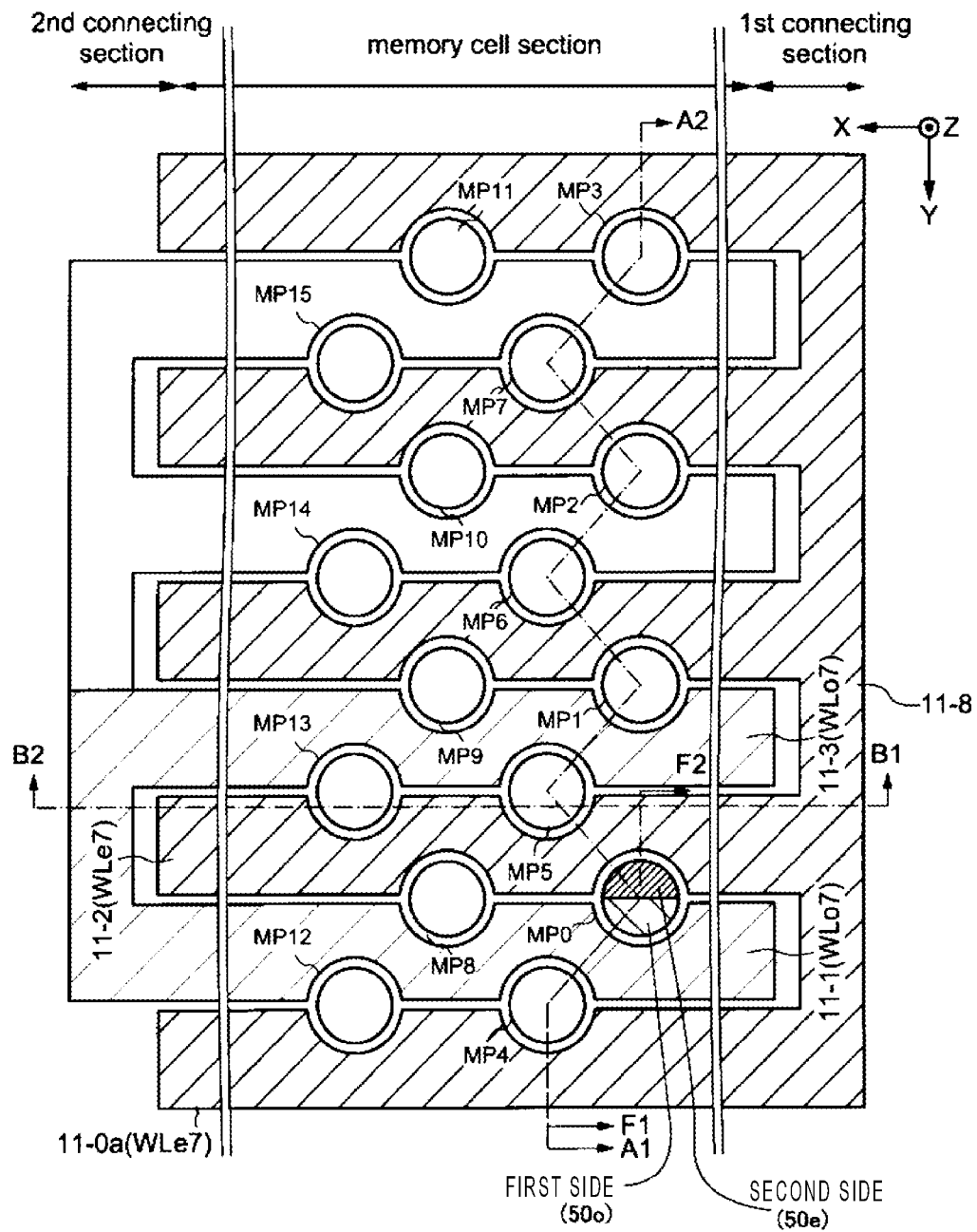
FIG. 16 is a view illustrating the mode in which the word line is selected or not selected in the semiconductor memory device according to the first embodiment.
Figure 17:
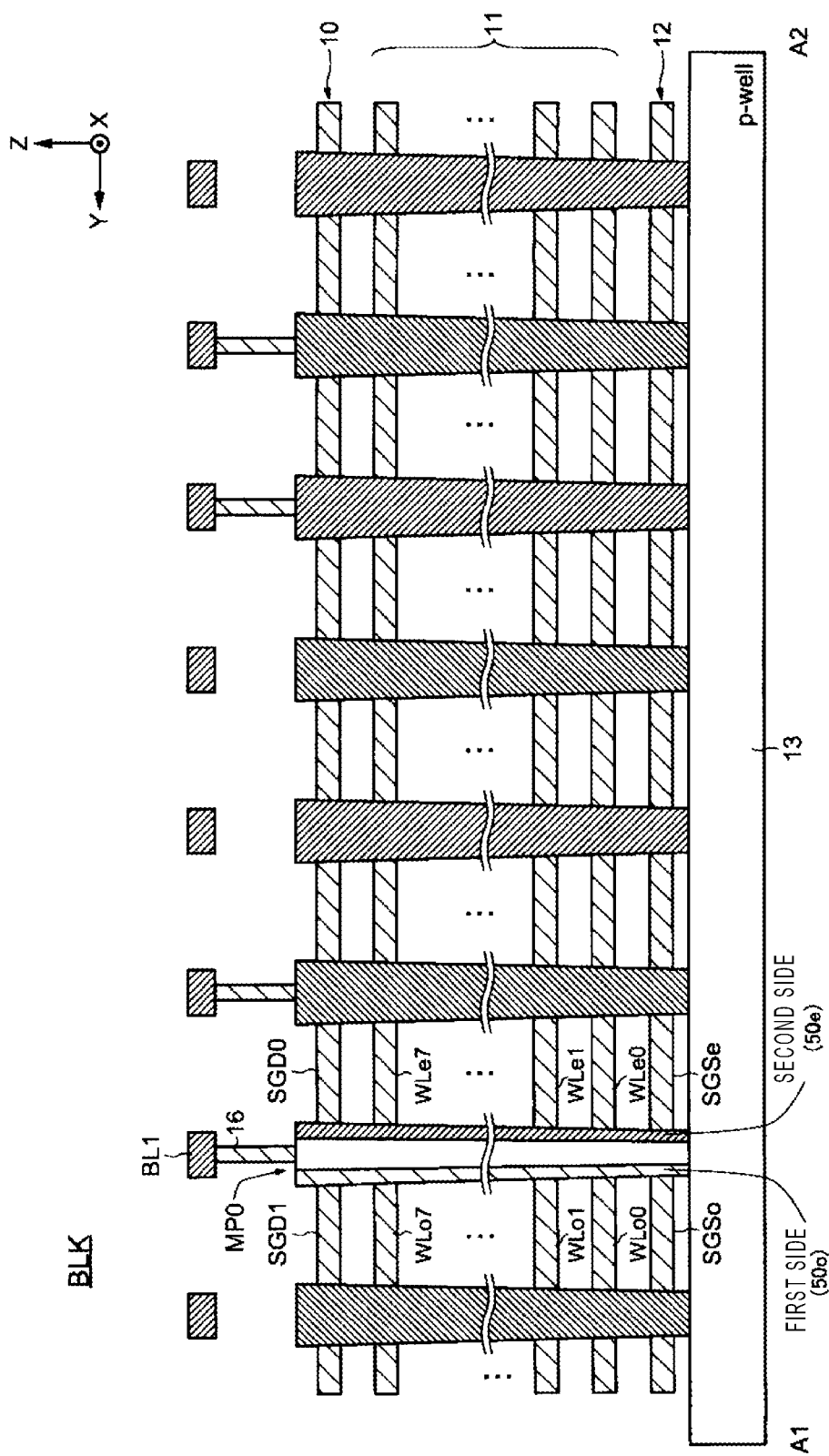
FIG. 17 is a view of a cross-section cut along A1-A2 in the semiconductor memory device illustrated in FIG. 16, and is a view illustrating the mode in which the select gate line and the word line are selected or not selected.
Figure 18:
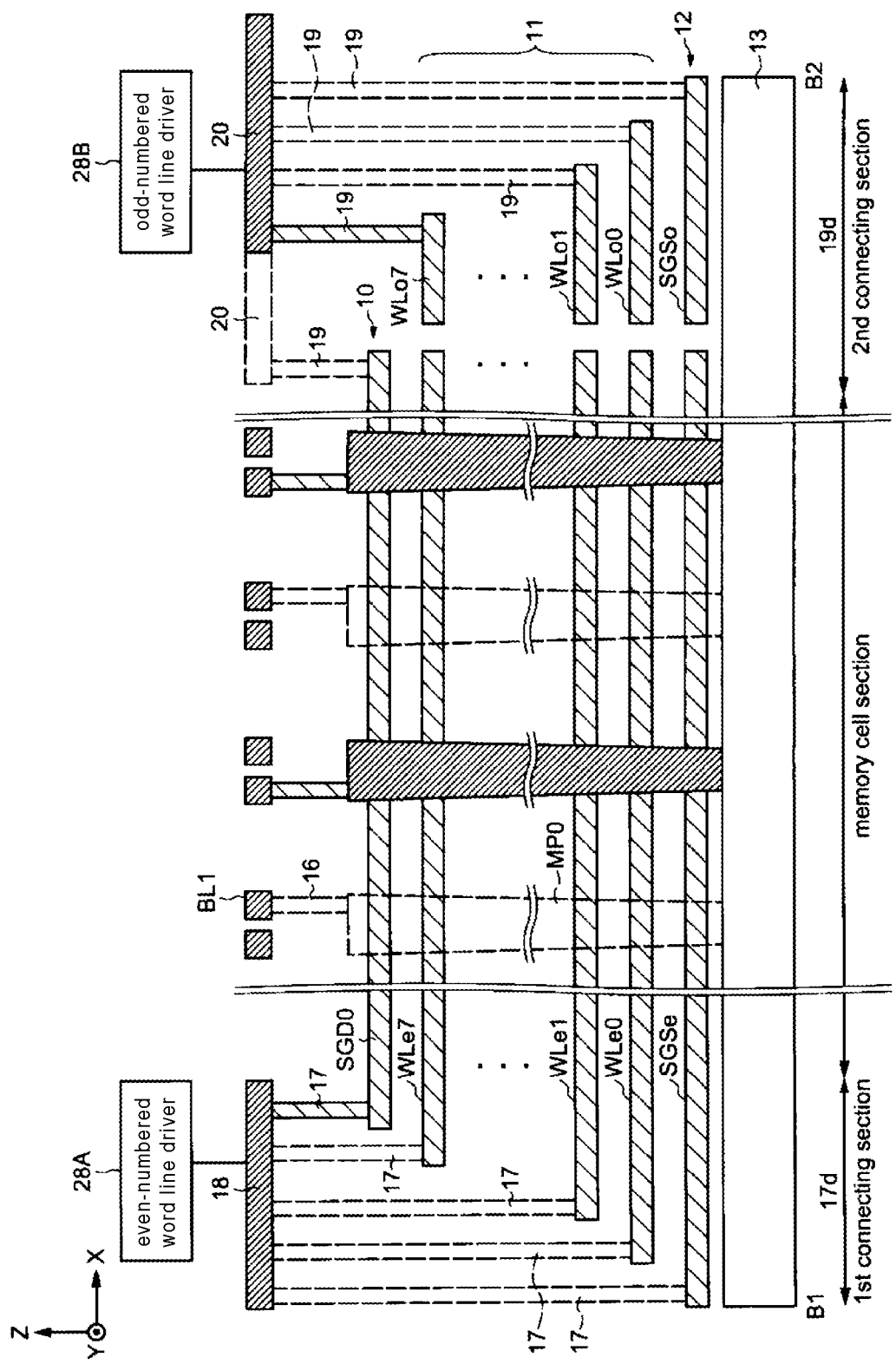
FIG. 18 is a view of a cross-section cut along B1-B2 in the semiconductor memory device illustrated in FIG. 16, and is a view illustrating the mode in which the select gate line and the word line are selected or not selected.

Next, descriptions will be made with reference to FIG. 16 to FIG. 18 of a mode in which the word line WL is selected or not selected. FIG. 16 is a view illustrating the mode in which the word line WL is selected or not selected in the planar layout illustrated in FIG. 4, and FIG. 17 and FIG. 18 are views illustrating a mode in which the select gate line and the word line are selected or not selected in the cross-sectional view of the end portion illustrated in FIG. 16.

For example, when a predetermined voltage is supplied to the wiring layer 11 including the wiring layers 11-1 and 11-3, the odd-numbered word lines WLo (WLo0 to WLo7) provided on the memory pillars MP0, MP1, MP4, MP5, MP8, MP9, MP12, and MP13, respectively, are turned ON or OFF according to the supplied voltage. Here, when a predetermined voltage is supplied to the wiring layer 11 including the wiring layer 11-0a, the wiring layer 11-2, and the wiring layer 11-4, the even-numbered word lines WLe (WLe0 to WLe7) provided on the memory pillars MP0, MP1, MP4, MP5, MP8, MP9, MP12, and MP13, respectively, are turned ON or OFF according to the supplied voltage.

As a result, memory cell transistors MT belonging to the memory pillars corresponding to the select gate line SGD1 are selected in the block BLK. The memory group MG is formed by the memory cell transistors MT selected by each select gate line. Also, one page is formed by the memory cell transistors MT corresponding to the selected word line WL in the memory group MG. Therefore, the block BLK includes memory groups MG corresponding to the number of select gate lines SGD, and each memory group MG includes pages corresponding to the number of layers of the word lines WL. An operation in the case where a wiring layer other than the wiring layer is selected is the same as above, and descriptions thereof are omitted here.

1-2-1-1. Example of Write Operation

Figure 19:
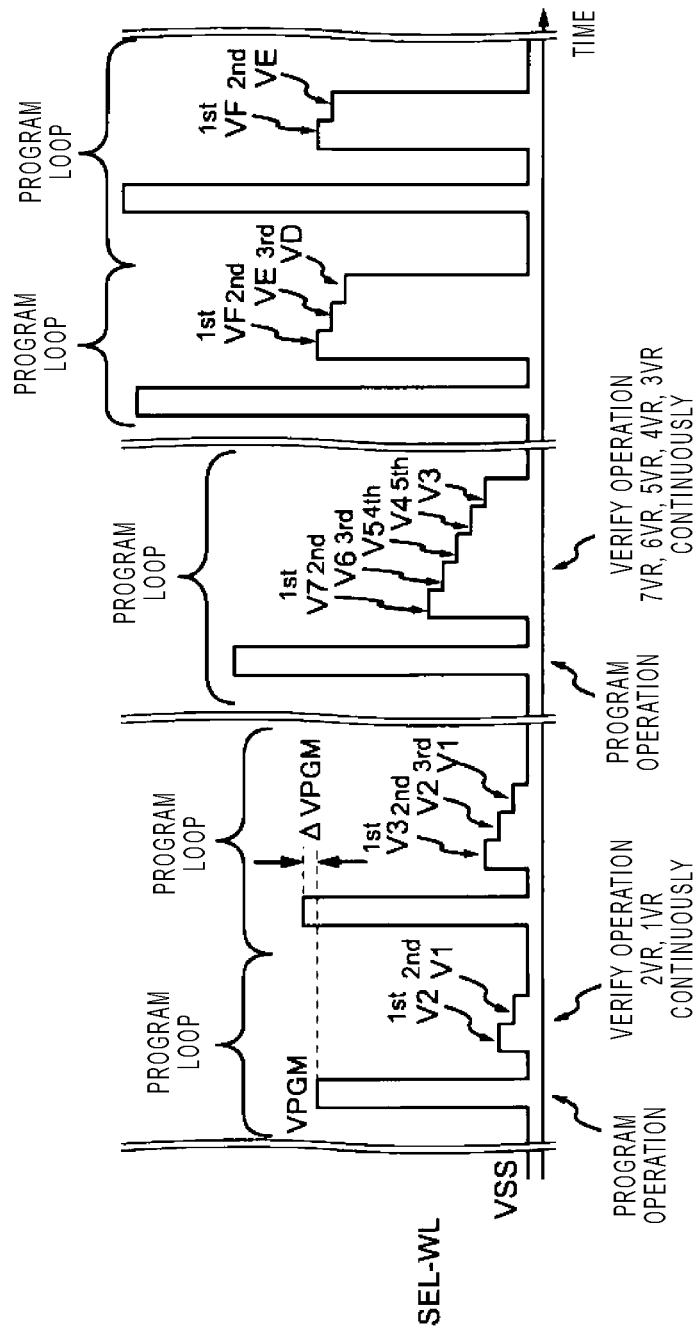
FIG. 19 is a view illustrating an example of program loops in the semiconductor memory device according to the first embodiment.

Next, a program loop included in the write operation will be described with reference to FIG. 19 or FIG. 20. FIG. 19 and FIG. 20 are views illustrating an example of a program loop in the semiconductor memory device 1. For example, as illustrated in FIG. 19, the semiconductor memory device 1 executes a plurality of program loops (for example, X times, where X is an integer of 1 or more) in the write operation. Each program loop includes at least one program operation, and one or more verify operations (for example, Y times, where Y is an integer of 1 or more) executed after the program operation. In the write operation, the program loop including the program operation and the verify operation is executed a plurality of times. In each program loop, the verify operation may be omitted in some cases.

In the program operation, electrons are injected into the charge storage layer of a memory cell transistor MT as a write target, and the threshold voltage of the memory cell transistor MT rises. Meanwhile, injection of electrons into the charge storage layer of a memory cell transistor MT that is not a write target is inhibited, and the threshold voltage of the memory cell transistor MT is maintained. In the program operation, for example, a voltage VPGM is supplied to a selected word line SEL-WL. Accordingly, a plurality of memory cell transistors MT connected to the selected word line SEL-WL is selected. In each of the memory cell transistors MT, the threshold voltage rises or the threshold voltage is maintained on the basis of the voltage supplied to the bit line BL. A voltage VPGM n a certain program loop of the program operation is a voltage obtained by adding a voltage AVPGM to a voltage VPRG used in a previous program loop of the program operation. That is, the voltage VPGM in the first program loop is set as the lowest voltage value, and then as the second program loop, the third program loop, . . . progress, the voltage VPGM is gradually set as larger voltage values.

The verify operation is an operation executed after the program operation, and is an operation of performing reading by using a predetermined voltage and thus confirming whether the threshold voltage of a selected memory cell transistor MT reaches a target level. The memory cell transistor MT whose threshold voltage reaches a target level is considered to have passed the verify operation, and then, becomes a non-write target and injection of electrons into the charge storage layer is inhibited.

Here, an example of the order of sense operations corresponding to verify operations will be described with reference to FIG. 19 or FIG. 20. For example, in the program loop illustrated in FIG. 20, an example in which a combination of a program operation and a verify operation is repeated 37 times is illustrated. A white circle mark (○) in FIG. 20 indicates a loop during which a sense operation may be performed in a verify operation. For example, for a memory cell transistor MT set in the state S2, there is a possibility that program operations are performed while a voltage VPGM is gradually increased from the first loop up to a maximum of the eleventh loop. Verify operations are performed only in loops indicated by the white circles, and in verify operations in the same program loop, sense operations in the different verify operations are continuously executed.

For example, as illustrated in FIG. 19 or FIG. 20 (when the number of times of the program loop is three (X=3)), when the number of verify operations in the same program loop is two (different verify operations 2VR and 1VR), the order of sense operations is as follows: the first is the sense operation of the verify operation 2VR (for verification of the threshold voltage of the state S2), and the second is the sense operation of the verify operation 1VR (for verification of the threshold voltage of the state S1).

Similarly, for example, as illustrated in FIG. 19 or FIG. 20 (when the number of times of the program loop is four (X=4)), when the number of verify operations in the same program loop is three (different verify operations 3VR, 2VR, and 1VR), the order of sense operations is as follows: the first is the sense operation of the verify operation 3VR (for verification of the threshold voltage of the state S3), the second is the sense operation of the verify operation 2VR (for verification of the threshold voltage of the state S2), and the third is the sense operation of the verify operation 1VR (for verification of the threshold voltage of the state S1).

Similarly, for example, as illustrated in FIG. 19 or FIG. 20 (when the number of times of the program loop is twelve (X=12)), when the number of verify operations in the same program loop is five (different verify operations 7VR, 6VR, 5VR, 4VR, and 3VR), the order of sense operations is as follows: the first is the sense operation of the verify operation 7VR (for verification of the threshold voltage of the state S7), the second is the sense operation of the verify operation 6VR (for verification of the threshold voltage of the state S6), the third is the sense operation of the verify operation 5VR (for verification of the threshold voltage of the state S5), the fourth is the sense operation of the verify operation 4VR (for verification of the threshold voltage of the state S4), and the fifth is the sense operation of the verify operation 3VR (for verification of the threshold voltage of the state S3).

As in the verify operation 2VR or the verify operation 1VR, in the verify operation, the order of the sense operation differs between different program loops. For example, in the verify operation in the program loop illustrated in FIG. 19 and FIG. 20 (when the number of times of the program loop is three (X=3)), the order of the sense operation of the verify operation 1VR (for verification of the threshold voltage of the state S1) is second, but in the verify operation in the following program loop, the order of the sense operation of the verify operation 1VR is third. In the verify operation in the program loop illustrated in FIG. 19 and FIG. 20 (when the number of times of the program loop is four (X=4)), the order of the sense operation of the verify operation 3VR (for verification of the threshold voltage of the state S3) is first, but in the verify operation in the program loop illustrated in FIG. 19 and FIG. 20 (when the number of times of the program loop is twelve (X=12)), the order of the sense operation of the verify operation 3VR is fifth. As in the verify operations 1VR and 3VR, in the verify operations 2VR, and 4VR to EVR, the order of the sense operation differs between different program loops in some cases. For example, whether the threshold voltage of the selected memory cell transistor MT reaches a target level may be confirmed by executing the sense operation of the verify operation FVR once as in the state S15 of the highest level in some cases (when the number of times of the program loop illustrated in FIG. 20 is thirty-six (X=36) or thirty-seven (X=37)), or may be confirmed by executing the sense operation 2 to 6 times for states other than the state S15 in some cases. The order of the sense operation in each of the verify operations 1VR to EVR may be any of the first to the sixth (FIG. 20).

For example, in the verify operation 2VR, the voltage V2 is supplied to the selected word line SEL-WL, and then the memory cell transistor MT connected to the selected word line SEL-WL is selected, and it is determined whether the threshold voltage of the selected memory cell transistor MT has reached the voltage V2 (whether the threshold voltage is in the "2" state). That is, it is determined whether the selected memory cell transistor transitioned into the state S2. In the verify operation 7VR, the voltage V7 is supplied to the selected word line SEL-WL, and then the memory cell transistor MT connected to the selected word line SEL-WL is selected, and it is determined whether the threshold voltage of the selected memory cell transistor MT has reached the voltage V7 (whether the threshold voltage is in the "7" state). That is, it is determined whether the selected memory cell transistor transitioned into the state S7.

In the semiconductor memory device 1, by repeatedly executing the program loop including the program operation and the verify operation, the threshold voltage of the selected memory cell transistor MT rises to a target level. More specifically, in the semiconductor memory device 1, when the threshold voltage of the selected memory cell transistor MT does not reach the target level (for example, the voltage VA), the selected memory cell transistor MT is considered not to have passed the verify operation. Then, the semiconductor memory device 1 gradually increases the level of the program voltage each loop by a predetermined amount until the threshold voltage of the selected memory cell transistor MT reaches the target level, and considers that the selected memory cell transistor MT to have passed the verify operation when the threshold voltage of the selected memory cell transistor MT reaches the target level. After that, the selected memory cell transistor MT is excluded from a program operation target. Accordingly, the threshold voltage of each of the memory cell transistors MT as write operation targets rises to a corresponding target level. When the sense operation of the same verify level is executed for different program loops, the order of the sense operation of the same verify level may differ in some cases. Here, in the sense operation of the same verify level, the predetermined voltage levels also may differ.

1-2-1-2. Example of Read Operation

Figure 22:
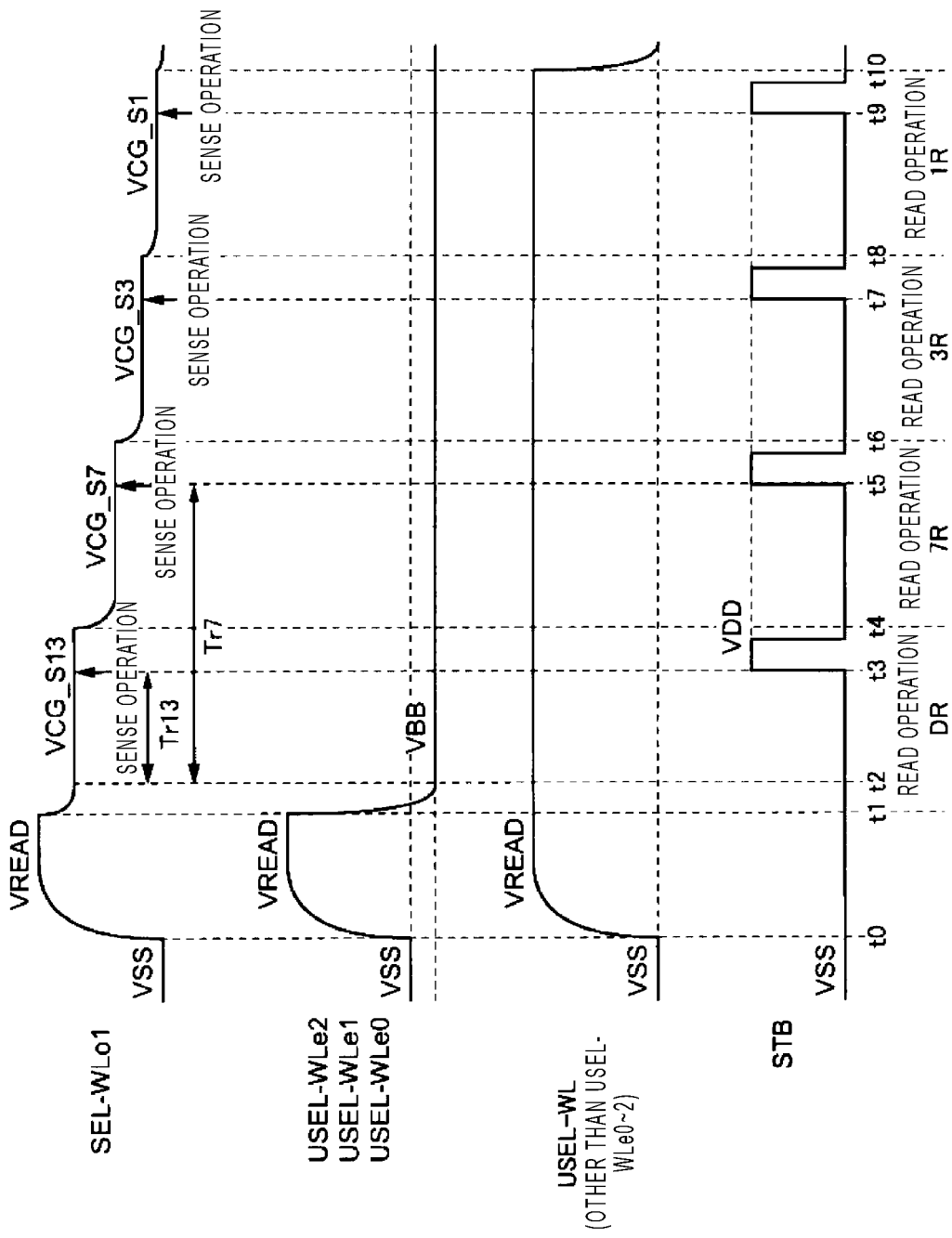
FIG. 22 is a view illustrating reading of a top page during the read operation of the semiconductor memory device according to the first embodiment.

Next, a read operation of the semiconductor memory device 1 will be described with reference to FIG. 21 and FIG. 22. FIG. 21 is a view illustrating an example of the order of the sense operations corresponding to the read operation of the semiconductor memory device 1. FIG. 22 is a view illustrating reading of a top page during the read operation of the semiconductor memory device 1. In FIG. 22, a selected odd-numbered word line WLo1, a non-selected even-numbered word line WLe1 facing the selected odd-numbered word line WLo1, a non-selected even-numbered word line WLe0, a non-selected even-numbered word line WLe2 and a control signal STB are illustrated, and select gate lines SGD and SGS, a source line and the like are omitted. In the semiconductor memory device 1, the read operation is executed after the write operation. The order of the sense operations in the semiconductor memory device 1 during the read operation is called a read order.

As illustrated in FIG. 21, read operations DR, 7R, 3R, and 1R are carried out in this order to determine the data of the top page. That is, the read order to determine the data of the top page is as follows: the first is the sense operation of the read operation DR (to determine the threshold voltages of the target memory cell transistors with respect to the state S13), the second is the sense operation of the read operation 7R (to determine the threshold voltages of the target memory cell transistors with respect to the state S7), the third is the sense operation of the read operation 3R (to determine the threshold voltages of the target memory cell transistors with respect to the state S3), and the fourth is the sense operation of the read operation 1R (to determine the threshold voltages of the target memory cell transistors with respect to the state S1). The read order for the upper page is as follows: the first is the sense operation of the read operation CR (to determine the threshold voltages of the target memory cell transistors with respect to the state S12), the second is the sense operation of the read operation AR (to determine the threshold voltages of the target memory cell transistors with respect to the state S10), the third is the sense operation of the read operation 8R (to determine the threshold voltages of the target memory cell transistors with respect to the state S8), and the fourth is the sense operation of the read operation 2R (to determine the threshold voltages of the target memory cell transistors with respect to the state S2). The read order for the middle page is as follows: the first is the sense operation of the read operation FR (to determine the threshold voltages of the target memory cell transistors with respect to the state S15), the second is the sense operation of the read operation 9R (to determine the threshold voltages of the target memory cell transistors with respect to the state S9), the third is the sense operation of the read operation 6R (to determine the threshold voltages of the target memory cell transistors with respect to the state S6), and the fourth is the sense operation of the read operation 4R (to determine the threshold voltages of the target memory cell transistors with respect to the state S4). The read order of the lower page is as follows: the first is the sense operation of the read operation ER (to determine the threshold voltages of the target memory cell transistors with respect to the state S14), the second is the sense operation of the read operation BR (to determine the threshold voltages of the target memory cell transistors with respect to the state S11), and the third is the sense operation of the read operation 5R (to determine the threshold voltages of the target memory cell transistors with respect to the state S5).

As illustrated in FIG. 22, in the read operation of the top page, until time t0, a voltage VSS is supplied to the selected odd-numbered word line SEL-WLo1, and the non-selected even-numbered word lines USEL-WLe0 to 2. Each memory cell transistor MT is turned OFF. Until time t3, the voltage VSS is supplied to the control signal STB. In the first embodiment, the voltage VSS is, for example, a voltage by which another voltage may be defined with reference to the voltage VSS. The voltage VSS may be referred to as a reference voltage, or may be 0V or grounded.

From time t0 to time t1, a voltage VREAD is supplied to the selected odd-numbered word line SEL-WLo1, and the non-selected even-numbered word lines USEL-WLe0 to 2.

Next, from time t1 to time t4, the read operation DR is executed. A voltage VCG_S13 is supplied to the selected odd-numbered word line SEL-WLo1. The voltage VCG_S13 is, for example, the voltage VD. A voltage VBB is supplied to the non-selected even-numbered word lines USEL-WLe0 to 2. From time t3 to time t4, the control signal STB is asserted, so that the voltage of the control signal STB is changed from the "H" level (VDD) to the "L" level (VSS).

Accordingly, the threshold voltage of the selected memory cell transistors with respect to the state 13 may be determined.

The voltage VBB is a voltage lower than the voltage VSS, and is a negative voltage. The non-selected even-numbered word line USEL-WLe1 faces the selected odd-numbered word line SEL-WLo1. The non-selected even-numbered word line USEL-WLe0 and the non-selected even-numbered word line USEL-WLe2 are adjacent to the non-selected even-numbered word line USEL-WLe1. By supplying the voltage VBB (negative voltage) to the even-numbered word lines USEL-WLe0 to 2, the memory cell transistors MTe0 to 2 (MTe0, MTe1, and MTe2) connected to the even-numbered word lines USEL-WLe0 to 2 may be sufficiently turned OFF. As a result, in the memory cell transistor MTo1 connected to the selected odd-numbered word line SEL-WLo1, the current flowing through the memory cell transistors MTe0 to 2 may be reduced, and thus it is possible to reduce a threshold voltage fluctuation amount in the threshold voltage of the memory cell transistor MTo1, to thereby reduce erroneous reading. From time t4 to time t10, to the non-selected even-numbered word lines USEL-WLe0 to 2 to which the voltage VREAD was supplied, the voltage VBB is supplied.

The non-selected even-numbered word line USEL-WLe to which the voltage VBB is supplied is not limited to the non-selected even-numbered word lines USEL-WLe0 to 2. For example, the voltage VBB may be supplied to the non-selected even-numbered word lines USEL-WLe0 to 4 (WLe0, WLe1, WLe2, WLe3, and WLe4), or the voltage VBB may be supplied to the non-selected even-numbered word lines USEL-WLe0 to 7 (WLe0, WLe1, WLe2, WLe3, WLe4, WLe5, WLe6, and WLe7). The voltage VBB only has to be supplied to the non-selected even-numbered word lines USEL-WLe to prevent the threshold voltage of the memory cell transistor MTo1 from fluctuating.

Next, from time t4 to time t6, the read operation 7R is executed. A voltage VCG_S7 is supplied to the selected odd-numbered word line SEL-WLo1. The voltage VCG_S7 is, for example, the voltage V7. From time t5 to time t6, the control signal STB is asserted, so that the threshold voltage of the selected memory cell transistors with respect to the state S7 may be determined as in the state S13.

Next, from time t6 to time t8, the read operation 3R is executed. A voltage VCG_S3 is supplied to the selected odd-numbered word line SEL-WLo1. The voltage VCG_S3 is, for example, the voltage V3. From time t7 to time t8, the control signal STB is asserted, so that the threshold voltage of the selected memory cell transistors with respect to the state S3 may be determined as in the state S13.

Next, from time t8 to time t10, the read operation 1R is executed. A voltage VCG_S1 is supplied to the selected odd-numbered word line SEL-WLo1. The voltage VCG_S1 is, for example, the voltage V1. From time t9 to time t10, the control signal STB is asserted, so that the threshold voltage of the selected memory cell transistors with respect to the state S1 may be determined as in the state S13.

As described above, the read operation of the top page is completed. However, during the read operation, for example, the time Tr13 until the sense operation of the read operation DR (time t3) after the voltage VBB is supplied to the memory cell transistor MTe1 facing the selected memory cell transistor MTo1 (from time t2) is different from the time Tr7 until the sense operation of the read operation 7R (time t5) after the voltage VBB is supplied to the memory cell transistor MTe1 facing the selected memory cell transistor MTo1 (from the time t2). The time Tr13 is shorter than the time Tr7.

1-2-2. Example of Inter-Cell Interference Effect

Figure 23:
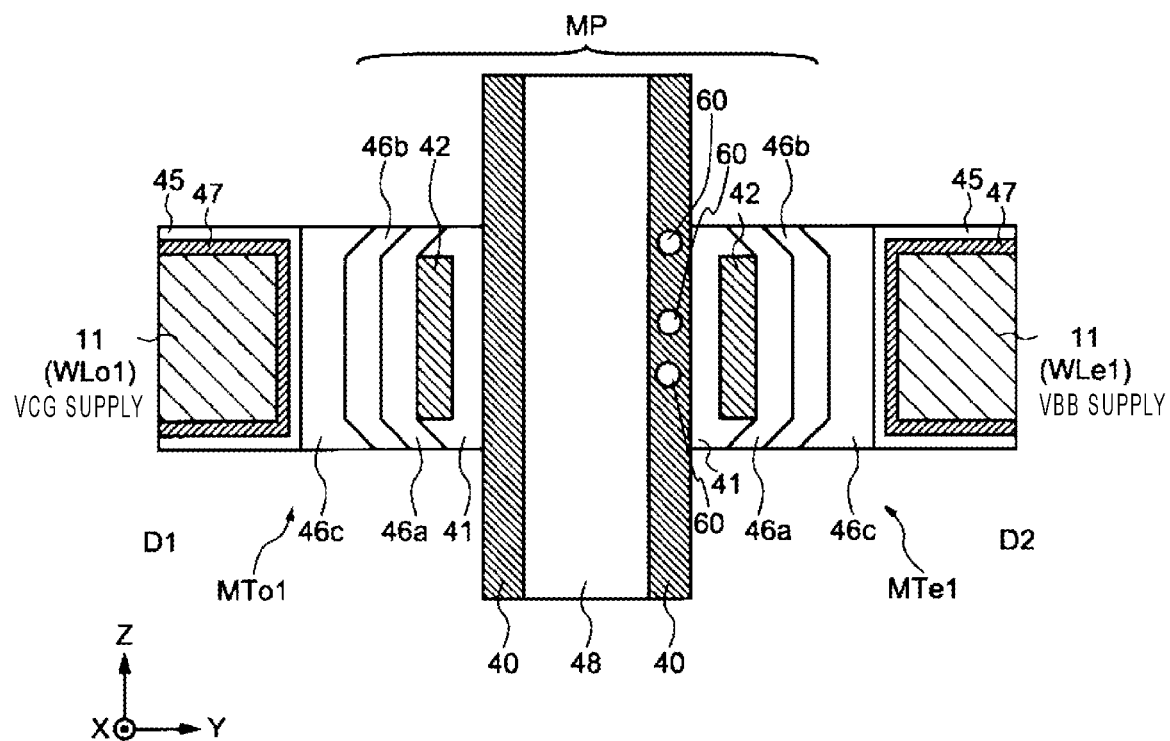
FIG. 23 is a view illustrating an operation related to an inter-cell interference effect in the semiconductor memory device according to the first embodiment.
Figure 24:
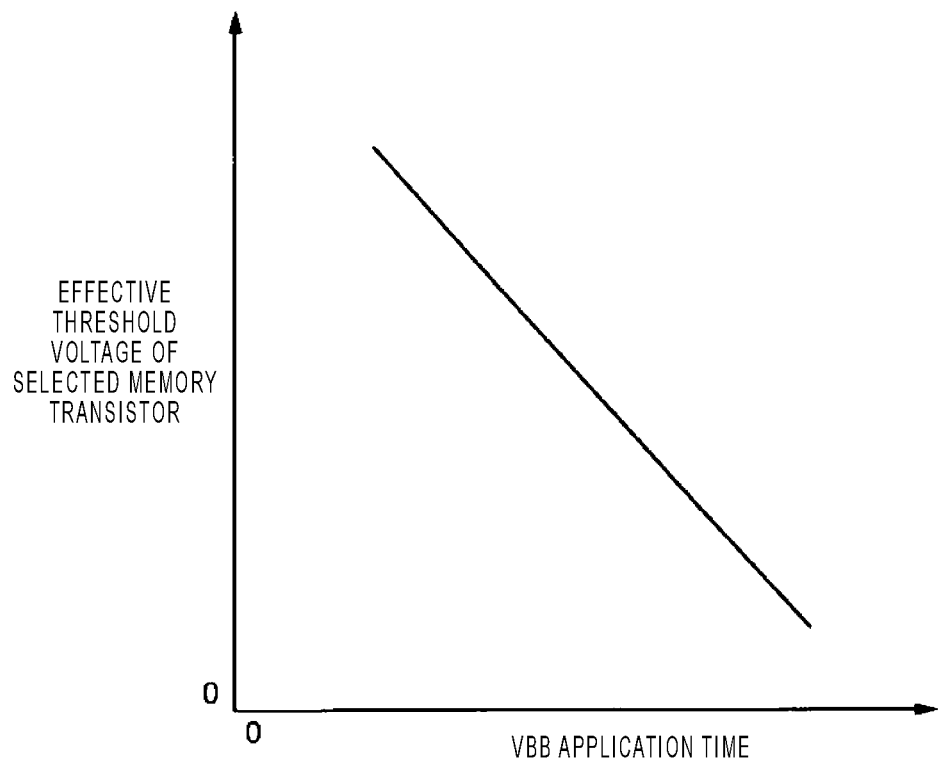
FIG. 24 is a view illustrating a dependence of the inter-cell interference effect on voltage application time in the semiconductor memory device according to the first embodiment.

Here, an example of an operation related to the inter-cell interference effect in the semiconductor memory device 1 will be described with reference to FIG. 8, FIG. 23 and FIG. 24. FIG. 23 is a view illustrating an example in which a voltage is supplied to the word line illustrated in FIG. 9 and holes are excited. FIG. 24 is a schematic view illustrating the relationship between the time during which the voltage VBB is applied to the word line (VBB application time) and the effective threshold voltage of the selected memory cell transistor. In the description of the operation related to the inter-cell interference effect in the semiconductor memory device 1, descriptions of the configuration which is the same or similar to those of FIG. 1 to FIG. 22 may be omitted. FIG. 24 schematically illustrates the relationship between the voltage VBB application time and the effective threshold voltage of the selected memory cell transistor, and illustrates an example in which the effective threshold voltage of the selected memory cell transistor is linearly changed with respect to the voltage VBB application time. However, the effective threshold voltage of the selected memory cell transistor may be non-linearly changed with respect to the voltage VBB application time.

In the semiconductor memory device 1, for example, as illustrated in FIG. 8, two word lines WL are disposed to face each other via the memory pillar MP. Thus, the conductive layer 42 (FIG. 23) disposed in the memory cell transistor (for example, the memory cell transistor MTo) corresponding to one word line (for example, the word line WLo) faces the conductive layer 42 (FIG. 23) disposed in the memory cell transistor (for example, the memory cell transistor MTe) corresponding to the other word line (for example, the word line WLe). That is, the two memory cell transistors (for example, the memory cell transistors MTo and MTe) are disposed to face each other.

In this case, the threshold voltage of the selected memory cell transistor (for example, the memory cell transistor MTo1) may be changed due to the inter-cell interference effect given by the opposite memory cell transistor (for example, the memory cell transistor MTe1). Meanwhile, as illustrated in FIG. 23, when the voltage VCG is supplied to the selected memory cell transistor (the memory cell transistor MTo1), and the voltage VBB is supplied to the opposite memory cell transistor (the memory cell transistor MTe1), holes 60 are induced.

When the holes 60 are induced in the opposite memory cell transistor MTe1, the holes 60 function as a shield. Thus, the inter-cell interference effect affecting the selected memory cell transistor MTo1 is reduced, and the effective threshold voltage of the selected memory cell transistor MTo1 is reduced. As the time during which the voltage VBB is supplied to the opposite memory cell transistor (for example, the memory cell transistor MTe1) is increased, the holes 60 are easily induced. Therefore, as time goes by, the inter-cell interference effect is reduced, and the effective threshold voltage of the selected memory cell transistor (for example, the memory cell transistor MTo1) is gradually reduced.

That is, in the semiconductor memory device 1, as illustrated in FIG. 24, as the time during which the voltage VBB is supplied to the opposite memory cell transistor is increased, the effective threshold voltage of the selected memory cell transistor may be reduced. That is, when the time during which the voltage VBB is supplied is short, in the read operation or the verify operation, the voltage to be applied to the selected word line (for example, WLo1) is increased, and when the time during which the voltage VBB is supplied is long, in the read operation or the verify operation, the voltage to be applied to the selected word line (for example, WLo1) is decreased. For example, as described above, the sense operation of the read operation 7R is less affected by the inter-cell interference effect as compared to the sense operation of the read operation DR.

Meanwhile, in each state, even when the order of the sense operation in the verify operation is different from the read order, the time during which the voltage VBB is supplied is different. Therefore, in each state, when the order of the sense operation in the verify operation is different from the read order, the threshold voltage of the selected memory cell transistor may differ due to the different inter-cell interference effect given by the opposite memory cell transistor.

Although the details will be described below, in the semiconductor memory device 1, in each state, depending on the order of the sense operation in the verify operation in the program loop, and the read order, a wait period or a reset operation is inserted in a period during which the verify operation is executed such that the VBB application time of the verify operation in the program loop becomes the same as the VBB application time of the sense operation during the read operation. As a result, in the semiconductor memory device 1, between the verify operation in the program loop and the read operation for each state, the inter-cell interference effect given by the opposite memory cell transistor to the selected memory cell transistor may be the same. Therefore, between the verify operation in the program loop and the read operation for each state, the effective threshold voltage of the selected memory cell transistor may be the same. As a result, between the verify operation in the program loop and the read operation of the semiconductor memory device 1, since a change of the threshold voltage of the selected memory cell transistor (threshold voltage fluctuation amount) may be the same, erroneous reading may be reduced.

1-2-3. Example of Verify Operation

In the following description of the first embodiment, descriptions will be made with reference to FIG. 25 to FIG. 29, on an example where sense operations in five verify operations (different verify operations 7VR, 6VR, 5VR, 4VR and 3VR) are continuously executed, which corresponds to the $12^{th}$ program loop described with reference to FIG. 19 or FIG. 20.

Various signals and current paths during the verify operation in the semiconductor memory device 1 will be described with reference to FIG. 25. In the example of the verify operation in the semiconductor memory device 1, descriptions will be made for an example where the verify operation is executed in the memory pillar MP0. A predetermined voltage VM (for example, a voltage VCG_S7) is supplied to the odd-numbered word line WLo1 disposed in the NAND string 50o of the memory pillar MP0, and the memory cell transistor MTo1 connected to the odd-numbered word line WLo1 is selected. When the memory cell transistor MTo1 is selected, the select gate lines SGD1 and SGSo are selected, and the odd-numbered word lines WLo0, 2 to 7 (WLo0, WLo2, WLo3, WLo4, WLo5, WLo6, and WLo7) other than the odd-numbered word line SEL-WLo1 are not selected (non-selected). When the memory cell transistor MTo1 is selected, the select gate lines SGD0 and SGSe, and the even-numbered word lines WLe0 to 2 (WLo0, WLo1, WLo2) disposed in the NAND string 50e are not selected (non-selected), and the even-numbered word lines WLo3 to 7 (WLo3, WLo4, WLo5, WLo6, and WLo7) other than the even-numbered word lines WLe0 to 2 are not selected (non-selected). In this way, current flows through the path indicated by the thick-line arrow in FIG. 25. Then, it is determined whether current flows through the path indicated by the dashed-line arrow on the basis of the voltage VM applied to the selected word line SEL-WLo1 and the threshold voltage of the selected memory cell transistor MTo1. Specifically, it is determined whether current flows from the bit line BL1 to the source line SL.

In the following description, in the NAND strings 50o and 50e, a word line WL connected to a selected memory cell transistor MT which is a verify operation target is called a selected word line SEL-WL, and word lines connected to other memory cell transistors MT are called non-selected word lines USEL-WL. A select gate line electrically connected to the selected word line SEL-WL is called a selected select gate line SEL-SGD or SEL-SGS, and other select gate lines are each called a non-selected select gate line USEL-SGD or USEL-SGS. "Odd numbers" may be added to various signal lines provided in the NAND string 50o, and "even numbers" may be added to various signal lines provided in the NAND string 50e in some cases. For example, the selected select gate line provided in the NAND string 50o is called a selected odd-numbered select gate line SEL-SGDo or SEL-SGSo, and the selected word line is called a selected odd-numbered word line SEL-WLo0 to 7 (for example, SEL-WLo1). As in the NAND string 50o, the non-selected select gate line provided in the NAND string 50e is called a non-selected odd-numbered select gate line USEL-SGDe or USEL-SGSe, and the non-selected word lines are called non-selected even-numbered word lines USEL-WLe1 to 7 (for example, USEL-WLe1).

The predetermined voltage VM is, for example, the voltage VCG_S13, the voltage VCG_S7, the voltage VCG_S3, or the voltage VCG_S1. The predetermined voltage VM may be a voltage VCG_S15 supplied to the selected word line SEL-WL in the read operation or the verify operation for the state S15, or may be a voltage VCG_S14 supplied to the selected word line SEL-WL in the read operation or the verify operation for the state S14. As in the read operation or the verify operation for the state S15 or the state S14, the predetermined voltage VM may be voltages VCG_S12 to VCG_S8 supplied to the selected word line SEL-WL for the states S12 to S8, may be voltages VCG_S6 to VCG_S4 supplied to the selected word line SEL-WL for the states S6 to S4, or may be voltages VCG_S2 to VCG_S1 supplied to the selected word line SEL-WL for the states S2 to S1. The predetermined voltage VM is lower than the voltage VREAD.

1-2-3-1. About Wait Period and Reset Period

Here, by using FIG. 27, descriptions will be made for internal signals generated in the sequencer 24 (for example, a state S7 select signal S7SEL, a state S6 select signal S6SEL, a state S5 select signal S5SEL, a state S4 select signal S4SEL, and a state S3 select signal S3SEL illustrated in FIG. 27), the verify level, the read order, the count value of the counter circuit 24A (FIG. 1), the wait period, and the reset period.

For example, the sequencer 24 includes a storage device. The storage device provided in the sequencer 24 stores a table illustrated in FIG. 14, in which each state is associated with a voltage in a read operation or a verify operation, a table illustrated in FIG. 21, in which each verify level is associated with a read order, and a table illustrated in FIG. 20, in which the number of times of the program loop is associated with each verify level.

Figure 27:
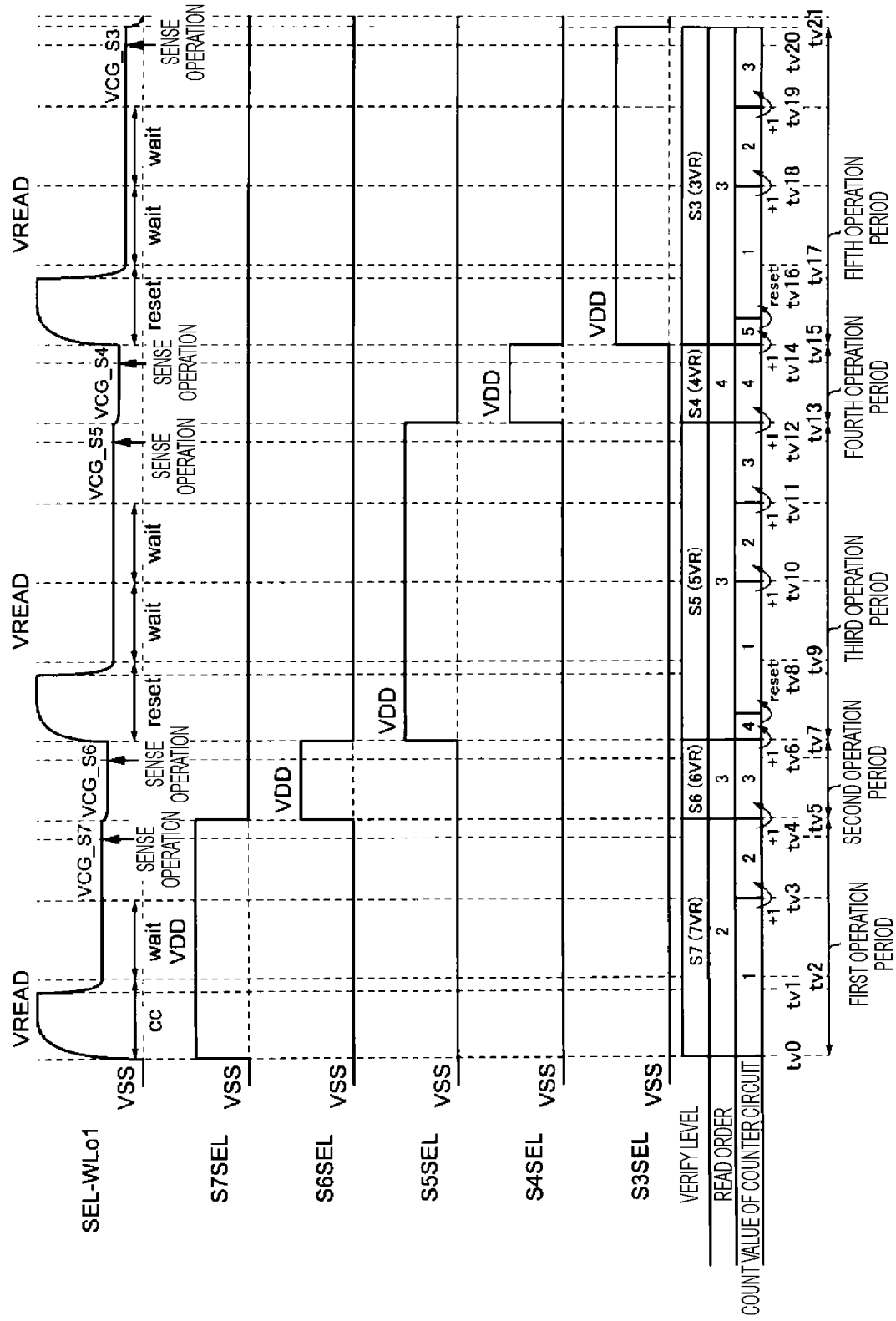
FIG. 27 is a view illustrating timing charts of various signals during the verify operation in the semiconductor memory device according to the first embodiment.

The sequencer 24 uses the counter circuit 24A (FIG. 1) to count the count value of the counter circuit 24A illustrated in FIG. 27, for each program loop. Specifically, the sequencer 24 counts the count value of the counter circuit 24A whenever a predetermined time required for each verify operation passes. The sequencer 24 recognizes the state started at that point in time and the order of the verify operation by using the internal signals generated in the sequencer 24, and the table illustrated in FIG. 21. Further, the sequencer 24 recognizes the verify level started at that point in time and the read order by using the internal signals, and then compares the read order to the count value of the counter circuit 24A and generates a comparison result. In the initial state of the counter circuit 24A, the count value of the counter circuit 24A is set as 1.

Although the details will be described below, the semiconductor memory device 1 compares the read order to the count value of the counter circuit 24A, and generates a comparison result. In the comparison result, when the read order is larger than the count value of the counter circuit 24A (CASE2 in FIG. 30), wait periods corresponding to the number of times obtained by multiplying a preset wait period by a difference of α between the read order and the count value of the counter circuit 24A are inserted (added) before a period during which the sense operation is executed. Further, the count value of the counter circuit 24A becomes 1+α through addition of the difference of α.

Although the details will be described below, in the semiconductor memory device 1, in the comparison result, when the read order is smaller than the count value of the counter circuit 24A (CASE3 in FIG. 30), a reset period is inserted in the verify operation period. Further, 1 is added to the count value of the counter circuit 24A.

Further, although the details will be described below, the semiconductor memory device 1 compares the read order to the count value of the counter circuit 24A, and executes a corresponding verify operation when the read order is the same as the count value of the counter circuit 24A (CASE1 in FIG. 30). Further, 1 is added to the count value of the counter circuit 24A.

1-2-3-2. Example of Verify Operation Until Time tv0

Figure 26:
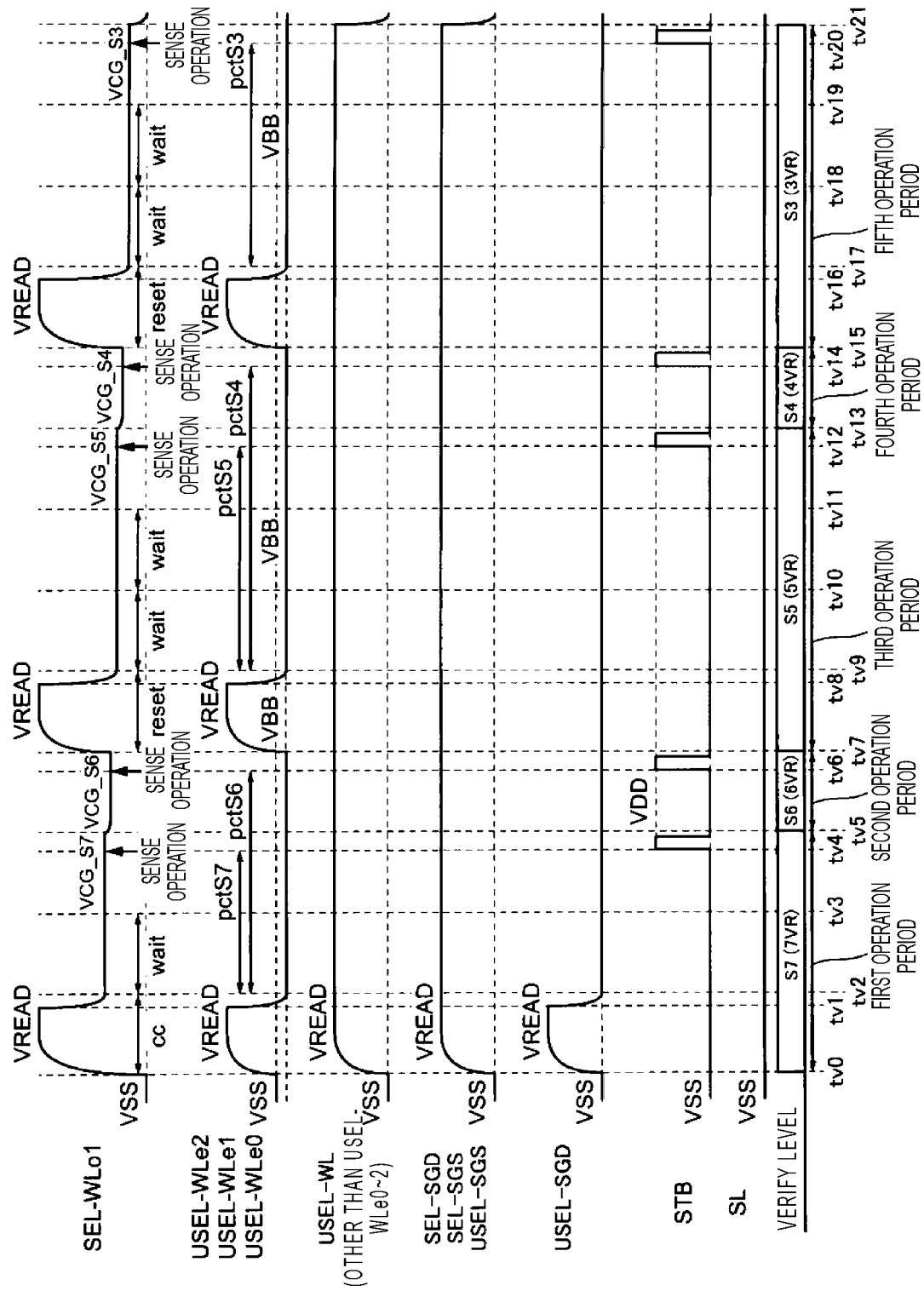
FIG. 26 is a view illustrating timing charts of various signals during the verify operation in the semiconductor memory device according to the first embodiment.

An example in which a verify operation is executed until time tv0 will be described with reference to FIG. 26 and FIG. 27. FIG. 26 and FIG. 27 are views illustrating timing charts of various signals during the verify operation of the semiconductor memory device 1.

As illustrated in FIG. 26 or FIG. 27, the verify operation until time tv0 is, for example, an operation in which the state of the semiconductor memory device 1 is placed in a standby state. The standby state is, for example, a state of waiting while determining whether to execute the verify operation. Until time tv0, a voltage VSS is supplied to the selected select gate lines SEL-SGD and SGS (the select gate lines SGD1 and SGSo), the non-selected select gate USEL-SGS (the select gate line SGSe), the non-selected select gate USEL-SGD (the select gate line SGD0), the selected odd-numbered word line SEL-WLo1, the non-selected even-numbered word lines WLe0 to 2 (WLe0, WLe1, and WLe2), non-selected word lines USEL-WL other than the non-selected even-numbered word lines WLe0 to 2, the control signal STB, and the source line SL. Until time tv4, the voltage VSS is supplied to the control signal STB. Until at least time tv21, the voltage VSS is supplied to the source line SL. Each of select transistors ST1 and ST2, and each memory cell transistor MT are turned OFF until tv0.

1-2-3-3. Example of Verify Operation in First Operation Period (from Time Tv0 to Time Tv2)

Figure 28:
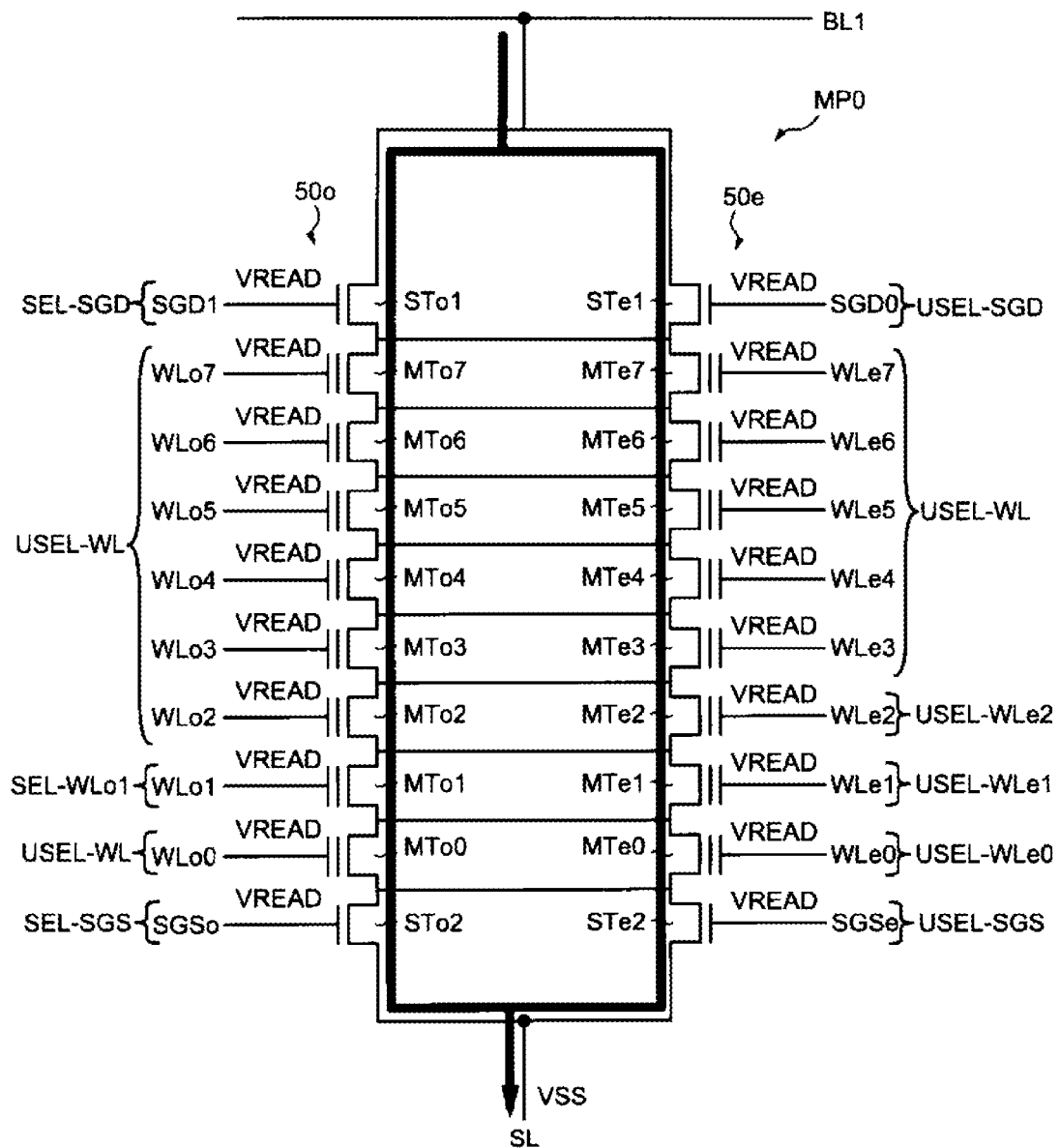
FIG. 28 is an example of a circuit diagram illustrating various signals and current paths in a first operation period illustrated in FIG. 26.

An example in which the verify operation in a first operation period is executed will be described with reference to FIG. 25 to FIG. 28. In the example illustrated in the semiconductor memory device 1, the first operation period is a period during which the sense operation of the verify level 7 (S7, verify operation 7VR) is executed. FIG. 28 is an example of a circuit diagram illustrating various signals and current paths during the period indicated by time tv0 and time tv1 illustrated in FIG. 26.

First, an operation of the semiconductor memory device 1 from time tv0 to time tv2 will be described. As illustrated in FIG. 26 or FIG. 27, for example, during this period, a voltage VREAD is supplied to the selected odd-numbered word line SEL-WLo1. In the verify operation of the semiconductor memory device 1, the operation that is executed first (the operation from time tv0 to time tv2) is an operation of supplying the same voltage (voltage VREAD in the semiconductor memory device 1) to channels in common, and is called, for example, a channel clean (CC) operation, or a channel clean (CC) operation period.

As illustrated in FIG. 26, the voltage VREAD is supplied to the selected select gate lines SEL-SGD and SGS, the non-selected select gate USEL-SGS, the non-selected select gate USEL-SGD, the selected odd-numbered word line SEL-WLo1, the non-selected even-numbered word lines WLe0 to 2, and non-selected word lines USEL-WL other than the non-selected even-numbered word lines WLe0 to 2. Each of the select transistors ST1 and ST2, and each memory cell transistor MT are turned ON.

As illustrated in FIG. 27, VDD is supplied to a state S7 select signal S7SEL, and VSS is supplied to a state S6 select signal S6SEL, a state S5 select signal S5SEL, a state S4 select signal S4SEL, and a state S3 select signal S3SEL. To the state S7 select signal S7SEL, the voltage VSS is supplied after time tv5.

Therefore, current flows through the path (from the bit line BL1 to the source line SL) indicated by the thick-line arrow in FIG. 28, so that, for example, the same voltage VSS is supplied from the bit line BL1 to channels of each of the select transistors ST1 and ST2, and each memory cell transistor MT in common.

Here, as illustrated in FIG. 27, the read order of the verify level 7 is second. The sequencer 24 compares the read order (second), to the count value (1) of the counter circuit 24A, and generates a difference of 1 which is a comparison result. In the comparison result, since the read order is larger than the count value of the counter circuit 24A (corresponding to CASE2 in FIG. 30), a wait period corresponding to the number of times obtained by multiplying a preset wait period by the difference of 1, is inserted (added) before the verify operation is executed.

That is, as illustrated in FIG. 26 and FIG. 27, in the first operation period, a wait period is inserted once between time tv2 and time tv3 before the period during which the sense operation of the verify level 7 is executed (time tv3 to time tv4).

As illustrated in FIG. 26, at least from time tv2 to time tv21, the voltage VREAD is supplied to non-selected word lines USEL-WL other than the non-selected even-numbered word lines WLe0 to 2, the selected select gate lines SEL-SGD and SGS, and the non-selected select gate USEL-SGS, and the voltage VSS is supplied to the non-selected select gate USEL-SGD.

1-2-3-4. Example of Verify Operation in First Operation Period (from Time Tv2 to Time Tv5)

As illustrated in FIG. 26 and FIG. 27, the period from time tv2 to time tv5 includes the wait period and the period during which the sense operation of the verify level 7 is executed.

As illustrated in FIG. 26, from time tv2 to time tv5, a voltage VBB is supplied to the non-selected even-numbered word lines USEL-WLe0 to 2 to which the voltage VREAD was supplied, and the voltage VSS is supplied to the non-selected select gate USEL-SGD to which the voltage VREAD was supplied.

As illustrated in FIG. 27, from time tv2 to time tv5, VDD is supplied to the state S7 select signal S7SEL, and VSS is supplied to the state S6 select signal S6SEL, the state S5 select signal S5SEL, the state S4 select signal S4SEL, and the state S3 select signal S3SEL.

The period from time tv2 to time tv3 is the wait period. In the wait period, a voltage VCG_S7, which is supplied at the verify level 7, is supplied to the selected odd-numbered word line SEL-WLo1.

Next, at time tv3, the count value of the counter circuit 24A becomes 2 (1+1) through addition of the difference of 1. The sequencer 24 compares the read order (second), to the count value (2) of the counter circuit 24A, and generates a difference of 0 (the same) which is a comparison result.

Since the comparison result is the same (corresponding to CASE1 in FIG. 30), from time tv3 to tv5, the sense operation of the verify level 7 is executed. Specifically, from time tv3 to tv5, the voltage VCG_S7 is supplied to the selected odd-numbered word line SEL-WLo1. From time tv2 to tv5, the control signal STB is asserted (the control signal STB is changed from "L" level (voltage VSS) to "H" level (voltage VDD)), and thus the semiconductor memory device 1 may determine the threshold voltage of the selected memory cell transistors with respect to the state S7.

Figure 25:
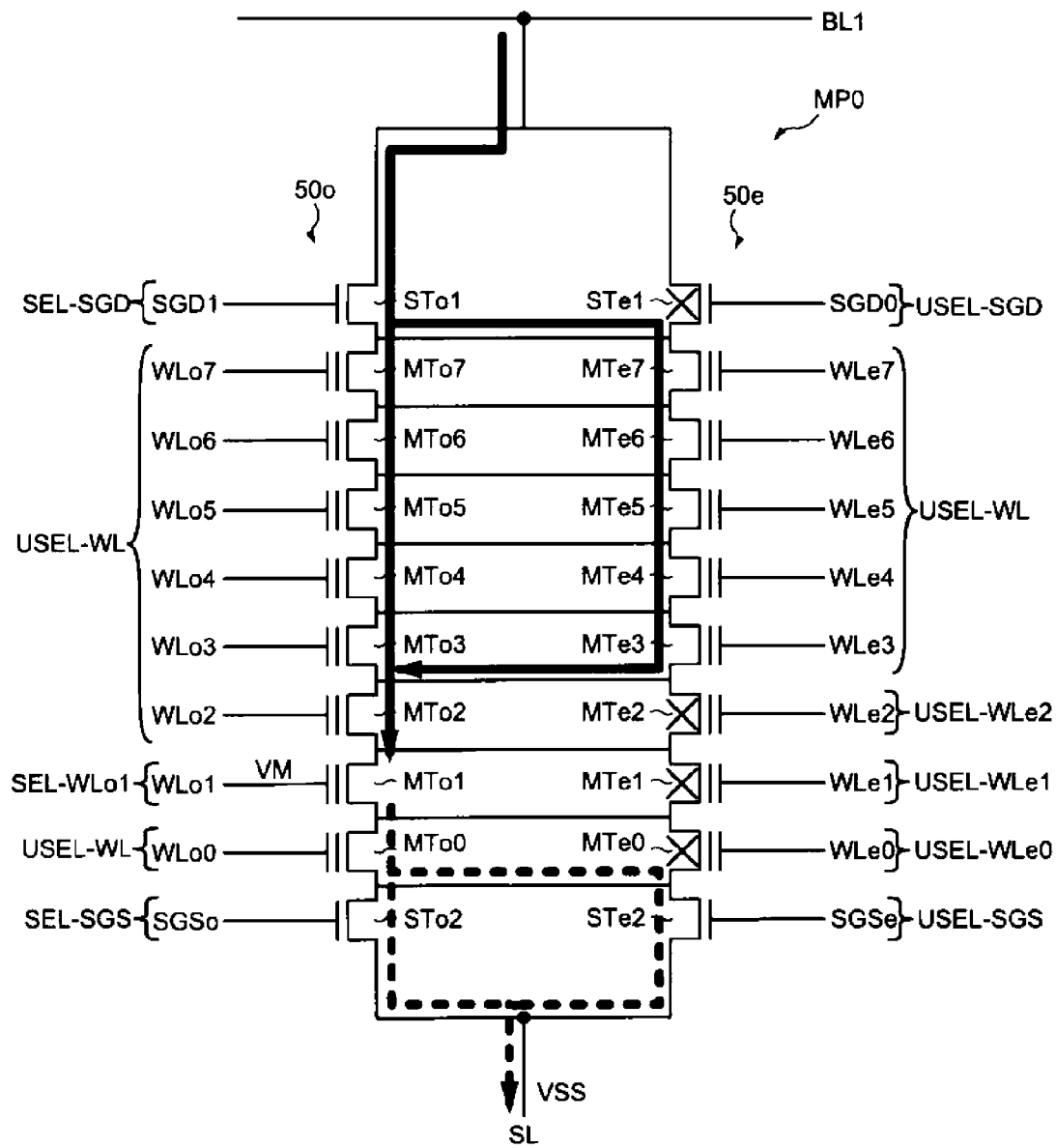
FIG. 25 is an example of a circuit diagram illustrating various signals and current paths during a verify operation of the semiconductor memory device according to the first embodiment.

As illustrated in FIG. 25, the select transistors STo1 and STo2, the memory cell transistor MTo0, the memory cell transistors MTo2 to 7 (MTo2, MTo3, MTo4, MTo5, MTo6, and MTo7), the memory cell transistors MTe3 to 7 (MTe3, MTe4, MTe5, MTe6, and MTe7), and the select transistor STe2 are turned ON, and the memory cell transistors MTe0 to 2 are turned OFF. Thus, from the bit line BL1, to the selected memory cell transistor MTo0, current flows through the path indicated by the thick-line arrow in FIG. 25. A predetermined voltage VM supplied to the selected odd-numbered word line SEL-WLo1 is the voltage VCG_S7, and current flows through the path indicated by the thick-line arrow in FIG. 25 according to the threshold voltage of the selected odd-numbered word line SEL-WLo1. As a result, the semiconductor memory device 1 may determine the threshold voltage of the selected memory cell transistor with respect to the state S7.

Figure 29:
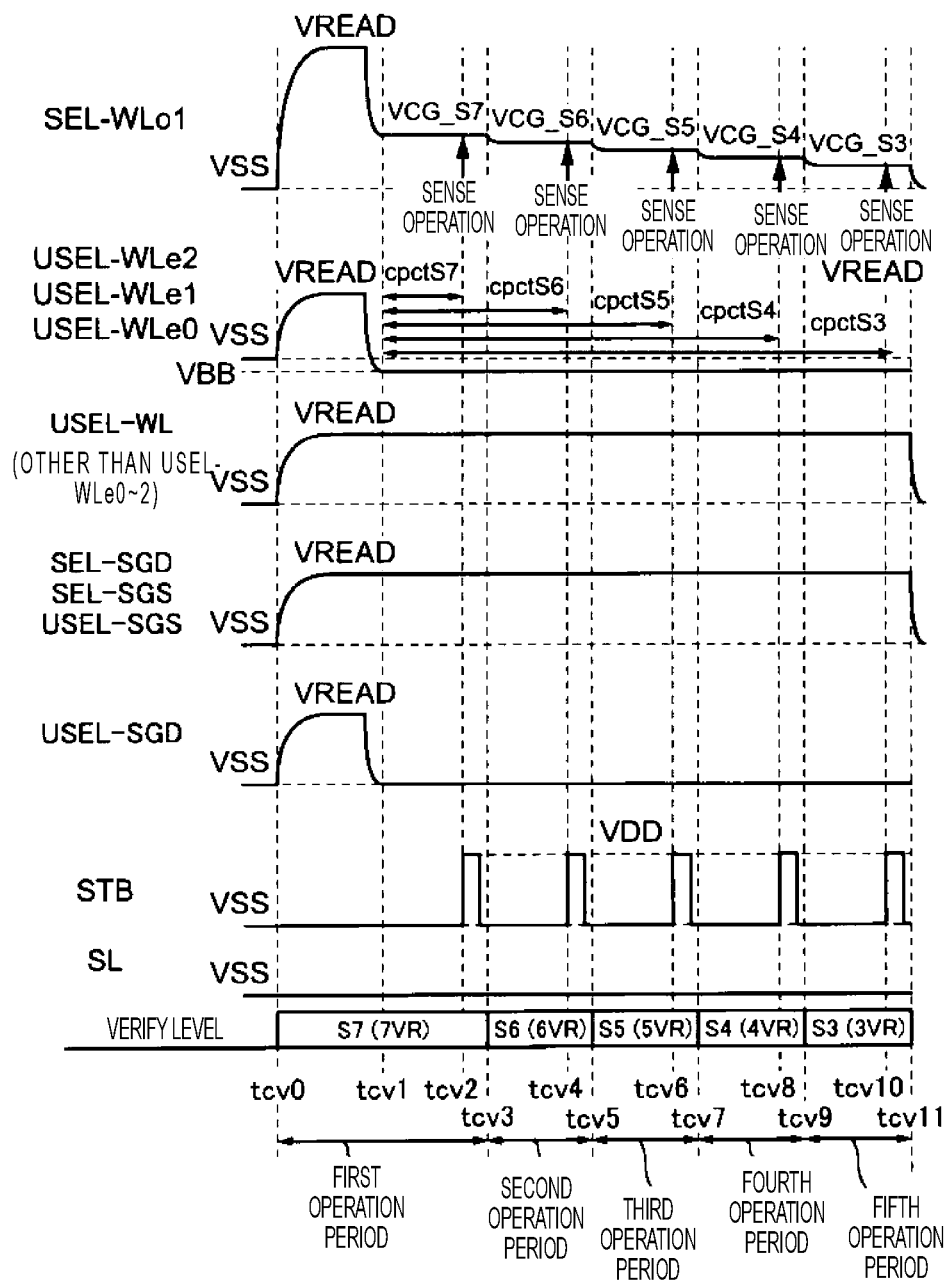
FIG. 29 is a view illustrating timing charts of various signals during the verify operation in a semiconductor memory device according to a comparative example.

Here, descriptions will be made for an operation of a semiconductor memory device according to a comparative example, with reference to FIG. 29. FIG. 29 is a view illustrating a timing chart of various signals during a verify operation in the semiconductor memory device according to the comparative example. In the semiconductor memory device according to the comparative example, the configuration or the like of various signals is the same as that in the semiconductor memory device 1 according to the present embodiment, and thus, descriptions thereof are omitted here.

As illustrated in FIG. 29, a first operation period (time tcv0 to time tcv3) of the comparative example includes a period during which the sense operation of the verify level 7 is executed. However, the first operation period of the comparative example does not include a wait period. Thus, in the precharge time cpctS7 (FIG. 29) according to the comparative example, the supply time of the voltage VBB to the memory cell transistor MT facing the selected memory cell transistor MT is short. Thus, the verify operation is performed in a state where the inter-cell interference effect given by the opposite memory cell transistor to the memory cell transistor MT is larger than in the reading of the cell.

Meanwhile, in a write operation of the semiconductor memory device 1, the sense operation of the verify level 7 is executed first in the $12^{th}$ program loop (FIG. 19, FIG. 20, or FIG. 26). Therefore, the count value of the counter circuit 24A is set as an initial value (1). In a read operation, the sense operation of the read operation 7R of the state S7 is second among read operations on the top page (the read order is second) (FIG. 21). In the semiconductor memory device 1, when the read order is larger than the count value of the counter circuit 24A, a wait period may be inserted in a period during which a verify operation is executed. As a result, in the semiconductor memory device 1, the time during which the voltage VBB is supplied to the memory cell transistor MT facing the selected memory cell transistor MT (precharge time) may be matched with the time during the read operation. Specifically, in the semiconductor memory device 1, the precharge time cpctS7 (FIG. 29) according to the comparative example may be adjusted to the precharge time pctS7 (FIG. 26). Therefore, the voltage VBB is supplied to the memory cell transistor MT facing the selected memory cell transistor MT, for the same time as in the read operation. Thus, the inter-cell interference effect given by the opposite memory cell transistor, to the selected memory cell transistor MT, is the same as during the read operation, and then the effective threshold voltage of the selected memory cell transistor may be the same as during the read operation. As a result, in the semiconductor memory device 1, the change of the threshold voltage of the selected memory cell transistor MT may be the same during both the verity and read operations, and thus erroneous reading is reduced. In the semiconductor memory device 1, the change of the threshold voltage is also called a threshold voltage fluctuation amount.

FIG. 26 illustrates an example in which the verify level 7 is executed first, but in a later program loop (for example, the $13^{th}$ or $16^{th}$ program loop illustrated in FIG. 20), the verify level 7 may be executed second, third or later. In the program loop in which the verify level 7 is executed second, for example, the voltage to be supplied to the selected word line during the verify operation is set as the same as the voltage to be supplied to the selected word line during the read operation. In the program loop in which the verify level 7 is executed third or later, for example, the voltage to be supplied to the selected word line during the verify operation is set to be lower than the voltage to be supplied to the selected word line during the read operation.

During the verify operation as well as the read operation, the voltage VBB is a voltage lower than the voltage VSS, and is a negative voltage. During the verify operation as well as the read operation, by supplying the voltage VBB (negative voltage) to the non-selected even-numbered word lines USEL-WLe0 to 2, the memory cell transistors MTe0 to 2 (MTe0, MTe1, and MTe2) connected to the non-selected even-numbered word lines USEL-WLe0 to 2 may be sufficiently turned OFF. As a result, in the memory cell transistor MTo1 connected to the selected odd-numbered word line SEL-WLo1, the current flowing through the memory cell transistors MTe0 to 2 may be reduced, and thus it is possible to reduce a change in the threshold voltage of the memory cell transistor MTo1, and to reduce erroneous reading.

1-2-3-5. Example of Verify Operation in Second Operation Period (from Time Tv5 to Time Tv7)

An example in which the verify operation in a second operation period is executed will be described with reference to FIG. 25 to FIG. 27. In the example illustrated in the semiconductor memory device 1, the second operation period is a period during which the sense operation of the verify level 6 (S6, verify operation 6VR) is executed. In the description of the second operation period, descriptions of the configuration which is the same or similar to those of FIG. 1 to FIG. 27 may be omitted.

As illustrated in FIG. 26, from time tv5 to time tv7, voltages, which are supplied to the signals, respectively, as described for time tv3 to time tv5 in the first operation period, are supplied to the non-selected even-numbered word lines USEL-WLe0 to 2, non-selected word lines USEL-WL other than the non-selected even-numbered word lines WLe0 to 2, the selected select gate lines SEL-SGD and SGS, and the non-selected select gate USEL-SGS, the non-selected select gate USEL-SGD and the source line SL. Each of the select transistors ST1 and ST2, and each memory cell transistor MT are turned ON.

As illustrated in FIG. 27, from time tv5 to time tv7, VDD is supplied to the state S6 select signal S6SEL, and VSS is supplied to the state S5 select signal S5SEL, the state S4 select signal S4SEL, and the state S3 select signal S3SEL. After time tv7, the voltage VSS is supplied to the state S6 select signal S6SEL.

From time tv5 to time tv7, the read order of the verify level 6 is third. The sequencer 24 compares the read order (third), to the count value (3) of the counter circuit 24A, and generates a difference of 0 (same) which is a comparison result. Since the comparison result is the same (corresponding to CASE1 in FIG. 30), the sense operation of the verify level 6 is executed. A voltage VCG_S6, which is supplied in the verify operation, is supplied to the selected odd-numbered word line SEL-WLo1. From time tv5 to time tv7, the control signal STB is asserted (the control signal STB is changed from "L" level (voltage VSS) to "H" level (voltage VDD)), and thus the semiconductor memory device 1 may determine the threshold voltage of the selected memory cell transistors with respect to the state S6.

From time tv5 to time tv7, respective states of transistors are the same as respective states of transistors from time tv3 to time tv5 in the first operation period, which are described with reference to FIG. 25. Therefore, from the bit line BL1, to the selected memory cell transistor MTo0, current flows through the path indicated by the thick-line arrow in FIG. 25. The predetermined voltage VM supplied to the selected odd-numbered word line SEL-WLo1 is the voltage VCG_S6, and current flows through the path indicated by the thick-line arrow in FIG. 25 according to the threshold voltage of the selected odd-numbered word line SEL-WLo1.

As a result, the semiconductor memory device 1 may determine the threshold voltage of the selected memory cell transistor with respect to the state S6.

In the write operation, the sense operation of the verify level 6 is executed second in the $12^{th}$ program loop (FIG. 19, FIG. 20, or FIG. 26). Immediately after the second operation period starts, the count value of the counter circuit 24A is set as 3. In the read operation, the sense operation of the read operation 6R of the state S6 is third among read operations on the middle page (the read order is third) (FIG. 21). In the semiconductor memory device 1, when the read order is the same as the count value of the counter circuit 24A, it is possible to continuously execute the verify operation without inserting a wait period and a reset period.

Specifically, the second operation period including the period during which the sense operation of the verify level 6 is executed is continuously executed after the first operation period including the wait period and the period during which the sense operation of the verify level 7 is executed. Here, like in the period during which the sense operation of the verify level 7 is executed, the voltage VBB (negative voltage) is supplied to the non-selected even-numbered word lines USEL-WLe0 to 2. Here, the precharge time related to the semiconductor memory device 1 is the precharge time pctS6 (FIG. 26). Meanwhile, in the comparative example illustrated in FIG. 29, in the second operation period (time tcv3 to time tcv5) during which the sense operation of the verify level 6 is executed, the precharge time is the precharge time cpctS6 (FIG. 29). The precharge time pctS6 (FIG. 26) related to the semiconductor memory device 1 is the same as the precharge time during the read operation. On the other hand, the precharge time cpctS6 (FIG. 29) related to the comparative example is shorter than the precharge time during the read operation. As a result, unlike in the comparative example, in each memory cell transistor MT related to the semiconductor memory device 1, the verify operation may be carried out in a state where the inter-cell interference effect equivalent to that during the read operation is given.

Therefore, in the semiconductor memory device 1, the threshold voltage fluctuation amount caused by the inter-cell interference effect given to the selected memory cell transistor MTo1 by the opposite memory cell transistor MTe1 becomes the same as during the read operation. Then, in that state, the verify operation may be performed, and erroneous reading may be reduced.

1-2-3-6. Example of Verify Operation in Third Operation Period (from Time Tv7 to Time Tv13)

An example in which the verify operation in a third operation period is executed will be described with reference to FIG. 25 to FIG. 28. In the example illustrated in the semiconductor memory device 1, the third operation period is a period during which the sense operation of the verify level 5 (S5, verify operation 5VR) is executed.

First, an operation of the semiconductor memory device 1 from time tv7 to time tv9 will be described. As illustrated in FIG. 26, from time tv7 to time tv9, the same voltages as the voltages supplied to the signals, respectively, as described for time tv0 to time tv2 in the first operation period, are supplied to the non-selected even-numbered word lines USEL-WLe0 to 2, non-selected word lines USEL-WL other than the non-selected even-numbered word lines WLe0 to 2, the selected select gate lines SEL-SGD and SGS, and the non-selected select gate USEL-SGS, the non-selected select gate USEL-SGD and the source line SL.

Each of the select transistors ST1 and ST2, and each memory cell transistor MT are turned ON.

As illustrated in FIG. 27, VDD is supplied to the state S5 select signal S5SEL, and VSS is supplied to the state S7 select signal S7SEL, the state S6 select signal S6SEL, the state S4 select signal S4SEL, and the state S3 select signal S3SEL. VDD is supplied to the state S5 select signal S5SEL until time tv13, and after time tv13, the voltage VSS is supplied.

As illustrated in FIG. 27, the read order of the verify level 5 is third. The sequencer 24 compares the read order (third) to the count value (4) of the counter circuit 24A, and generates a difference of −1 which is a comparison result. In the comparison result, since the read order is smaller than the count value of the counter circuit 24A (corresponding to CASE5 in FIG. 30), a preset reset period is inserted (added) before the sense operation of the verify operation 5VR is executed. The length of the reset period may be the same as or different from the length of the wait period.

That is, as illustrated in FIG. 26 and FIG. 27, in the third operation period, a reset period is inserted between time tv7 and time tv9 before the period during which the sense operation of the verify level 5 is executed (time tv11 to time tv13). The reset period is, for example, a period during which the voltage VREAD is supplied to the selected odd-numbered word line SEL-WLo1. In the operation during the reset period, the same voltage (voltage VREAD in the semiconductor memory device 1) is supplied to channels in common like in the operation executed first in the verify operation of the semiconductor memory device 1 (the operation from time tv0 to time tv2). Thus, in the semiconductor memory device 1, the reset period may be called, for example, a channel clean (CC) operation, or a channel clean (CC) operation period.

Therefore, as in the period from time tv0 to time tv2 in the first operation period, current flows through the path (from the bit line BL1 to the source line SL) indicated by the thick-line arrow in FIG. 28, so that, for example, the same voltage VSS is supplied from the bit line BL1 to channels of each of the select transistors ST1 and ST2, and each memory cell transistor MT in common.

When the sequencer 24 determines to insert the reset period before the sense operation of the verify level 5 is executed, the count value of the counter circuit 24A is reset. Here, the count value of the counter circuit 24A is changed from 4 to 1. As illustrated in FIG. 27, the read order of the verify level 5 is third. The sequencer 24 compares the read order (third) of the state S5 to the count value (1) of the counter circuit 24A, and generates a difference of 2 which is a comparison result. In the comparison result, since the read order is larger than the count value of the counter circuit 24A (corresponding to CASE2 in FIG. 30), wait periods corresponding to the number of times obtained by multiplying a preset wait period by the difference of 2 are inserted (added) before the verify operation is executed.

That is, as illustrated in FIG. 26 and FIG. 27, in the third operation period, two wait periods are inserted between time tv9 and time tv11 before the period during which the sense operation of the verify level 5 is executed (time tv11 to time tv13) after the reset period (time tv7 to time tv9).

1-2-3-7. Example of Verify Operation in Third Operation Period (from Time Tv9 to Time Tv13)

As illustrated in FIG. 26 and FIG. 27, the period from time tv9 to time tv13 includes the wait period and the period during which the sense operation of the verify level 5 is executed.

As illustrated in FIG. 26, from time tv9 to time tv11, the same voltages as the voltages supplied to the signals, respectively, as described for time tv2 to time tv4 in the first operation period, are supplied to the non-selected even-numbered word lines USEL-WLe0 to 2, non-selected word lines USEL-WL other than the non-selected even-numbered word lines WLe0 to 2, the selected select gate lines SEL-SGD and SGS, and the non-selected select gate USEL-SGS, the non-selected select gate USEL-SGD and the source line SL. Each of the select transistors ST1 and ST2, and each memory cell transistor MT are turned ON.

As illustrated in FIG. 27, VDD is supplied to the state S5 select signal S5SEL, and VSS is supplied to the state S7 select signal S7SEL, the state S6 select signal S6SEL, the state S4 select signal S4SEL, and the state S3 select signal S3SEL.

The period from time tv9 to time tv11 includes two wait periods. In the wait periods, a voltage VCG_S5, which is supplied in the verify operation 5VR, is supplied to the selected odd-numbered word line SEL-WLo1. Since two wait periods are inserted, the count value of the counter circuit 24A is counted up at time tv10 and time tv11. Therefore, the count value of the counter circuit 24A is changed from 1 to 3. The sequencer 24 compares the read order (third) to the count value (3) of the counter circuit 24A, and generates a difference of 0 (the same) which is a comparison result.

Since the comparison result is the same (corresponding to CASE1 in FIG. 30), from time tv11 to tv13, the sense operation of the verify level 5 is executed. Specifically, from time tv11 to tv13, the voltage VCG_S5 is supplied to the selected odd-numbered word line SEL-WLo1. From time tv12 to tv13, the control signal STB is asserted (the control signal STB is changed from "L" level (voltage VSS) to "H" level (voltage VDD)), and thus the semiconductor memory device 1 may determine the threshold voltage of the selected memory cell transistors with respect to the state S5.

From time tv11 to tv13, respective states of transistors are the same as respective states of transistors from time tv3 to time tv5 in the first operation period, which are described with reference to FIG. 25. Therefore, from the bit line BL1, to the selected memory cell transistor MTo0, current flows through the path indicated by the thick-line arrow in FIG. 25. The predetermined voltage VM supplied to the selected odd-numbered word line SEL-WLo1 is the voltage VCG_S5, and current flows through the path indicated by the thick-line arrow in FIG. 25 according to the threshold voltage of the selected odd-numbered word line SEL-WLo1. As a result, the semiconductor memory device 1 may determine the threshold voltage of the selected memory cell transistor with respect to the state S6.

In the write operation, the sense operation of the verify level 5 is executed third in the $12^{th}$ program loop (FIG. 19, FIG. 20, or FIG. 26). Immediately after the third operation period starts, the count value of the counter circuit 24A is set as 4. In the read operation, the sense operation of the read operation 5R of the state S5 is third among read operations on the lower page (the read order is third) (FIG. 21). In the semiconductor memory device 1, when the read order is smaller than the count value of the counter circuit 24A, the reset period may be inserted. As a result, in the semiconductor memory device 1, in the verify operation in the write operation, when a precharge time (a time during which the voltage VBB is supplied) longer than that in the read operation passes, the channel state of each memory cell transistor MT may be reset once. After that, as described below, by appropriately inserting the wait period such that the precharge time becomes equivalent to that during the read operation, the inter-cell interference effect may be the same between the verify operation in the write operation and the read operation.

In the third operation period, since the wait period may be inserted, the semiconductor memory device 1 exhibits the same effect as the effect described in "1-2-3-4. Example of verify operation in first operation period (from time tv2 to time tv5)", and thus erroneous reading may be reduced.

Further, in the third operation period, the reset period and the wait period may be inserted. Here, the precharge time in the third operation period related to the semiconductor memory device 1 is the precharge time pctS5 (FIG. 26). Meanwhile, in the comparative example illustrated in FIG. 29, in the third operation period (time tcv5 to time tcv7) during which the sense operation of the verify level 5 is executed, the precharge time is the precharge time cpctS5 (FIG. 29). In the comparative example, at least in the first operation period to the third operation period, different verify operations are continuously executed, and there is a difference in the precharge time between the verify operations. Thus, in each memory cell transistor MT, there is a possibility that the time (precharge time) during which the voltage VBB is supplied may not be matched with the precharge time during the read operation of the level. Meanwhile, in the semiconductor memory device 1, the precharge time pctS5 (FIG. 26) in the third operation period may eliminate the difference in the precharge time between the verify operation in the write operation of the level and the verify operation in the read operation of the level, like the precharge time pctS7 in the first operation period (FIG. 26), and the precharge time pctS6 in the second operation period (FIG. 26).

1-2-3-8. Example of Verify Operation in Fourth Operation Period (from Time Tv13 to Time Tv15)

An example in which the verify operation in a fourth operation period is executed will be described with reference to FIG. 25 to FIG. 27. In the example illustrated in the semiconductor memory device 1, the fourth operation period is a period during which the sense operation of the verify level 4 (S4, verify operation 4VR) is executed. In the description of the fourth operation period, descriptions of the configuration which is the same or similar to those of FIG. 1 to FIG. 27 may be omitted.

As illustrated in FIG. 26, from time tv13 to time tv15, voltages, which are supplied to the signals, respectively, as described for time tv3 to time tv5 in the first operation period, are supplied to the non-selected even-numbered word lines USEL-WLe0 to 2, non-selected word lines USEL-WL other than the non-selected even-numbered word lines WLe0 to 2, the selected select gate lines SEL-SGD and SGS, and the non-selected select gate USEL-SGS, the non-selected select gate USEL-SGD and the source line SL.

As illustrated in FIG. 27, from time tv13 to time tv15, VDD is supplied to the state S4 select signal S4SEL, and VSS is supplied to the state S3 select signal S3SEL. After time tv15, the voltage VSS is supplied to the state S4 select signal S4SEL.

From time tv13 to time tv15, the read order of the verify level 4 is fourth. The sequencer 24 compares the read order (fourth), to the count value (4) of the counter circuit 24A, and generates a difference of 0 (same) which is a comparison result. Since the comparison result is the same (corresponding to CASE1 in FIG. 30), the sense operation of the verify level 4 is executed. A voltage VCG_S4, which is supplied in the verify operation, is supplied to the selected odd-numbered word line SEL-WLo1. From time tv13 to time tv15, the control signal STB is asserted (the control signal STB is changed from "L" level (voltage VSS) to "H" level (voltage VDD)), and thus the semiconductor memory device 1 may determine the threshold voltage of the selected memory cell transistors with respect to the state S4.

In the write operation, the sense operation of the verify level 4 is executed fourth in the 12$^{th}$ program loop (FIG. 19, FIG. 20, or FIG. 26). In the execution period of the verify level 4, the count value of the counter circuit 24A is set as 4. In the read operation, the sense operation of the read operation 4R of the state S4 is fourth among read operations on the middle page (the read order is fourth) (FIG. 21).

As in the second operation period, in the fourth operation period, the read order is the same as the count value of the counter circuit 24A. Therefore, in the fourth operation period as well, the semiconductor memory device 1 may continuously execute the verify operation without inserting a wait period and a reset period. In the fourth operation period as well, respective states of transistors are the same as respective states of transistors from time tv3 to time tv5 in the first operation period, which are described with reference to FIG. 25. Therefore, from the bit line BL1, to the selected memory cell transistor MTo0, current flows through the path indicated by the thick-line arrow in FIG. 25. The predetermined voltage VM supplied to the selected odd-numbered word line SEL-WLo1 is the voltage VCG_S4, and current flows through the path indicated by the thick-line arrow in FIG. 25 according to the threshold voltage of the selected odd-numbered word line SEL-WLo1. As a result, the semiconductor memory device 1 may determine the threshold voltage of the selected memory cell transistor with respect to the state S4.

The precharge time in the fourth operation period related to the semiconductor memory device 1 is the precharge time pctS4 (FIG. 26). In the comparative example illustrated in FIG. 29, in the fourth operation period (time tcv7 to time tcv9) during which the sense operation of the verify level 4 is executed, the precharge time is the precharge time cpctS4 (FIG. 29). As in the contents described in "1-2-3-7. Example of verify operation in third operation period (from time tv9 to time tv13)", in the comparative example, there is a difference in the precharge time between verify operations. Thus, there is a possibility that the precharge time may not be matched with the precharge time during the read operation of the level. Meanwhile, in the semiconductor memory device 1, different verify operations are continuously executed while the precharge times in the first operation period to the fourth operation period are the same as during the read operation. Then, verification may be carried out in a state where the threshold voltage fluctuation amount caused by the inter-cell interference effect is the same as during the read operation.

1-2-3-9. Example of Verify Operation in Fifth Operation Period (from Time Tv15 to Time Tv21)

An example in which the verify operation in a fifth operation period is executed will be described with reference to FIG. 25 to FIG. 28. In the example illustrated in the semiconductor memory device 1, the fifth operation period is a period during which the sense operation of the verify level 3 (S3, verify operation 3VR) is executed.

First, an operation of the semiconductor memory device 1 from time tv15 to time tv17 will be described. As illustrated in FIG. 27, VDD is supplied to the state S3 select signal S3SEL. VDD is supplied to the state S3 select signal S3SEL until time tv21, and after time tv21, the voltage VSS is supplied.

The read order of the verify level 3 is third. The sequencer 24 compares the read order (third) to the count value (5) of the counter circuit 24A, and generates a difference of −2 which is a comparison result. In the comparison result, the read order is smaller than the count value of the counter circuit 24A (corresponding to CASE3 in FIG. 30). Thus, in the fifth operation period, a reset period is inserted between time tv15 and time tv17 before the period during which the sense operation of the verify operation 3VR is executed (time tv19 to time tv21).

When the sequencer 24 determines to insert the reset period before the sense operation of the verify level 3 is executed, the count value of the counter circuit 24A is reset. Here, the count value of the counter circuit 24A is changed from 5 to 1. As illustrated in FIG. 27, the read order of the verify level 3 is third. The sequencer 24 compares the read order (third) to the count value (1) of the counter circuit 24A, and generates a difference of 2 which is a comparison result. In the comparison result, the read order is larger than the count value of the counter circuit 24A (corresponding to CASE2 in FIG. 30). Therefore, in the fifth operation period, two wait periods are inserted between time tv17 and time tv19 before the period during which the sense operation of the verify level 3 is executed (time tv19 to time tv21) after the reset period (time tv15 to time tv17).

In the wait periods, a voltage VCG_S3, which is supplied at the verify level 3 corresponding thereto, is supplied to the selected odd-numbered word line SEL-WLo1. Since two wait periods are inserted, the count value of the counter circuit 24A is counted up at time tv18 and time tv19. As a result, the count value of the counter circuit 24A is changed from 1 to 3, and becomes the same as the read order (third). Therefore, since the comparison result is a difference of 0 (the same, corresponding to CASE1 in FIG. 30), the sense operation of the verify level 3 is executed from time tv19 to tv20. From time tv19 to time tv21, the voltage VCG_S3 is supplied to the selected odd-numbered word line SEL-WLo1. From time tv20 to tv21, the control signal STB is asserted (the control signal STB is changed from "L" level (voltage VSS) to "H" level (voltage VDD)), and thus the semiconductor memory device 1 may determine the threshold voltage of the selected memory cell transistors with respect to the state S3.

From time tv19 to tv21, respective states of transistors are the same as respective states of transistors from time tv3 to time tv5 in the first operation period, which are described with reference to FIG. 25. Therefore, from the bit line BL1, to the selected memory cell transistor MTo0, current flows through the path indicated by the thick-line arrow in FIG. 25. The predetermined voltage VM supplied to the selected odd-numbered word line SEL-WLo1 is the voltage VCG_S3, and current flows through the path indicated by the thick-line arrow in FIG. 25 according to the threshold value of the selected odd-numbered word line SEL-WLo1. As a result, the semiconductor memory device 1 may determine the threshold voltage of the selected memory cell transistor with respect to the state S3.

As in the third operation period, in the fifth operation period related to the semiconductor memory device 1, the reset period and the wait period may be inserted. Here, the precharge time in the fifth operation period related to the semiconductor memory device 1 is the precharge time pctS3 (FIG. 26). Meanwhile, in the comparative example illustrated in FIG. 29, in the fifth operation period (time tcv9 to time tcv11) during which the sense operation of the verify operation 3VR is executed, the precharge time is the precharge time cpctS3 (FIG. 29). As in the contents described in "1-2-3-7. Example of verify operation in third operation period (from time tv9 to time tv13)", in the semiconductor memory device 1, a difference in the precharge time between the verify operation in the write operation of the level and the verify operation in the read operation of the level may be eliminated unlike in the comparative example.

In addition to those described for the fifth operation period, the voltage supplied to each signal, the configuration, the function and the like are the same as the voltage supplied to each signal, the configuration, the function and the like to be described in a second embodiment. Therefore, in the fifth operation period, descriptions of the same contents as the contents described in the second embodiment are omitted.

1-2-3-10. Example of Flow of Write Operation

By using FIG. 26, FIG. 27 and FIG. 30, descriptions will be made for an example of the flow of a write operation. FIG. 30 is a view illustrating a flowchart of a verify operation in the semiconductor memory device 1. In the description of the example of the flow of the write operation, descriptions of the configuration which is the same or similar to those of FIG. 1 to FIG. 28 may be omitted.

Figure 30:
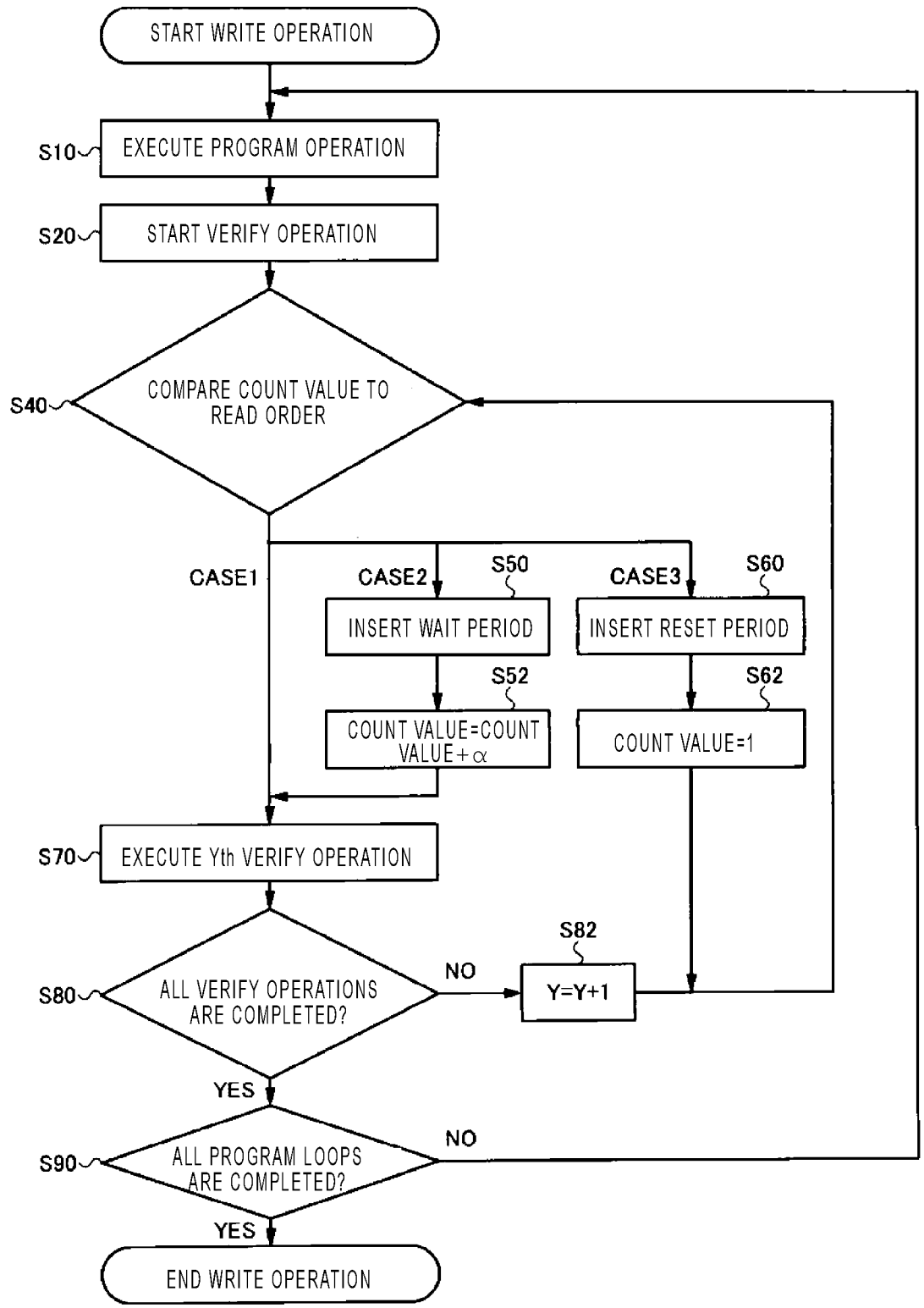
FIG. 30 is a view illustrating a flowchart of the verify operation in the semiconductor memory device according to the first embodiment.

As illustrated in FIG. 30, in the semiconductor memory device 1, when the write operation is started, in step 10 (S10), the sequencer 24 executes a program operation by controlling the sense amplifier module 70, the row decoder 29, the voltage generation circuit 27, the driver set 28 and the like.

In step 20 (S20) subsequent to step 10, the sequencer 24 starts the verify operation by controlling the sense amplifier module 70, the row decoder 29, the voltage generation circuit 27, the driver set 28 and the like. In step 20 (S20), a count value is reset and becomes 1.

In step 40 (S40) subsequent to step 20, the sequencer 24 compares the count value of the counter circuit 24A to a read order, and generates a comparison result. Also, the sequencer 24 uses the comparison result to determine the relationship between the count value of the counter circuit 24A and the read order. The count value of the counter circuit 24A is simply referred to as a count value.

In step 40, as described in "1-2-3-1. About wait period and reset period", the sequencer 24 recognizes the state of the verify operation started at that point in time by using internal signals generated in the sequencer 24 (for example, the state S9 select signal S9SEL, the state S8 select signal S8SEL, and the state S7 select signal S7SEL illustrated in FIG. 27). The sequencer 24 compares the count value to the order of the sense operation (read order) at the time of a read operation of the state, and generates a difference of α. Here, the difference of α is a comparison result. In the initial state of the counter circuit 24A, the count value is set as 1.

Next, the sequencer 24 uses the comparison result to determine whether the read order is the same as the count value (whether the difference of α is 0), the read order is larger than the count value (whether the difference of α is a positive value), or the read order is smaller than the count value (whether the difference of α is a negative value), and then proceeds to step 50 (S50), step 60 (S60) or step 70 (S70) according to the determination result.

As a result of determination, when the read order is the same as the count value (CASE1 in step 40), step 70 is executed. When the read order is larger than the count value (CASE2 in step 30), step 50 is executed. When the read order is smaller than the count value (CASE3 in step 30), step 60 is executed.

In step 70, the sequencer 24 controls the sense amplifier module 70, the row decoder 29, the voltage generation circuit 27, the driver set 28 and the like such that the verify operation is executed in a state where the voltage supplied to a selected word line during the verify operation is set as the same voltage as the voltage supplied to the selected word line during the read operation. The sequencer 24 executes a Yth verify operation.

In step 50, wait periods corresponding to the number of times obtained by multiplying a preset wait period by the difference of α between the read order and the count value are inserted before a period during which the verify operation is executed, and then the operation for the wait period is executed. In step 52 (S52) subsequent to step 50, the count value is counted up by one, and the count value becomes the count value +1. After step 52, the process proceeds to step 70.

In step 60, a reset period is inserted before the period during which the verify operation is executed, and then the operation for the reset period is executed. After step 60, in step 62 (S62), the count value is reset and becomes 1. Further, the process proceeds to step 40 (S40).

In step 80 (S80) subsequent to step 70, for example, the sequencer 24 determines whether all the verify operations are completed for the memory cell transistor MT in which the target level is not reached. As a result of the determination, when all the verify operations are completed (YES in step 80), step 90 (S90) is executed. When not all of the verify operations are completed (NO in step 80), step 82 (S82) is executed.

In step 82, for example, the sequencer 24 counts up the numerical value Y by one to make Y+1, and executes step 40. In step 40 subsequent to step 82, the sequencer 24 compares the read order to the count value in relation to a Y+1$^{th}$ (a numerical value) verify operation, and generates a comparison result. Also, the sequencer 24 uses the comparison result to determine whether the read order is the same as the count value, the read order is larger than the count value, or the read order is smaller than the count value. Further, the process proceeds to step 50 (S50), step 60 (S60) or step 70 (S70) according to the determination result.

In step 90 subsequent to step 80, for example, the sequencer 24 determines whether all the write operations (program loops) are completed, and generates a determination result. As a result of the determination, when all the program loops are completed (YES in step 90), the semiconductor memory device 1 ends the write operation. As a result of the determination, when not all of the program loops are completed (NO in step 90), the semiconductor memory device 1 returns to step 10, starts another program loop, and executes a program operation corresponding to another program loop.

For example, as described in "1-2-3-3. Example of verify operation in first operation period (from time tv0 to time tv2)", "1-2-3-4. Example of verify operation in first operation period (from time tv2 to time tv5)" and the above-described step 30, the sequencer 24 recognizes that the verify operation of the verify level 7 in the first operation period is started. The read order of the started verify operation of the verify level 7 is second. Since the counter circuit 24A is in an initial state, the count value is set as 1. The sequencer 24 compares the read order to the count value, and generates a comparison result. Here, the sequencer 24 compares the read order (second) to the count value (1), and generates a difference of 1. The sequencer 24 determines that the comparison result corresponds to CASE2 by using the comparison result (difference of 1), and controls the sense amplifier module 70, the row decoder 29, the voltage generation circuit 27, the driver set 28 and the like so as to execute step 50 and step 52. Further, in step 50 and step 52, the sequencer 24 controls the sense amplifier module 70, the row decoder 29, the voltage generation circuit 27, the driver set 28 and the like such that one wait period obtained by multiplying the preset wait period by the difference of 1 is inserted before the verify operation of the verify level 7 is executed, and the operation for the wait period is executed, and then the count value becomes the count value +1. In step 70 subsequent to step 52, as illustrated in FIG. 26 or FIG. 27, the sequencer 24 executes the verify operation while controlling the sense amplifier module 70, the row decoder 29, the voltage generation circuit 27, the driver set 28 and the like such that the first verify operation of the verify level 7 is executed by using the voltage VCG_S7.

In step 70, the semiconductor memory device 1 executes the first verify operation of the verify level 7. When the threshold voltage of the selected memory cell transistor MTo1 connected to the selected odd-numbered word line SEL-WLo1 reaches a target level, the semiconductor memory device 1 ends the first verify operation of the verify level 7.

When sense operations are continuously executed in five verify operations (different verify levels 7, 6, 5, 4 and 3) corresponding to the 12$^{th}$ program loop described with reference to FIG. 19 or FIG. 20, among the five verify operations, the second verify operation of the verify level 6, the third verify operation of the verify level 5, the fourth verify operation of the verify level 4, and the fifth verify operation of the verify level 3 are not completed. Therefore, the sequencer 24 determines that not all of the verify operations are completed, and executes step 82.

In step 82, the sequencer 24 counts up the numerical value Y (here, 1) by one to make a numerical value of 2, and executes step 30. In step 30 subsequent to step 82, the sequencer 24 compares the read order to the count value in relation to the verify level 6 as the second, and generates a comparison result. Also, the sequencer 24 uses the comparison result to determine whether the read order is the same as the count value, the read order is larger than the count value, or the read order is smaller than the count value. For example, as described in "1-2-3-5. Example of verify operation in second operation period (from time tv5 to time tv7)", the sequencer 24 compares the read order (third) to the count value (3), and generates a difference of α (here, α=0). The sequencer 24 determines that the comparison result corresponds to CASE1 by using the comparison result (difference of 0), and controls the sense amplifier module 70, the row decoder 29, the voltage generation circuit 27, the driver set 28 and the like so as to execute step 70. In step 70, as illustrated in FIG. 26 or FIG. 27, the sequencer 24 executes the verify operation while controlling the sense amplifier module 70, the row decoder 29, the voltage generation circuit 27, the driver set 28 and the like such that the second verify operation of the verify level 6 is executed by using the voltage VCG_S6.

In step 70, the semiconductor memory device 1 executes the second verify operation of the verify level 6. When the threshold voltage of the selected memory cell transistor MTo1 connected to the selected odd-numbered word line SEL-WLo1 reaches a target level, the semiconductor memory device 1 ends the second verify operation 6VR.

Subsequently, among the five verify operations, the third verify operation of the verify level 5, the fourth verify operation of the verify level 4 and the fifth verify operation of the verify level 3 are not completed. Thus, the sequencer 24 determines that not all of the verify operations are completed, and executes step 82.

In step 82, the sequencer 24 counts up the numerical value Y (here, Y=2) by one to make a numerical value of 3, and executes step 30.

In step 30 subsequent to step 82, the sequencer 24 compares the read order to the count value in relation to the verify level 5 as the third, and generates a comparison result. Also, the sequencer 24 uses the comparison result to determine whether the read order is the same as the count value, the read order is larger than the count value, or the read order is smaller than the count value. For example, as described in "1-2-3-6. Example of verify operation in third operation period (from time tv7 to time tv13)" and "1-2-3-7. Example of verify operation in third operation period (from time tv9 to time tv13)", the sequencer 24 compares the read order (third) to the count value (4), and generates a difference of α (here, =−1). The sequencer 24 determines that the comparison result corresponds to CASE5 by using the comparison result (difference of −1), and controls the sense amplifier module 70, the row decoder 29, the voltage generation circuit 27, the driver set 28 and the like so as to execute step 60 and step 62. In step 60 and step 62, as illustrated in FIG. 26 or FIG. 27, the sequencer 24 controls the sense amplifier module 70, the row decoder 29, the voltage generation circuit 27, the driver set 28 and the like such that a reset period is inserted, and the operation for the reset period is executed, and then the count value is reset and the count value is set as 1. Further, in step 40 subsequent to step 62, the sequencer 24 compares the read order (third) to the count value (1), and generates a difference of 2. The sequencer 24 determines that the comparison result corresponds to CASE2 by using the comparison result (the difference of 2), and controls the sense amplifier module 70, the row decoder 29, the voltage generation circuit 27, the driver set 28 and the like so as to execute step 50 and step 52. Further, in step 50 and step 52, the sequencer 24 controls the sense amplifier module 70, the row decoder 29, the voltage generation circuit 27, the driver set 28 and the like such that two wait periods obtained by multiplying the preset wait period by the difference of 2 are inserted before the verify operation of the verify level 5 is executed and the operation for the two wait periods is executed, and then the count value becomes the count value +1. In step 70 subsequent to step 52, as illustrated in FIG. 26 or FIG. 27, the sequencer 24 executes the verify operation while controlling the sense amplifier module 70, the row decoder 29, the voltage generation circuit 27, the driver set 28 and the like such that the third verify operation of the verify level 5 is executed by using the voltage VCG_S5.

In step 70, the semiconductor memory device 1 executes the third verify operation of the verify level 5. When the threshold voltage of the selected memory cell transistor MTo1 connected to the selected odd-numbered word line SEL-WLo1 reaches a target level, the semiconductor memory device 1 ends the third verify operation of the verify level 5.

Subsequently, among the five verify operations, the fourth verify operation of the verify level 4 and the fifth verify operation of the verify level 3 are not completed. Thus, the sequencer 24 determines that not all of the verify operations are completed, and executes step 82.

In step 82, the sequencer 24 counts up the numerical value Y (here, Y=3) by one to make a numerical value of 4, and executes step 30.

In step 30 subsequent to step 82, the sequencer 24 compares the read order to the count value in relation to the fourth verify operation of the verify level 4, and generates a comparison result. Also, the sequencer 24 uses the comparison result to determine whether the read order is the same as the count value, the read order is larger than the count value, or the read order is smaller than the count value. For example, as described in "1-2-3-8. Example of verify operation in fourth operation period (from time tv13 to time tv15)", the sequencer 24 compares the read order (fourth) to the count value (4), and generates a difference of α (here, α=0). In step 30, the operation in the case of the difference of 0 is the same as the second verify operation of the verify level 6, and thus the detailed descriptions thereof are omitted here.

For example, in step 70, the semiconductor memory device 1 executes the fourth verify operation of the verify level 4. When the threshold voltage of the selected memory cell transistor MTo1 connected to the selected odd-numbered word line SEL-WLo1 reaches a target level, the semiconductor memory device 1 ends the fourth verify operation of the verify level 4.

Subsequently, among the five verify operations, the fifth verify operation of the verify level 3 is not completed. Thus, the sequencer 24 determines that not all of the verify operations are completed, and executes step 82.

In step 82, the sequencer 24 counts up the numerical value Y (here, Y=4) by one to make a numerical value of 5, and executes step 30.

In step 30 subsequent to step 82, the sequencer 24 compares the read order to the count value in relation to the fifth verify operation of the verify level 3, and generates a comparison result. Also, the sequencer 24 uses the comparison result to determine whether the read order is the same as the count value, the read order is larger than the count value, or the read order is smaller than the count value. For example, as described in "1-2-3-9. Example of verify operation in fifth operation period (from time tv15 to time tv21)", the sequencer 24 compares the read order (third) to the count value (5), and generates a difference of α (here, α=2). In step 30, the operation in the case of the difference of 2 is the same as the third verify operation of the verify level 5, and thus the detailed descriptions thereof are omitted here.

In step 70, the semiconductor memory device 1 executes the fifth verify operation of the verify level 3. When the threshold voltage of the selected memory cell transistor MTo1 connected to the selected odd-numbered word line SEL-WLo1 reaches a target level, the semiconductor memory device 1 ends the fifth verify operation 5VR.

In step 80 subsequent to step 70, the sequencer 24 determines that the above-described five verify operations are completed, and all the verify operations are completed.

In step 90 subsequent to step 80, for example, the sequencer 24 determines whether all the write operations (program loops) are completed, and generates a determination result. As a result of the determination, when all the write operations (program loops) are completed (YES in step 90), the semiconductor memory device 1 ends the write operation. As a result of the determination, when not all of the write operations (program loops) are completed (NO in step 90), the semiconductor memory device 1 returns to step 10, starts another program loop, and executes a program operation corresponding to another program loop.

Second Embodiment

In the semiconductor memory device 1 according to the second embodiment, an example of an operation different from the operation of the semiconductor memory device 1 according to the first embodiment will be described. An example of the operation of the semiconductor memory device 1 according to the second embodiment is different from the operation of the semiconductor memory device 1 according to the first embodiment, in that the order in which verify operations are executed is changed. Other things are the same. In the semiconductor memory device 1 according to the second embodiment, an operation of changing the order in which verify operations are executed will be described. The change of the order in which verify operations are executed, which is described in the second embodiment, is one example, and the change of the order in which verify operations are executed is not limited to the example described in the second embodiment.

In the description of the second embodiment, as in the first embodiment, with reference to FIG. 31 and FIG. 32, descriptions will be made for an example in which sense operations in five different verify operations (different verify levels 7, 6, 5, 4 and 3) are continuously executed. The five different verify operations correspond to the 12th program loop described with reference to FIG. 19 or FIG. 20. In the description of the semiconductor memory device 1 according to the second embodiment, descriptions of the configuration which is the same or similar to those of FIG. 1 to FIG. 30 may be omitted.

First, descriptions will be made for the overview of the change of the execution order of verify operations in the semiconductor memory device 1 according to the second embodiment. FIG. 31 is a view illustrating an example before and after the change of the execution order of verify operations in the semiconductor memory device 1 according to the second embodiment. FIG. 31 illustrates the order of sense operations during verify operations corresponding to the 12$^{th}$ program loop described with reference to FIG. 19 or FIG. 20, the verify level, the read order, the number of wait periods, and the number of reset periods.

In the semiconductor memory device 1 according to the second embodiment, the order of verify operations is changed such that the read order from "small" to "large" is made. As illustrated in FIG. 31, at the verify level 4 (S4, (4VR)), the order of the sense operation is fourth, and the read order is fourth. At the verify level 3 (S3, (3VR)), the order of the sense operation is fifth, and the read order is third. The read order of the verify level 4 is larger than the read order of the verify level 3, and thus, in the semiconductor memory device 1 according to the second embodiment, the verify operation of the verify level 4 and the verify operation of the verify level 3 are exchanged. That is, the verify operation of the verify level 3 is changed from fifth to fourth, and the verify operation of the verify level 4 is changed from fourth to fifth.

In the semiconductor memory device 1 according to the second embodiment, since the order of the verify operations is changed, the number of wait periods is reduced from six to three, and the number of reset periods is reduced from two to one. As a result, in the semiconductor memory device 1 according to the second embodiment, the time of the program operation is reduced.

The change of the order of the verify operations related to the second embodiment is executed before time tv0 in the timing charts illustrated in FIG. 26 and FIG. 27.

Next, descriptions will be made for an example of the change of the execution order of verify operations in the semiconductor memory device 1 according to the second embodiment. FIG. 32 is a flowchart illustrating an example of the change of the execution order of verify operations in the semiconductor memory device 1 according to the second embodiment.

In the semiconductor memory device 1 according to the second embodiment, the change of the execution order of verify operations is executed between step 20 (S20) and step 40 (S40) illustrated in FIG. 30 regarding the semiconductor memory device 1 according to the first embodiment. Each step in the flowchart is executed while the sequencer 24 controls the sense amplifier module 70, the row decoder 29, the voltage generation circuit 27, the driver set 28 and the like. Since step 20 is described in "1-2-3-10. Example of flow of write operation", the descriptions of step 20 are omitted here.

Figure 32:
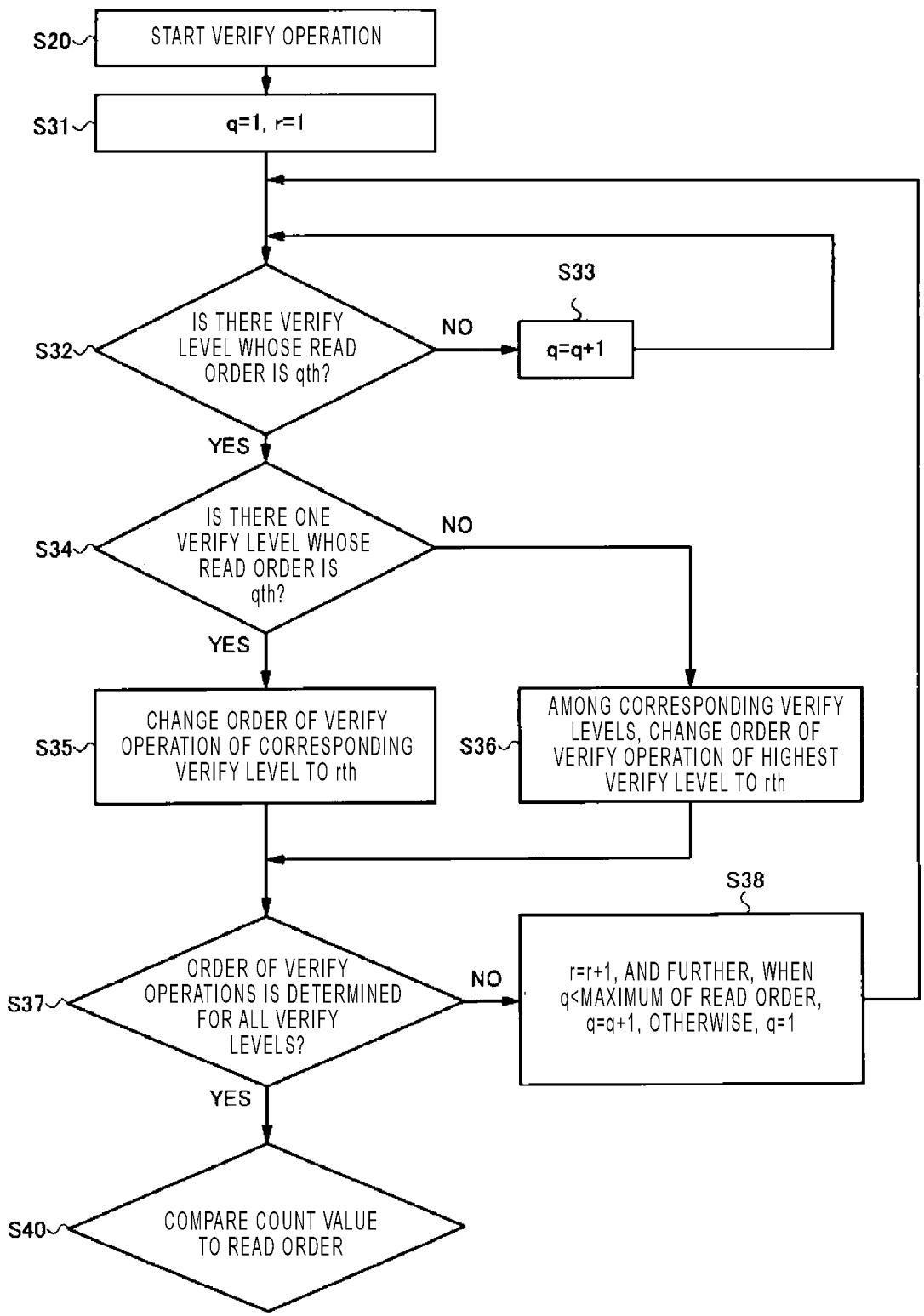
FIG. 32 is a view illustrating a flowchart of the verify operation in the semiconductor memory device according to the second embodiment.

As illustrated in FIG. 32, after step 20, step 31 (S31) is executed. In step 31, the numerical value q of the read order is set as 1 (first), and the order r of the sense operation during the verify operation is set as 1 (first).

Subsequently, step 32 (S32) is executed. In step 32, for respective sense operations during verify operations which are verify operation targets, at a stage where the order of the sense operations has not yet been determined, it is determined whether or not there is a verify level whose read order is qth (here, first) (YES or NO in step 32).

If NO in step 32, in step 33 (S33), the numerical value q of the read order is counted up by one and becomes q+1. Subsequently, the process returns to step 32, and step 32 is executed.

If YES in step 32, in step 34 (S34), it is determined whether or not there is one verify level whose read order is qth (YES or NO in step 34).

If YES in step 34, in step 35 (S35), the order of the sense operation of the verify level is changed to rth. Subsequently, step 37 (S37) is executed.

If NO in step 34, in step 36 (S36), for the operation of the highest verify level among the verify levels, the order of the sense operation is changed to rth. Subsequently, step 37 is executed.

In step 37, it is determined whether or not the order of the sense operations is determined (YES or NO in step 37) for all verify levels.

If YES in step 37, in step 40, the count value of the counter circuit 24A is compared to the read order. Since step 40 was described in "1-2-3-10. Example of flow of write operation", descriptions of step 40 are omitted here.

If NO in step 37, in step 38 (S38), the order r of the sense operation is counted up by one and is changed to r+1. In step 38, when the numerical value q of the read order is smaller than the maximum of the read order (for example, 4 in FIG. 31), the numerical value q is counted up by one and then is set as q+1. When the numerical value q of the read order is a value other than that, the numerical value q is set as 1, and remains as it is. Subsequently, the process returns to step 32, and step 32 is executed. Until the order of the sense operations is determined, steps 31 to 37 are executed.

For example, here, with reference to the flowchart illustrated in FIG. 32, descriptions will be made for the order of the sense operations in FIG. 31.

After step 20 and step 31, step 32 is executed. Here, the numerical value q is set as 1 (first). As illustrated in FIG. 31, there is no verify level whose read order is first. Therefore, NO determination is made in step 32, and thus, step 33 is executed, and the numerical value q is counted up by one and is set as 2 (second).

Subsequently, the process returns to step 32, and step 32 is executed. In step 32, the verify level 7 has the second read order. Therefore, YES determination is made in step 32, and thus, step 34 is executed. Since there is one verify level having the second read order, in step 35, the read order of the verify level 7 is set as rth (here, first). Subsequently, step 37 is executed. Since the order of the sense operations of the verify levels 3 to 6 has not yet been determined, NO determination is made in step 37. Thus, step 38 is executed, and the order r of the sense operation is counted up by one and is set as 2 (second). Since the numerical value q (second) of the read order is smaller than the maximum (4) of the read order, the numerical value q is counted up by one and is set as 3 (third).

Subsequently, the process returns to step 32, and step 32 is executed. In step 32, the verify level 6 and the verify level 3 have the third read order. Therefore, step 34 and step 36 are executed, and the read order of the verify level 6 is set as the second. Subsequently, step 37 is executed. Since the order of the sense operations of the verify level 3 to the verify level 5 has not yet been determined, NO determination is made in step 37. Thus, step 38 is executed, and the order r of the sense operation is counted up by one and is set as 3 (third). Since the numerical value q (third) of the read order is smaller than the maximum (4) of the read order, the numerical value q is counted up by one and is set as 4 (fourth).

Subsequently, the process returns to step 32, and step 32 is executed. In step 32, the verify level 5 and the verify level 4 have the fourth read order. Therefore, step 34 and step 36 are executed, and the read order of the verify level 4 is set as the third. Subsequently, step 37 is executed. Since the order of the sense operations of the verify level 3 and the verify level 4 has not yet been determined, NO determination is made in step 37. Thus, step 38 is executed, and the order r of the sense operation is counted up by one and is set as 4 (fourth). Since the numerical value q (fourth) of the read order is the same as the maximum (4) of the read order, the order q is set as 1 (first).

Subsequently, the process returns to step 32, and step 32 is executed. Since the remaining verify levels are the verify level 3 and the verify level 4, step 32 and step 33 are repeated twice, and then the numerical value q is counted up by two and is set as 3 (third). Subsequently, the process returns to step 32, and step 32 is executed. Since only the verify level 3 is a verify level having the third read order, step 34 and step 35 are executed, and the read order of the verify level 3 is set as the fourth. Subsequently, step 37 is executed. Since the order of the sense operation of the verify level 4 has not yet been determined, NO determination is made in step 37. Thus, step 38 is executed, and the order r of the sense operation is counted up by one and is set as 5 (fifth). Since the numerical value q (third) of the read order is smaller than the maximum (4) of the read order, the numerical value q is counted up by one and is set as 4 (fourth).

Subsequently, steps 32, 34 and 35 are executed, and the read order of the verify level 4 is set as the fifth. Subsequently, step 37 is executed. Since the order of the operations h determined for all verify levels, step 40 is executed. As described above, the verify operation of the verify level 3 is changed from fifth to fourth, and the verify operation of the verify level 4 is changed from fourth to fifth.

When the sense operation of the verify operation of the verify level 3 is executed, the voltage applied to the selected memory cell transistor MTo1 connected to the selected odd-numbered word line SEL-WLo1 is, for example, a voltage VCG_S3, and when the sense operation of the verify operation of the verify level 4 is executed, the voltage applied to the selected memory cell transistor MTo1 connected to the selected odd-numbered word line SEL-WLo1 is, for example, a voltage VCG_S4. Before the sense operation of the verify operation of the verify level 3, the sense operation of the verify operation of the verify level 5 is executed. When the sense operation of the verify operation of the verify level 5 is executed, the voltage applied to the selected memory cell transistor MTo1 connected to the selected odd-numbered word line SEL-WLo1 is, for example, a voltage VCG_S5. Therefore, to the selected memory cell transistor MTo1 connected to the selected odd-numbered word line SEL-WLo1, the voltage VCG_S5, the voltage VCG_S3, and the voltage VCG_S4 are applied in this order. The voltage VCG_S5 is higher than the voltage VCG_S3 and the voltage VCG_S4, and the voltage VCG_S4 is higher than the voltage VCG_S3.

Third Embodiment

In the semiconductor memory device 1 according to a third embodiment, an example of an operation different from the operation of the semiconductor memory device 1 according to the second embodiment will be described. Also in the third embodiment, the VBB application time of the verify operation and the VBB application time of the sense operation during the read operation are made to be the same so that the effective threshold voltage of the selected memory cell transistor becomes the same between the verify operation and the read operation. Meanwhile, the operation of the semiconductor memory device 1 according to the third embodiment is different from the operation of the semiconductor memory device 1 according to the second embodiment, in that the read order is changed before the order in which verify operations are executed is changed. Other things are the same. In the semiconductor memory device 1 according to the third embodiment, an operation of changing the read order will be described in order to reduce the total wait time inserted during the write operation. The change of the read order or the change of the order in which verify operations are executed, which is described in the third embodiment, is an example, and the change of the read order, or the change of the order in which verify operations are executed is not limited to the example described in the third embodiment.

In the description of the third embodiment, as in the first embodiment, with reference to FIG. 33 and FIG. 34, descriptions will be made for an example in which sense operations in five different verify operations (different verify levels 7 (S7, (7VR)), 6 (S6, (6VR)), 5 (S5, (5VR)), 4 (S4, (4VR)) and 3 (S3, (3VR))) are continuously executed. The five different verify operations correspond to the $12^{th}$ program loop described with reference to FIG. 19 or FIG. 20. In the description of the semiconductor memory device 1 according to the third embodiment, descriptions of the configuration which is the same or similar to those of FIG. 1 to FIG. 32 may be omitted.

First, with reference to FIG. 33, descriptions will be made for the overview of the change of the read order in the semiconductor memory device 1 according to the third embodiment. The change operation of the read order in the semiconductor memory device 1 according to the third embodiment is executed while the sequencer 24 controls the sense amplifier module 70, the row decoder 29, the voltage generation circuit 27, the driver set 28 and the like.

Figure 33:
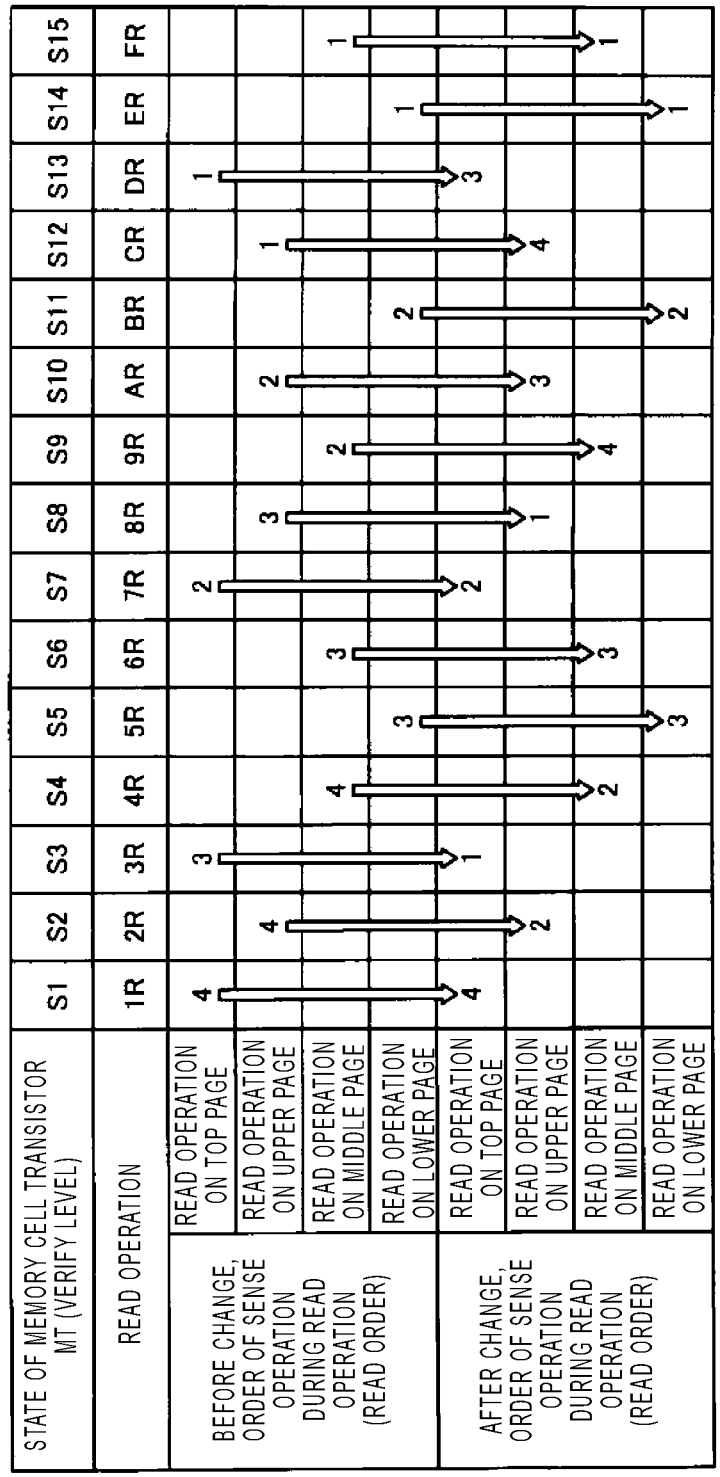
FIG. 33 is a view illustrating the overview of a verify operation in a semiconductor memory device according to a third embodiment.

As illustrated in FIG. 33, for example, in the read order for the top page, the state S13 reading and the state S3 reading are exchanged. That is, the read order for the state S13 reading is changed from the first to the third, and the read order for the state S3 reading is changed from the third to the first. On the upper page, the read order of the state S12 reading is changed from the first to the fourth, the read order of the state S10 reading is changed from the second to the third, the read order of the state S8 reading is changed from the third to the first, and the read order of the state S2 reading is changed from the fourth to the second. In the same manner as in the top page and the upper page, read orders on the middle page and the lower page are also changed as illustrated in FIG. 33.

In the five different verify operations according to the third embodiment, for example, the read order for the state S7 reading is the second, the read order for the state S6 reading is the third, the read order for the state S5 reading is the third, the read order for the state S4 reading is changed from the fourth to the second, and the read order for the state S3 reading is changed from the third to the first.

On the top page for which the read order is changed, to the selected memory cell transistor MTo1 connected to the selected odd-numbered word line SEL-WLo1, first, the voltage VCG_S3 corresponding to the sense operation of the state S3 is applied, and subsequently, the voltage VCG_S7 corresponding to the sense operation of the state S7, the voltage VCG_S13 corresponding to the sense operation of the state S13, and the voltage VCG_S1 corresponding to the sense operation of the state S1 are applied in this order. Here, the voltage VCG_S13 is higher than the voltage VCG_S7, the voltage VCG_S3, and the VCG_S1, the voltage VCG_S7 is higher than the voltages VCG_S3, and VCG_S1, and the voltage VCG_S3 is higher than VCG_S1. That is, the voltage applied to the selected memory cell transistor MTo1 connected to the selected odd-numbered word line SEL-WLo1 may be increased or decreased depending on the sense operations, in some cases. As in the top page, on the upper page, the middle page, and the lower page as well, the voltage applied to the selected memory cell transistor MTo1 connected to the selected odd-numbered word line SEL-WLo1 may be increased or decreased depending on the sense operations, in some cases. Therefore, in the semiconductor memory device 1, when the read operation on one page is executed, the voltage applied to the selected memory cell transistor MTo1 connected to the selected odd-numbered word line SEL-WLo1 may be increased or described depending on the sense operations, in some cases.

Next, with reference to FIG. 34, descriptions will be made for the overview of the operation of changing the order in which verify operations are executed in the semiconductor memory device 1 according to the third embodiment. Like FIG. 31, FIG. 34 illustrates the order of sense operations during verify operations corresponding to the 12$^{th}$ program loop described with reference to FIG. 19 or FIG. 20, the verify level, the read order, the number of wait periods, and the number of reset periods. The change of the order in which verify operations are executed in the semiconductor memory device 1 according to the third embodiment is the same as that in FIG. 31 described on the basis of the flowchart of FIG. 32 in the second embodiment, and thus detailed descriptions thereof are omitted here.

As illustrated in FIG. 34, at the verify level 7 (S7, (7VR)), the order of the sense operation is fifth, and the read order is second. At the verify level 6 (S6, (6VR)), the order of the sense operation is fourth, and the read order is third. The read order of the verify level 6 is larger than the read order of the verify level 7, and thus, in the semiconductor memory device 1 according to the third embodiment, the verify operation of the verify level 7 is exchanged with the verify operation of the verify level 6. That is, the verify operation of the verify level 7 is changed from fifth to fourth, and the verify operation of the verify level 6 is changed from fourth to fifth.

In the semiconductor memory device 1 according to the third embodiment, since the order of the verify operations is changed, each of the number of wait periods and the number of reset periods becomes one which is the minimum number. As a result, in the semiconductor memory device 1 according to the third embodiment, the time of the program operation is reduced. While the operation is explained with reference to an ascending voltage application order to the word line as a basic order as an example, the third embodiment is not limited thereto. In the third embodiment, a descending voltage application order to the word line may be used as a basic order similarly to the second embodiment.

Fourth Embodiment

In the semiconductor memory device 1 according to a fourth embodiment, an example of an operation different from the operation of the semiconductor memory device 1 according to the first embodiment will be described. An example of the operation of the semiconductor memory device 1 according to the fourth embodiment is different from the operation of the semiconductor memory device 1 according to the first embodiment, in the following three points. The first point is that the program operation includes a higher-level program operation and a lower-level program operation. The second point is that the verify operation includes a higher-level verify operation and a lower-level verify operation. The third point is that the order of sense operations of verify operations is changed in another way. Other things are the same. In the semiconductor memory device 1 according to the fourth embodiment, the points (the three points) which are different from those in the first embodiment will be described with reference to FIG. 35 and FIG. 36. The higher-level program operation, the lower-level program operation, the higher-level verify operation, and the lower-level verify operation and the like, which are described in the fourth embodiment, are examples, and embodiments are not limited to the examples described in the fourth embodiment. An example of the operation of the semiconductor memory device 1 according to the fourth embodiment is executed while the sequencer 24 controls the sense amplifier module 70, the row decoder 29, the voltage generation circuit 27, the driver set 28 and the like.

Figure 35:
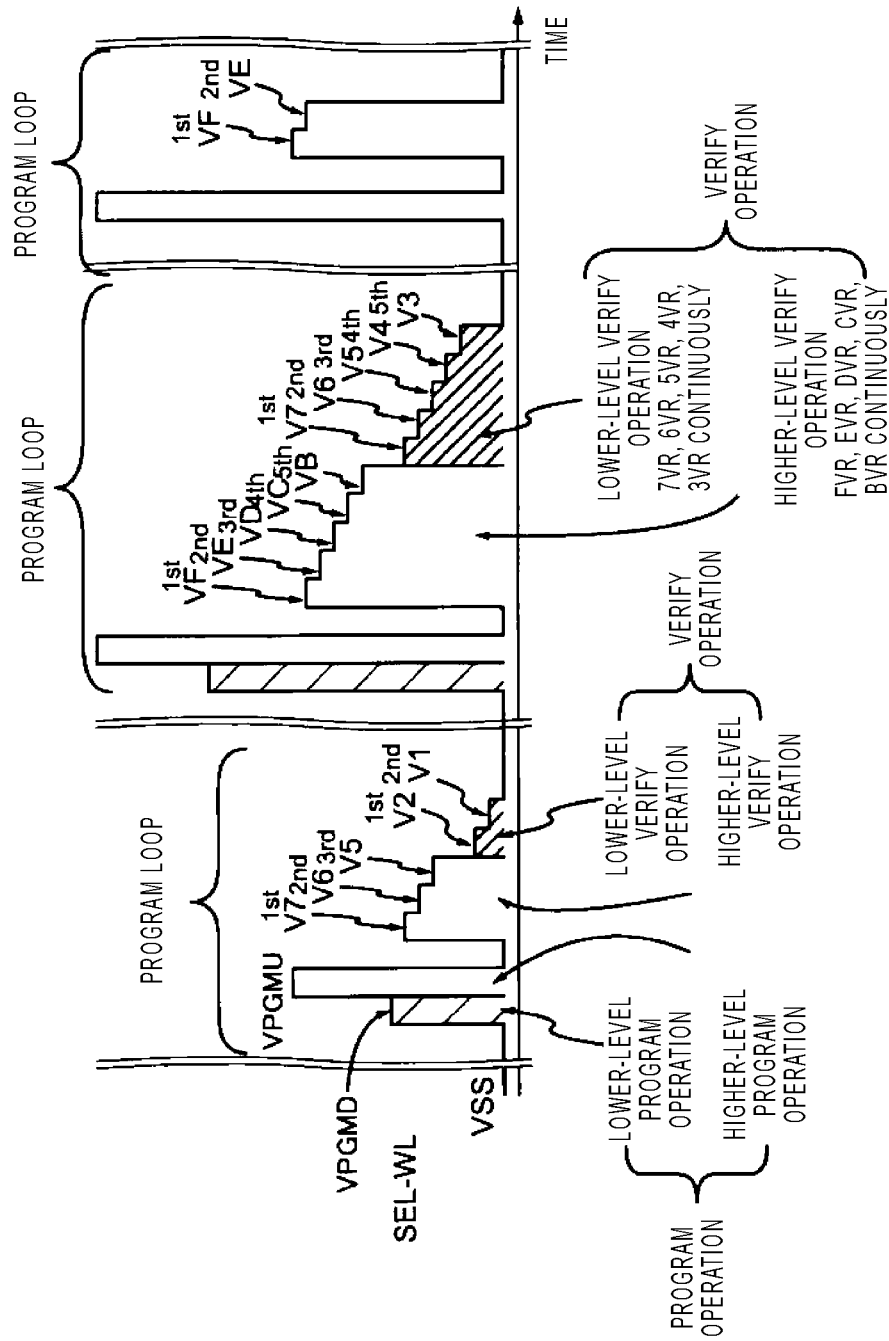
FIG. 35 is a view illustrating program loops in a semiconductor memory device according to a fourth embodiment.

FIG. 35 is a view illustrating program loops in the semiconductor memory device 1 according to the fourth embodiment. As illustrated in FIG. 35, a single program loop includes a higher-level program operation and a lower-level program operation, and a higher-level verify operation and a lower-level verify operation executed thereafter. For example, the lower-level program operation and the higher-level program operation are executed in this order. Subsequently, the higher-level verify operation and the lower-level verify operation are executed in this order.

In the higher-level program operation, for example, a higher-level program voltage VPGMU is supplied to the selected word line SEL-WL in which a program operation corresponding to the state S8 to the state S15 (the verify level 8 to the verify level 15) is executed. In the lower-level program operation, for example, a lower-level program voltage VPGMD is supplied to the selected word line SEL-WL in which a program operation corresponding to the state S1 to the state S7 (the verify level 1 to the verify level 7) is executed.

Although not illustrated, the configuration or the like of the higher-level program voltage VPGMU and the lower-level program voltage VPGMD is the same as that in the program operation according to the first embodiment to the third embodiment. For example, although not illustrated, the higher-level program voltage VPGMU is a voltage obtained by adding a voltage AVPGMU to the higher-level program voltage VPGMU in a higher-level program operation included in the previous program loop. That is, the higher-level program voltage VPGMU in a higher-level program operation in the 1st program loop is set as the lowest voltage value, and then as the second program loop, the third program loop . . . progress, the higher-level program voltage VPGMU is gradually set as larger voltage values. Although not illustrated, like the higher-level program voltage VPGMU, the lower-level program voltage VPGMD is a voltage obtained by adding a voltage AVPGMD to the lower-level program voltage VPGMD in a lower-level program operation included in the previous program loop. That is, the lower-level program voltage VPGMD in a lower-level program operation in the 1st program loop is set as the lowest voltage value, and then as the second program loop, the third program loop . . . progress, the lower-level program voltage VPGMD is gradually set as larger voltage values.

In the higher-level verify operation, for example, five different sense operations are executed in order from the highest verify level. Specifically, as in the program loop illustrated in the middle of FIG. 35, sense operations of the verify level 15 (the sense operation of the verify operation FVR (verification of the threshold voltage of the state S15)) to the verify level 11 (the sense operation of the verify operation BVR (verification of the threshold voltage of the state S11)) are executed in this order from first to fifth.

Like in the higher-level verify operation, in the lower-level verify operation, five different sense operations are executed in order from the highest verify level. Specifically, as in the program loop illustrated in the middle of FIG. 35, sense operations of the verify level 7 (the sense operation of the verify operation 7VR (verification of the threshold voltage of the state S7)) to the verify level 3 (the sense operation of the verify operation 3VR (verification of the threshold voltage of the state S3)) are executed in this order from first to fifth.

Next, with reference to FIG. 36, descriptions will be made for the change of the order of sense operations of verify operations in the semiconductor memory device 1 according to the fourth embodiment. For example, as in the example described with reference to FIG. 35, in the higher-level verify operation, the sense operations of the verify level 15 to the verify level 11 are performed in order from first to fifth, and in the lower-level verify operation, the sense operations of the verify level 7 to the verify level 3 are performed in order from first to fifth.

The read order before the change of respective verify operations for verify levels, which is illustrated in FIG. 36, is the same as the read order illustrated in FIG. 21. Specifically, in descending order of the verify level, the read order of the verify level 15 to the verify level 12 is first, the read order of the verify level 11 and the verify level 7 is second, the read order of the verify level 6 is third, the read order of the verify level 5 and the verify level 4 is fourth, and the read order of the verify level 3 is third.

In the semiconductor memory device 1 according to the fourth embodiment, levels which are classified into a higher level or a lower level in advance may be mixed to change the order of the verify operations. In the change of the order of the verify operations in the semiconductor memory device 1 according to the fourth embodiment, as in the second embodiment and the third embodiment, the change is executed in ascending order of read order.

Specifically, among those having the first read order, the order of the sense operation of the verify level 15 that is the highest verify level is set as the first. Between those having the second read order, the order of the sense operation of the verify level 11 that is the highest verify level is set as the second. Between those having the third read order, the order of the sense operation of the verify level 6 that is the highest verify level is set as the third. Between those having the fourth read order, the order of the sense operation of the verify level 5 that is the highest verify level is set as the fourth. Subsequently, among those having the first read order, except for the verify level 15, the order of the sense operation of the verify level 14 that is the highest verify level is set as the fifth. As one having the second read order other than the verify level 11, the order of the sense operation of the verify level 7 that is the highest verify level is set as the sixth. As one having the third read order other than the verify level 6, the order of the sense operation of the verify level 3 that is the highest verify level is set as the seventh. As one having the fourth read order other than the verify level 5, the order of the sense operation of the verify level 4 that is the highest verify level is set as the eighth. Finally, between those having the first read order except for the verify level 15 and the verify level 14, the sense operation of the verify level 13 that is the highest verify level is set as the ninth, and the sense operation of the verify level 12 is set as the tenth.

In the semiconductor memory device 1 according to the fourth embodiment, as described above, the order of the verify operations may be changed. In the semiconductor memory device 1 according to the fourth embodiment, the program operation is divided into a higher-level program operation and a lower-level program operation in advance, and then is executed, and at the same time, the verify operation is also divided into a higher-level verify operation and a lower-level verify operation, and then is executed. Orders of the sense operations of the verify operations which are classified into a higher level or a lower level in advance are mixed, and the orders of the verify operations are changed. In the semiconductor memory device 1 according to the fourth embodiment, after the orders of the verify operations are changed, as in the semiconductor memory device 1 according to the first embodiment, a wait period or a reset period may be inserted in the execution period of the verify operation on the basis of the read order and the count value. In the semiconductor memory device 1 according to the fourth embodiment, the change is executed in ascending order of read order, and thus, in the verify operations, read orders are not biased. As a result, the number of wait periods is reduced from six to 0, and the number of reset periods is reduced from five to three. Therefore, in the semiconductor memory device 1 according to the fourth embodiment as well as the semiconductor memory device 1 according to the third embodiment, the time of the program operation is reduced.

When notations of the same and matching are used in each of the above embodiments, the same and matching may include a case where an error is included in a range of design.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a bit line extending in a first direction;
a semiconductor pillar that extends in a second direction intersecting the first direction, is electrically connected to the bit line, and includes an insulator column extending in the second direction, a plurality of first memory cells electrically connected in series and aligned in the second direction on a first side of the insulator column, second memory cells electrically connected in series and aligned in the second direction on a second side of the insulator column that is opposite to the first side, wherein the first and second memory cells share a semiconductor channel that extends in the second direction;
first word lines stacked in the second direction, and electrically connected to the first memory cells, respectively;
second word lines stacked in the second direction, and electrically connected to the second memory cells, respectively; and
a control circuit configured to execute a write operation and a read operation, wherein
the write operation on one of the first memory cells is carried out in a plurality of loops, each of the loops including a program operation and a verify operation, and
the verify operation carried out in at least one of the loops includes a first channel clean operation for supplying a reference voltage to the semiconductor channel, followed by at least a first sense operation for determining whether a threshold voltage of the one first memory cell has reached a first threshold voltage state and a second sense operation for determining whether the threshold voltage of the one first memory cell has reached a second threshold voltage state, then a second channel clean operation for supplying the reference voltage to the semiconductor channel, and then at least a third sense operation for determining whether the threshold voltage of the one first memory cell has reached a third threshold voltage state.

2. The semiconductor memory device according to claim 1, wherein
a first voltage is applied to one of the first word lines connected to the one first memory cell during the first sense operation and a second voltage is applied to the one first word line during the second sense operation, and
a first period of applying the first voltage to the one first word line is longer than a second period of applying the second voltage to the one first word line during the verify operation.

3. The semiconductor memory device according to claim 2, wherein a negative voltage is continuously applied to at least one of the second word lines while the first voltage and the second voltage are applied to the one first word line.

4. The semiconductor memory device according to claim 3, wherein the at least one of the second word lines includes three of the second word lines that are closest to the one first memory cell.

5. The semiconductor memory device according to claim 2, wherein
during the verify operation carried out in another one of the loops, the first voltage is applied to the one first word line for a third period that is less than the first period.

6. The semiconductor memory device according to claim 1, wherein
the verify operation carried out in the at least one of the loops includes the first sense operation, the second sense operation, and then a third sense operation between the first and second channel clean operations, and
a first voltage is applied to one of the first word lines connected to the one first memory cell during the first sense operation, a second voltage less than the first voltage is applied to the one first word line during the second sense operation, and a third voltage greater than the second voltage is applied to the one first word line during the third sense operation.

7. A semiconductor memory device comprising:
a bit line extending in a first direction;
a semiconductor pillar that extends in a second direction intersecting the first direction, is electrically connected to the bit line, and includes an insulator column extending in the second direction, a plurality of first memory cells electrically connected in series and aligned in the second direction on a first side of the insulator column, second memory cells electrically connected in series and aligned in the second direction on a second side of the insulator column that is opposite to the first side, wherein the first and second memory cells share a semiconductor channel that extends in the second direction;
first word lines stacked in the second direction, and electrically connected to the first memory cells, respectively;
second word lines stacked in the second direction, and electrically connected to the second memory cells, respectively; and
a control circuit configured to execute a write operation and a read operation, wherein:
the write operation on a set of memory cells including one of the first memory cells, is carried out in a plurality of loops, each of the loops including a program operation and a verify operation that includes a channel clean operation for supplying a reference voltage to the semiconductor channel followed by a first sequence of sense operations, and the read operation on the set of memory cells includes the channel clean operation followed by a second sequence of sense operations and the channel clean operation followed by a third sequence of sense operations;
the sense operations of both the first sequence and the second sequence includes a first sense operation for determining whether a threshold voltage of each memory cell in the set of memory cells has reached a first threshold voltage state; and if the first sense operation is first in order in the first sequence and is not first in order in the second sequence, a wait period is executed prior to the first sense operation during the verify operation.

8. The semiconductor memory device according to claim 7, wherein
if the first sense operation is not first in order in the first sequence and is first in order in the second sequence, another channel clean operation is executed prior to the first sense operation during the verify operation.

9. The semiconductor memory device according to claim 8, wherein
the sense operations in the first and second sequences include a second sense operation for determining whether the threshold voltage of each memory cell in the set of memory cells has reached a second threshold voltage state, and the sense operations in the first and third sequences include a third sense operation for determining whether the threshold voltage of each memory cell in the set of memory cells has reached a third threshold voltage state, and
when the third sense operation is directly after the second sense operation in the first sequence but is earlier in the third sequence than the second sense operation in the second sequence, the control circuit executes the write operation on the set of memory cells, so as to exchange the order of executing the second and third sense operations in the first sequence.

10. The semiconductor memory device according to claim 7, wherein
a read voltage is applied to one of the first word lines connected to the set of memory cells during the sense operations in the first and second sequences, while a negative voltage is applied to at least one of the second word lines.

11. The semiconductor memory device according to claim 10, wherein the at least one of the second word lines includes three of the second word lines that are closest to the set of memory cells.

12. The semiconductor memory device according to claim 10, wherein
the first sequence includes the first sense operation and a second sense operation that follows the first sense operation in the first sequence, and the read voltage for the first sense operation is a first voltage and the read voltage for the second sense operation is a second voltage that is lower than the first voltage, and
a first period of applying the first voltage to the one first word line is longer than a second period of applying the second voltage to the one first word line during the verify operation in one of the loops of the write operation performed on the set of memory cells.

13. The semiconductor memory device according to claim 12, wherein the first sequence further includes a third sense operation that follows the second sense operation in the sequence, and the read voltage for the third sense operation is a third voltage that is lower than the second voltage.

14. The semiconductor memory device according to claim 12, wherein the first sequence further includes a third sense operation that follows the second sense operation in the sequence, and the read voltage for the third sense operation is a third voltage that is higher than the second voltage.

15. The semiconductor memory device according to claim 7, wherein
the sense operations of both the first sequence and the second sequence includes a second sense operation for determining whether a threshold voltage of each memory cell in the set of memory cells has reached a second threshold voltage state, and
the control circuit includes a storage device that stores a table that indicates the order of the second sense operation in the second sequence of sense operations, and the control circuit is configured to update the table to reflect a change in the order of the second sense operation in the second sequence of sense operations.

16. The semiconductor memory device according to claim 7, wherein
the program operation in one of the loops includes a first program operation and a second program operation different from the first program operation, such that a voltage applied to one of the first word line in the first program operation is different from a voltage applied to the one first word line in the second program operation, and
the verify operation associated with the first program operation includes a fourth sequence of sense operations and the verify operation associated with the second program operation includes a fifth sequence of sense operations, and the sense operations in the fourth and fifth sequences are carried out after the program operation in the one loop according to a sixth sequence of sense operations.

17. A method of performing a write operation on a set of memory cells in a semiconductor memory device that includes:
a bit line extending in a first direction;
a semiconductor pillar that extends in a second direction intersecting the first direction, is electrically connected to the bit line, and includes an insulator column extending in the second direction, a plurality of first memory cells electrically connected in series and aligned in the second direction on a first side of the insulator column, second memory cells electrically connected in series and aligned in the second direction on a second side of the insulator column that is opposite to the first side, wherein the first and second memory cells share a semiconductor channel that extends in the second direction;
first word lines stacked in the second direction, and electrically connected to the first memory cells, respectively; and
second word lines stacked in the second direction, and electrically connected to the second memory cells, respectively, wherein
the write operation on a set of memory cells including one of the first memory cells, is carried out in a plurality of loops, each of the loops including a program operation and a verify operation, and the verify operation during one of the loops comprises the steps of:
supplying a reference voltage to the semiconductor channel for a first period of time;
after the first period of time, applying a negative voltage to one of the second word lines;
while applying the negative voltage to the one second word line, continuously applying a first voltage to one of the first word lines connected to the set of memory cells for a second period of time; and
while still applying the negative voltage to the one second word line, continuously applying a second voltage to the one first word line for a third period of time that is shorter than the second period of time.

18. The method of claim 17, wherein the verify operation during one of the loops further comprises the steps of:

while still applying the negative voltage to the one second word line, continuously applying a third voltage to the one first word line for a fourth period of time that is equal in time duration to the third period of time.

19. The method of claim 18, wherein the second voltage is lower than the first voltage and the third voltage is higher than the second voltage.

20. The method of claim 17, wherein the verify operation during one of the loops further comprises the steps of:

supplying the reference voltage to the semiconductor channel for a fourth period of time after the third period of time;

after the fourth period of time, applying the negative voltage to the one second word line; and while applying the negative voltage to the one second word line, continuously applying a third voltage to the one first word line for a fifth period of time.

* * * * *